United States Patent
Sato et al.

[11] Patent Number: 5,994,007
[45] Date of Patent: Nov. 30, 1999

[54] PATTERN FORMING METHOD UTILIZING FIRST INSULATIVE AND THEN CONDUCTIVE OVERLAYER AND UNDERLAYER

[75] Inventors: Yasuhiko Sato, Yokohama; Atsushi Ando, Tokyo; Yasunobu Onishi, Yokohama; Yoshihiko Nakano, Tokyo; Shuji Hayase; Rikako Kani, both of Yokohama, all of Japan

[73] Assignee: Kabushiki Kaisha Toshiba, Kawasaki, Japan

[21] Appl. No.: 09/213,373

[22] Filed: Dec. 17, 1998

[30] Foreign Application Priority Data

Dec. 19, 1997 [JP] Japan ................................. 9-350883

[51] Int. Cl.⁶ .................................................... G03F 9/00
[52] U.S. Cl. ............................ 430/22; 430/296; 430/328; 430/942
[58] Field of Search ............................... 430/22, 296, 328, 430/942

[56] References Cited

FOREIGN PATENT DOCUMENTS 57-170526  10/1982  Japan .
59-116745   7/1984  Japan .
63-20830    1/1988  Japan .

*Primary Examiner*—Christopher G. Young
*Attorney, Agent, or Firm*—Finnegan, Henderson, Farabow, Garrett & Dunner, L.L.P.

[57] ABSTRACT

Disclosed is a pattern forming method, comprising the steps of providing a resist film, applying a light exposure to the resist film, with a film directly above the resist film and another film directly below the resist film being made insulative, applying a charged beam exposure to the resist film, with the film directly above the resist film and the other film directly below the resist film being made conductive, and developing the resist film to form a resist pattern.

20 Claims, 10 Drawing Sheets

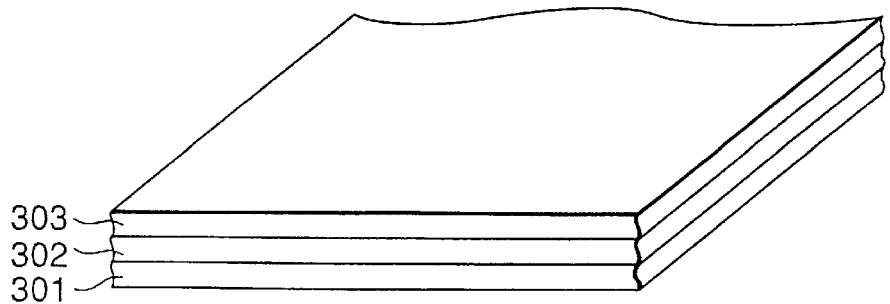
F I G. 12A
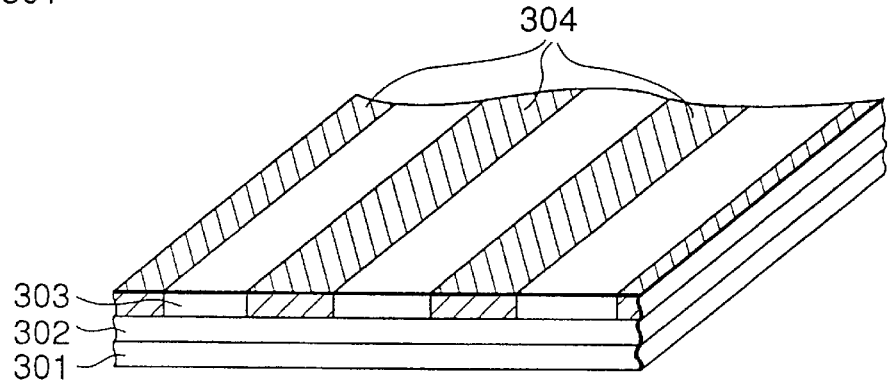
F I G. 12B
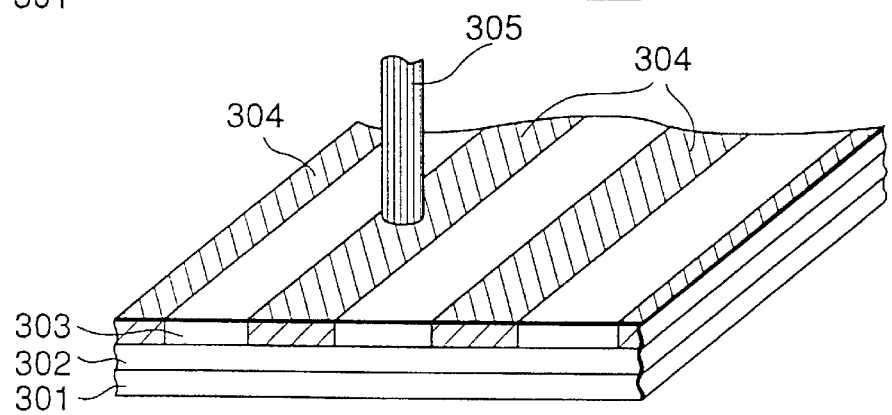
F I G. 12C
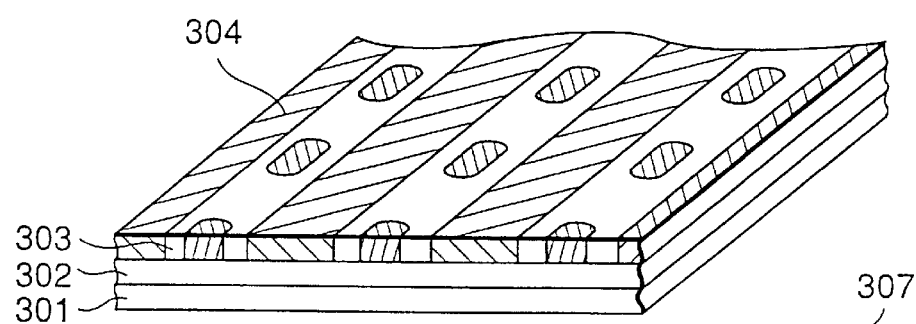
F I G. 12D
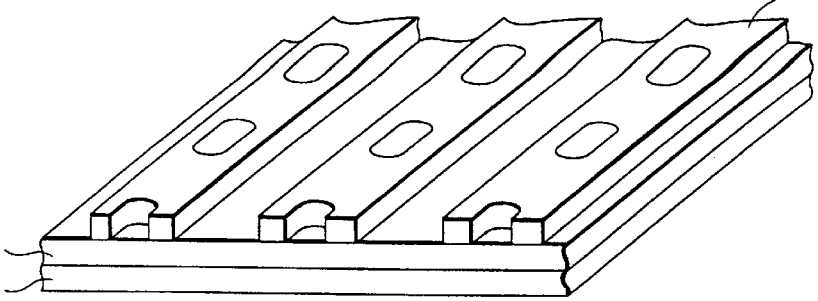
F I G. 12E

PATTERN FORMING METHOD UTILIZING FIRST INSULATIVE AND THEN CONDUCTIVE OVERLAYER AND UNDERLAYER

BACKGROUND OF THE INVENTION

The present invention relates to a pattern forming method which permits forming a semiconductor integrated circuit pattern including fine patterns with a high superposing accuracy and with a high through-put.

The photolithography technology used in the manufacture of a semiconductor device facilitates the manufacturing process and lowers the manufacturing cost and, thus, has been widely employed in the manufacture of electronic devices. As a result of technical innovation which continues to be made nowadays, miniaturization of a device has now been achieved to provide a device sized at 0.25 μm or less by the use of a light source of a short wavelength (KrF excimer laser light source). Also, vigorous researches are being made on the use of ArF excimer laser light source having a wavelength shorter than that of the KrF excimer laser light, or on the development of a Revenson type phase shifting mask in an attempt to achieve further miniaturization of the device. These new techniques are expected to provide a mass production lithography tool corresponding to the 0.15 μm rule.

However, various problems must be solved for developing these new techniques, and a long time is required for the development. It is worried about that the speed of development may fail to follow the speed in the miniaturization of the device.

On the other hand, a charged beam lithography, which is considered to be a first candidate of the post-photolithography, has already proved that it is possible to form a pattern sized at 0.01 μm by using a finely drawn beam. This technology is satisfactory in terms of miniaturization of the device, but leaves room for further improvement in terms of the through-put when used as a tool for mass production of the device. To be more specific, fine patterns are depicted one by one in the charged beam lithography, leading to requirement of a long treating time.

A pattern forming method utilizing a charged beam which exhibits a resolution higher than that achieved by light and achieving a through-put substantially equal to that of a light stepper and a lithography system achieving the particular pattern forming method are being developed in recent years. The particular pattern forming method is expected to provide a mass production system adapted for use after the era of the photolithography. In the particular pattern forming method and the lithography system, it is necessary to form a conductive upper film right above a resist film or to form a conductive underlying film right below the resist film in order to prevent the charge accumulation in the step of exposure to the charged beam.

However, if the conductive film is formed right above or below the resist film, it has been clarified that the profile of the resist pattern formed by the light exposure is deteriorated, and that the process allowance is lowered. Particularly, these problems are rendered prominent where a fine pattern smaller than the wavelength of the light used for the light exposure is to be formed.

Also, in this technique, it is necessary to align the pattern of exposure to light with the pattern of exposure to the charged beam. In this case, each of these patterns is aligned with the same mark. In other words, it is unavoidable to employ an indirect alignment. The necessity of employing an indirect alignment in place of a direct alignment is a serious defect because the required accuracy of alignment is made severer to severer in accordance with miniaturization of the pattern size.

The present inventors previously proposed a pattern forming method in which a charged beam is aligned with a latent image formed in advance within a resist film by exposure to light. In this method, a conductive layer is formed above or below a resist film in order to prevent a charge up in the step of exposure to a charged beam, with the result that it is difficult to clearly sense the latent image formed within the resist film. It follows that the S/N ratio of the position information is deteriorated, making it difficult to achieve the required alignment accurately. In other words, it was impossible to align the light exposure pattern within the resist layer with the charged beam pattern while preventing the charge-up problem from taking place in the step of exposure to a charged beam.

BRIEF SUMMARY OF THE INVENTION

An object of the present invention is to provide a pattern forming method employing a hybrid exposure in which a light exposure and an electron beam exposure are utilized in combination, the method making it possible to obtain a resist pattern of a good profile, which is free from a positional deviation caused by a charge accumulation in the step of the charged beam exposure, with a large process allowance in the step of the light exposure.

Another object is to provide a pattern forming method which permits a light exposure pattern within a resist film and a charged beam pattern to be aligned with each other at a high accuracy in a mix-and-match of light and electron beam.

According to an aspect of the present invention, there is provided a pattern forming method, comprising the steps of providing a resist film, applying a light exposure to the resist film, with a material directly above the resist film and another film directly below the resist film being made insulative, applying a charged beam exposure to the resist film, with the film directly above the resist film, or the other film directly below the resist film being made conductive, and developing the resist film to form a resist pattern.

According to another aspect of the present invention, there is provided a pattern forming method, comprising the steps of forming an underlying film consisting of a photo-conductive material on a work film, forming a resist film on the underlying film, applying a light exposure to the resist film, irradiating the underlying film with light to impart photoconductivity to the underlying film, applying a charged beam exposure to the resist film, and developing the resist film to form a resist pattern.

According to another aspect of the present invention, there is provided a pattern forming method, comprising the step of forming an underlying film on a work film, the underlying film containing an organosilicon compound having a silicon-to-silicon backbone chain, forming a resist film on the underlying film, applying a light exposure to the resist film, applying a charged beam exposure to the resist film, and developing the resist film to form a resist pattern.

According to another aspect of the present invention, there is provided a pattern forming method, comprising the step of forming a resist film on an insulating film, applying a light exposure to the resist film, forming an upper film consisting of a conductive material on the resist film, applying a charged beam exposure to the resist film having the upper film formed thereon, and developing the resist film to form a resist pattern.

Further, according to still another aspect of the present invention, there is provided a pattern forming method, comprising the steps of forming an underlying film consisting of a photoconductive material on a work film, forming a resist film on the underlying film, detecting a position information of a substrate pattern formed below the underlying film by using a charged beam, irradiating the underlying film with light to impart photoconductivity to the underlying film, and correcting the position of the latent image formed within the resist film by a charged beam exposure on the basis of the position information.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 12A to 12E are cross sectional views collectively showing a pattern forming method according to the fourth and fifth embodiments of the present invention;

DETAILED DESCRIPTION OF THE INVENTION

Figure 1A:
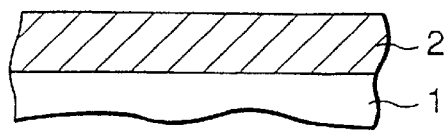
FIGS. 1A to 1F are cross sectional views collectively showing a pattern forming method according to first and second embodiments of the present invention.

Let us describe some embodiments of the present invention.

The present inventors have conducted an extensive research in an attempt to obtain a resist pattern having a good profile by exposure to light with a wide process allowance, finding that it is necessary for a resist film to be covered directly with an insulating material and for a film positioned immediately below the resist film to be an insulating material. However, if the resist film is covered directly with an insulating material and if the film positioned immediately below the resist film is formed of an insulating material in order to improve the performance of the light exposure in a hybrid exposure utilizing in combination a light exposure and a charged beam exposure, a problem is brought about that a positional deviation is caused by the charge accumulation in the insulating material in the step of the charged beam exposure. To solve the problem, the present inventors have found that the problem can be solved by making the film immediately above or below the resist film conductive in the step of the charged beam exposure while keeping the particular film insulating in the step of the light exposure, arriving at the present invention. The insulating material immediately above the resist film may be an insulating atmosphere.

The pattern forming method of the present invention, which is based on the particular technical idea, includes five embodiments, as described below.

(First Embodiment)

A pattern forming method according to a first embodiment of the present invention comprises the step of forming a lower layer consisting of a photoconductive material on a work film (i.e., a film to be worked or processed), the step of forming a resist film on the lower layer, the step of exposing the resist film to light, the step of irradiating the lower layer with light to impart photoconductivity to the lower layer, the step of exposing the resist film to a charged beam, and the step of developing the resist film to form a resist pattern.

In this case, the step of irradiating the lower layer with light and the step of exposing the resist film to a charged beam can also be performed at the same time.

In this embodiment, the lower layer made of a photoconductive material is irradiated with light only during the exposure step to a charged beam, making it possible to render the lower layer conductive during the charged beam exposure step and insulating during the light exposure step. As a result, the charge is not accumulated within the resist film during the charged beam exposure step. Therefore, it is possible to obtain a resist pattern free from positional deviation. Also, since the lower layer is an insulator during the light exposure step, a resist pattern of a good profile can be obtained with a wide margin.

Where the photoconductivity is irreversible and, thus, the photoconductivity is maintained even after the light irradiation, it is not absolutely necessary to perform the exposure to the charged beam while irradiating the lower layer with light to impart photoconductivity to the lower layer. In other words, it is possible to perform the step of irradiating the lower layer with light to impart photoconductivity to the lower layer between the step of forming a latent image by exposure to light and the step of exposure to the charged beam.

(Second Embodiment)

A pattern forming method according to a second embodiment of the present invention comprises the step of forming a lower layer containing an organisilicon compound having a silicon-to-silicon backbone chain on a work film, the step of forming a resist film on the lower layer, the step of exposing the resist film to light, the step of irradiating the lower layer with light, the step of exposing the resist film to a charged beam, and the step of developing the resist film to form a resist pattern.

In this embodiment, the lower layer contains an organisilicon compound having a silicon-to-silicon backbone chain, making it possible to prevent charges from being accumulated in the resist film during the charged beam exposure step. Therefore, it is possible to obtain a resist pattern free from a positional deviation. The particular effect is considered to be derived from the phenomenon that the electrical resistance of the organisilicon compound is lowered in the step of the exposure to the charged beam. It should also be noted that the organisilicon compound is an insulator in the light exposure step, making it possible to obtain a resist pattern of a good profile with a wide margin.

(Third Embodiment)

A pattern forming method according to a third embodiment of the present invention comprises the step of forming a resist film on an insulating film, the step of applying a light exposure to the resist film, the step of forming an upper film consisting of a conductive material on the resist film, the step of applying a charged beam exposure to the resist film having the upper film formed thereon, and the step of developing the resist film to form a resist pattern.

In this embodiment, the film formed below the resist film is an insulating film during the light exposure step, making it possible to obtain a resist pattern of a good profile with a large margin. Also, since a conductive upper film is formed on the resist film during the charged beam exposure step, the charge is not accumulated in the resist film, making it possible to obtain a resist pattern free from a positional deviation.

(Fourth Embodiment)

A fourth embodiment of the present invention is directed to a pattern forming method according to the first embodiment, wherein the position of the latent image formed by the charged beam exposure is corrected on the basis of the information on the position of the latent image formed within the resist film by the light exposure.

In this embodiment, the underlying film is an insulator in the step of detecting the latent image formed within the resist film by the light exposure, making it possible to obtain a clearer latent image, compared with the case where the underlying film is conductive in the latent image detecting step. It follows that the position can be aligned highly accurately. Also, the underlying film consists of a photoconductive film, and the charged beam exposure is performed while irradiating the underlying film with light to make the underlying film conductive. In short, the underlying film is an insulator in the step of the light exposure and is a conductor in the step of the charged beam exposure, making it possible to solve the problem of the positional deviation caused by the charge-up which takes place in the step of the charged beam exposure.

Where the photoconductivity is not reversible, it is not absolutely necessary to perform the charged beam exposure while applying the light irradiation to make the underlying film conductive. It is also possible to perform the step of irradiating the underlying film with light to make the underlying film conductive between the latent image forming step by light exposure and the charged beam exposure step.

(Fifth Embodiment)

A pattern forming method according to a fifth embodiment of the present invention, which is a modification of the fourth embodiment, comprises the step of forming an underlying film consisting of a photoconductive material on a work film, the step of forming a resist film on the underlying film, the step of detecting the information on the position of an underlying pattern below the underlying film with a charged beam, the step of irradiating the underlying film with light to impart photoconductivity to the underlying film, and the step of applying a charged beam exposure to correct the position of the latent image formed within the resist film.

In this case, the step of irradiating the lower layer with light and the step of exposing the resist film to a charged beam can also be performed at the same time.

In this embodiment, the underlying film is formed of a photoconductive material, and the charged beam exposure is performed while irradiating the underlying film with light. As a result, the underlying film is rendered insulating in the step of detecting the underlying pattern and conductive in the charged beam exposure step. Since the underlying film is insulating in the step of detecting the position information of the pattern within the substrate below the resist film, it is possible to prevent the electrons emitted for detecting the position information, the electrons reflected from the underlying pattern or the secondary electrons from being diffused. As a result, the position information can be detected accurately and, thus, the resist pattern can be formed with a high superposing accuracy.

Where the photoconductivity is not reversible, it is not absolutely necessary to perform the charged beam exposure while irradiating the underlying film with light to impart conductivity to the underlying film. Specifically, it is possible to perform the step of irradiating the underlying film with light to impart conductivity to the underlying film between the step of forming a latent image by light exposure and the charged beam exposure step.

Let us describe specific embodiments of the present invention with reference to the accompanying drawings.

Specifically, FIGS. 1A to 1F are cross sectional views collectively showing a pattern forming method according to first and second embodiments of the present invention.

In the first step, a work film 2 is formed on a semiconductor wafer 1, as shown in FIG. 1A. The material of the work film 2, which is not particularly limited, includes, for example, a silicon oxide film, a silicon nitride film, a silicon oxynitride film, a spin-on glass, a silicon-based insulating film such as a blank material used in the manufacture of a mask, a silicon-based material such as amorphous silicon, polycrystalline silicon, or a silicon substrate, and a wiring material such as aluminum, aluminum silicide, copper, or tungsten.

Figure 1B:
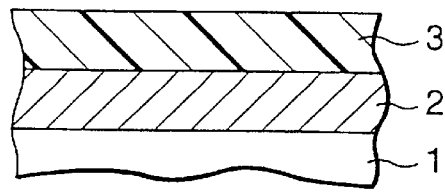

In the next step, an underlying film 3 containing a photoconductive material, is formed on the work film 2 as shown in FIG. 1B. It is desirable for the underlying film to contain an organisilicon compound because the organisilicon compound film is likely to be etched relative to a resist film so as to make it possible to process the underlying film with a high anisotropy.

In order to suppress the reflection of light used for light exposure from the work film 2 to obtain a resist pattern having a good size controllability, it is desirable for the complex refractive index of the underlying film 3 under the wavelength of the light used for the light exposure to fall within the ranges of 1.0<n<3.0, 0.1<k<1.0. It is also desirable for the underlying film to have a thickness of 0.005 to 5 μm. If the thickness is less than 0.005 μm, it is impossible for the underlying film to release sufficiently the charge accumulated in the resist film in the step of exposure to a charged beam. On the other hand, if the thickness of the underlying film exceeds 5 μm, a differential size conversion takes place prominently in the step of transferring the resist pattern onto the underlying film by dry etching method.

Let us describe in detail the method of forming the underlying film. Specifically, the underlying film can be formed by any of a solution coating method, a gaseous phase method such as a CVD (chemical vapor deposition) method, and a sputtering method. Particularly, it is desirable to employ the coating method because the coating method is most effective for reducing the manufacturing cost.

For forming the underlying film by the coating method, a solution material is prepared first by dissolving a photoconductive material in an organic solvent. The photoconductive material used in the present invention includes, for example, an organisilicon compound having a silicon-to-silicon backbone chain. Specific organisilicon compounds include, for example, polysilane or polysilene represented by chemical formulas 1-1 to 1-114 given below. It is desirable for these organisilicon compounds to have an average molecular weight of 200 to 100,000. If the molecular weight is lower than 200, the organic compound tends to be evaporated when the coated film is heated. On the other hand, if the molecular weight exceeds 100,000, the organic compound is unlikely to be dissolved in a solvent, making it difficult to prepare a solution material of the underlying film.

[1-1]
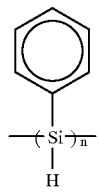

[1-2]
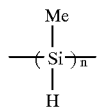

[1-3]
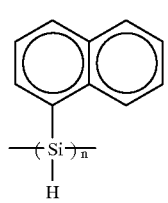

[1-4]
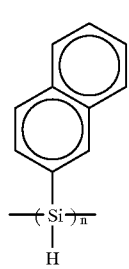

-continued

[1-5]
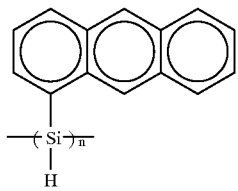

[1-6]
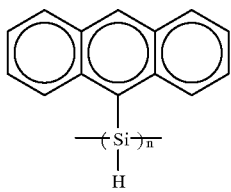

[1-7]
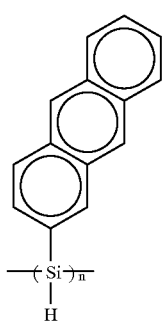

[1-8]
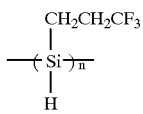

[1-9]
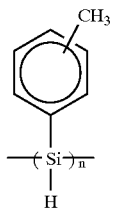

[1-10]
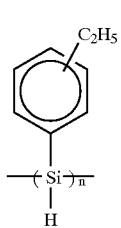

[1-11]
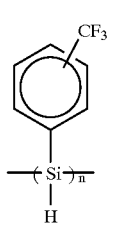

[1-12] 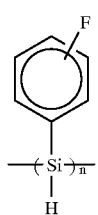
[1-13] 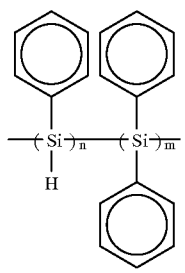
[1-14] 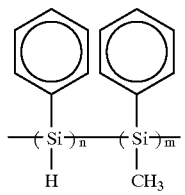
[1-15] 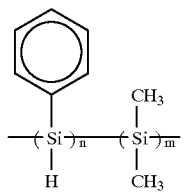
[1-16] 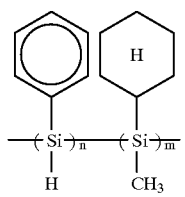
[1-17] 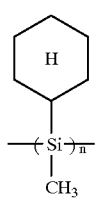
[1-18] 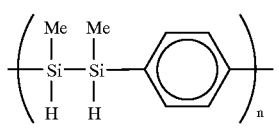
[1-19] 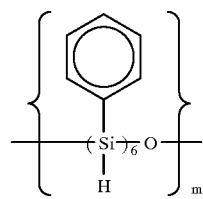
[1-20] 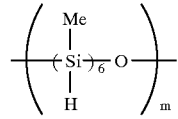
[1-21] 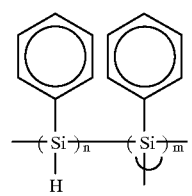
[1-22] 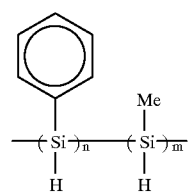
[1-23] 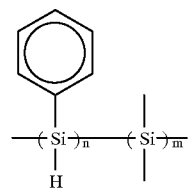
[1-24] 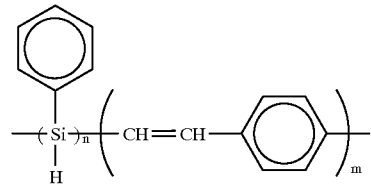
[1-25] 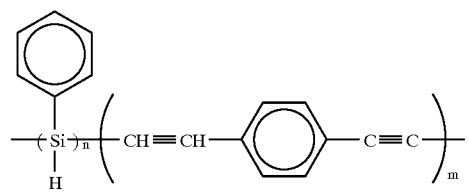
[1-26]

[1-27]
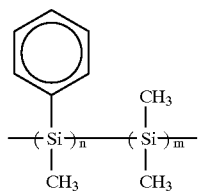
[1-28]
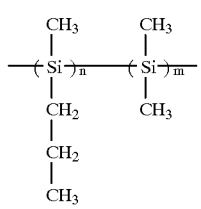
[1-29]
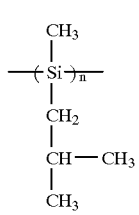
[1-30]
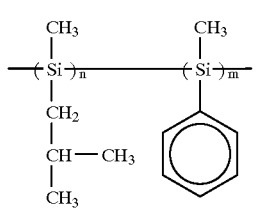
[1-31]
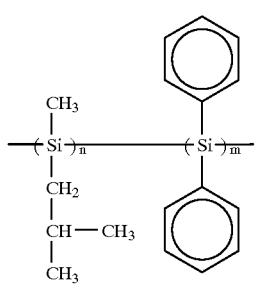
[1-32]
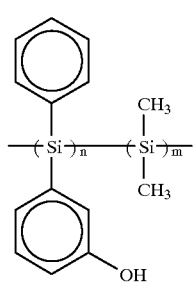
[1-33]
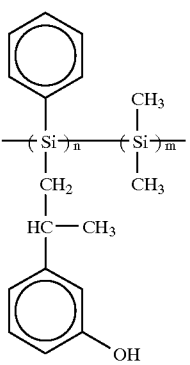
[1-34]
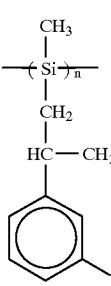
[1-35]
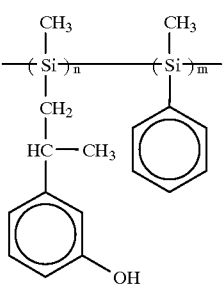
[1-36]
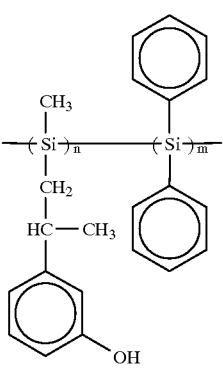

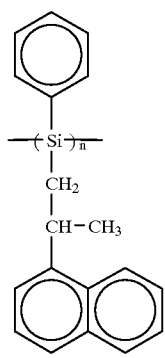
[1-37]
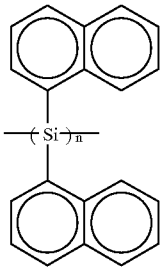
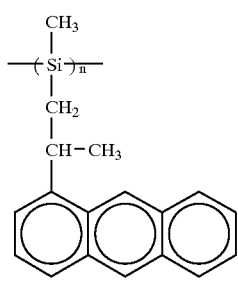
[1-38]
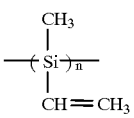
[1-42]
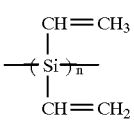
[1-43]
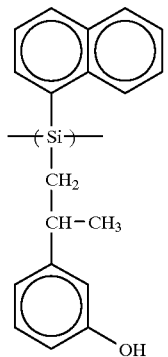
[1-39]
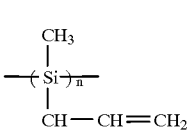
[1-44]
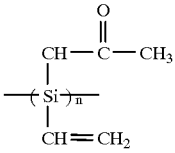
[1-45]
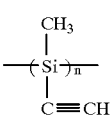
[1-46]
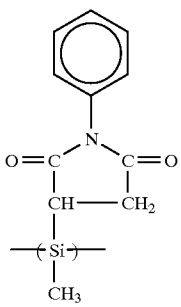
[1-40]
[1-47]
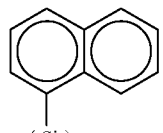
[1-48]
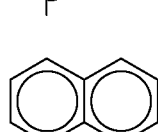
[1-49]

-continued
[1-50] 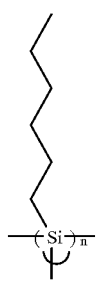
[1-51] 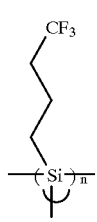
[1-52] 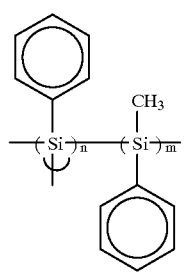
[1-53] 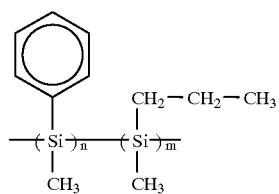
[1-54] 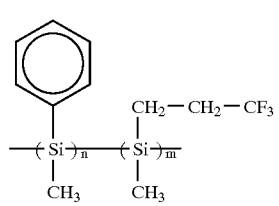
[1-55] 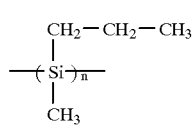
-continued
[1-56] 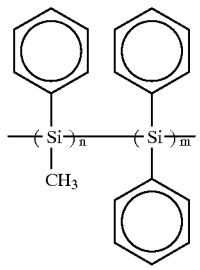
[1-57] 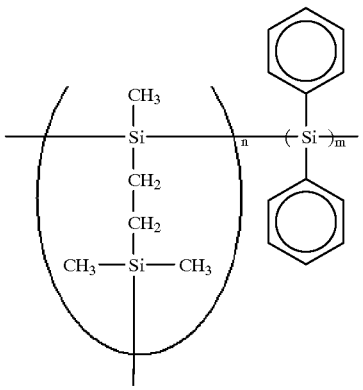
[1-58]
[1-59]

[1-60]
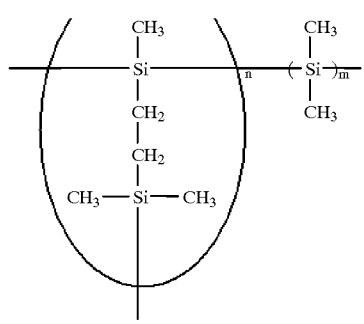
[1-61]
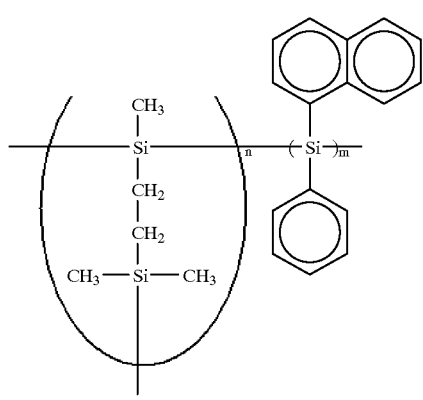
[1-62]
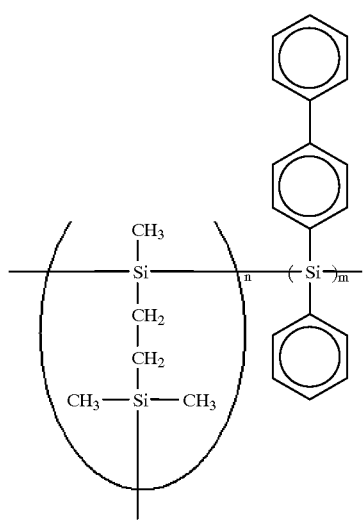
[1-63]
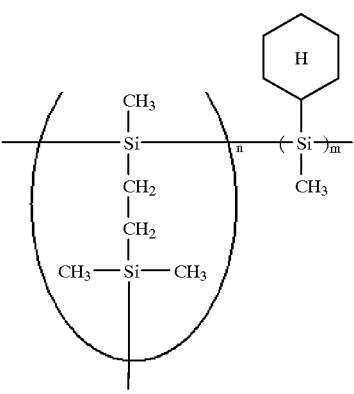
[1-64]
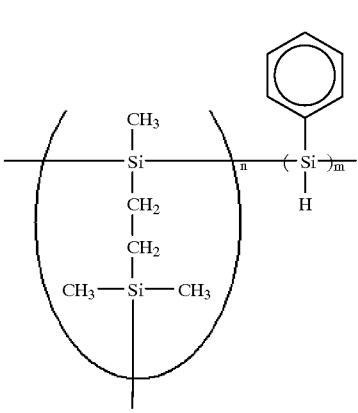
[1-65]
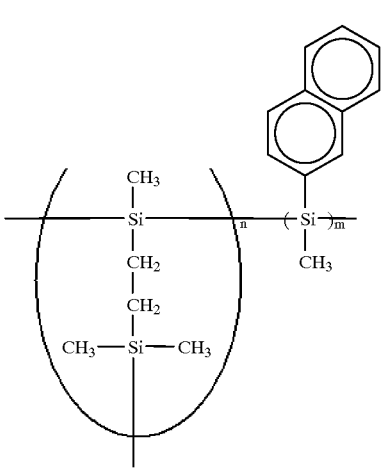

[1-66]
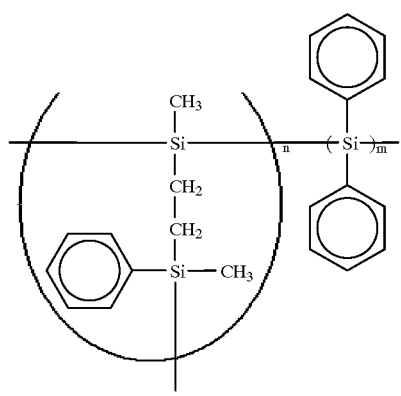
[1-70]
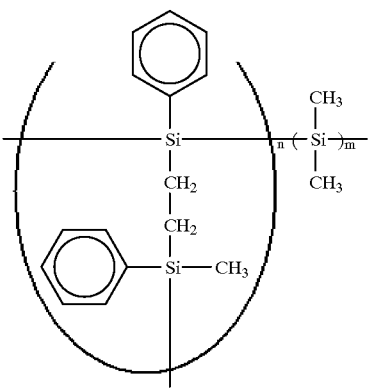
[1-67]
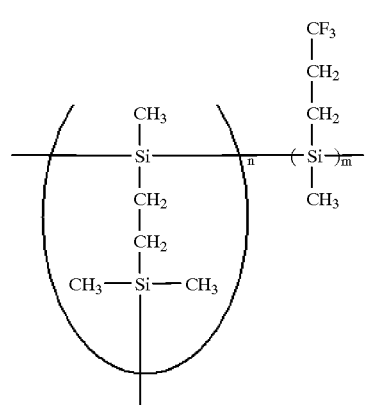
[1-71]
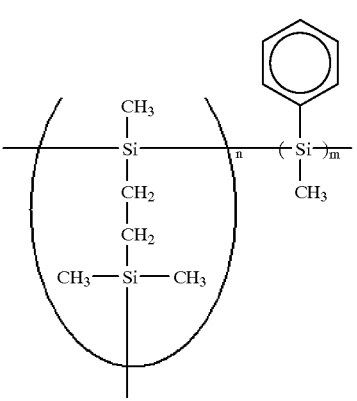
[1-68]
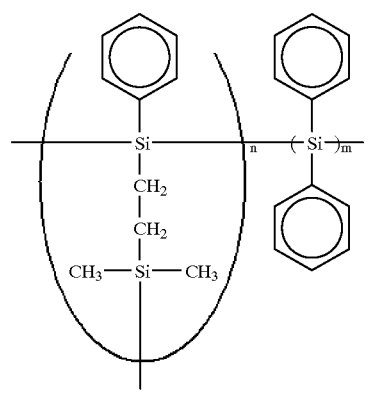
[1-72]
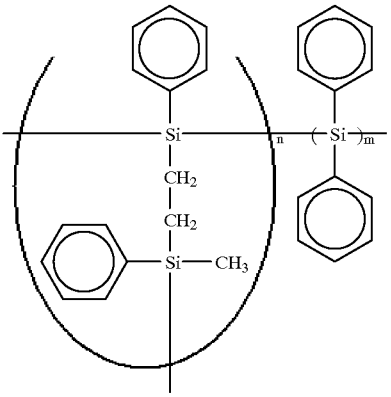
[1-69]
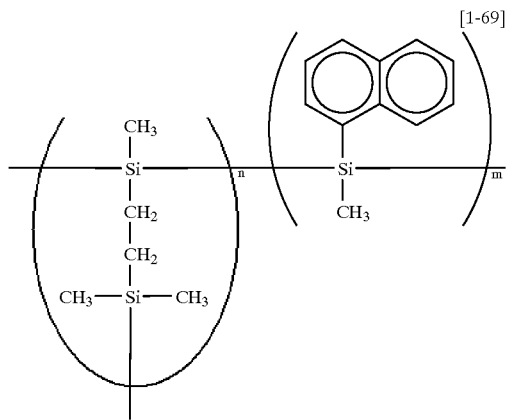
[1-73]
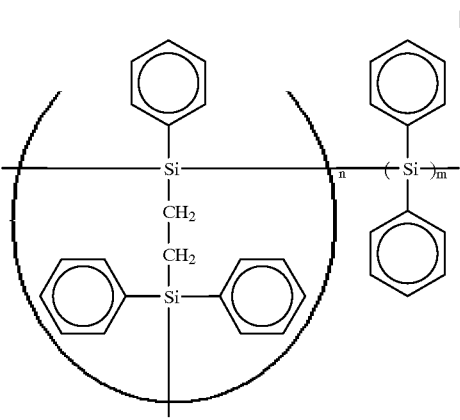

[1-74]
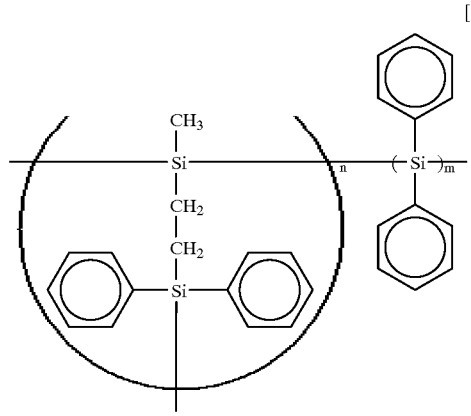
[1-78]
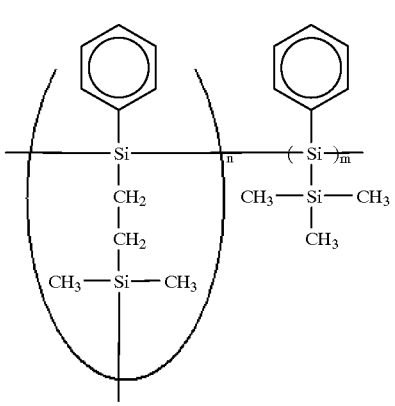
[1-75]
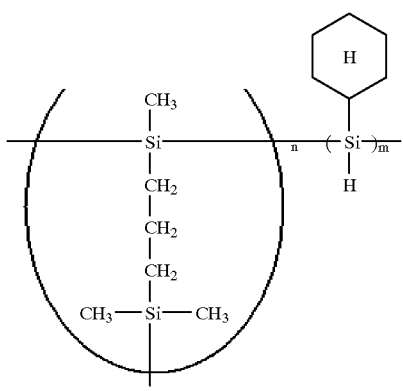
[1-79]
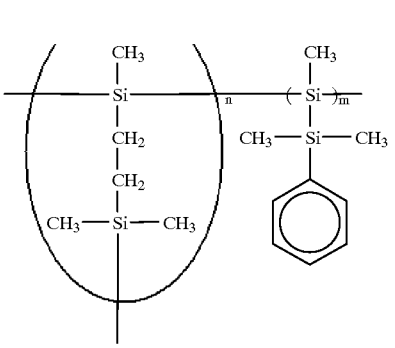
[1-76]
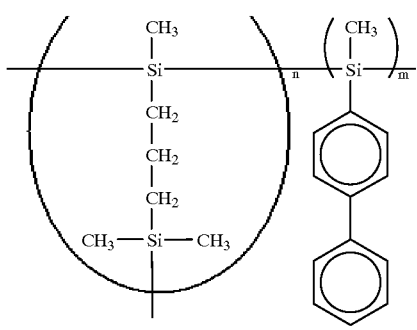
[1-80]
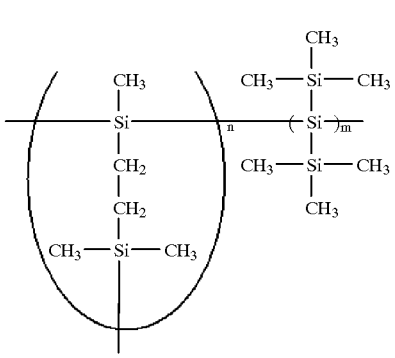
[1-77]
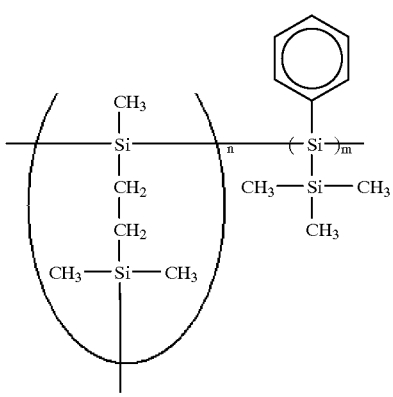
[1-81]
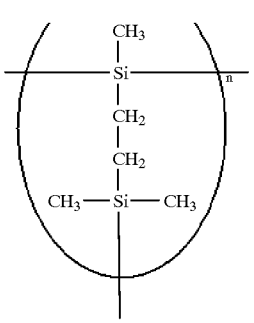

[1-82] 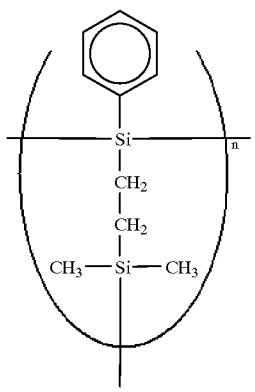
[1-83] 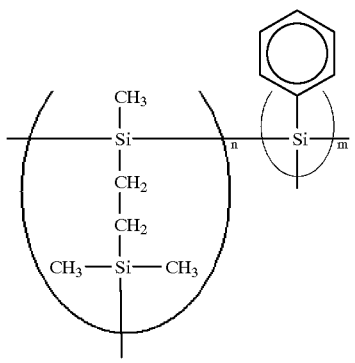
[1-84] 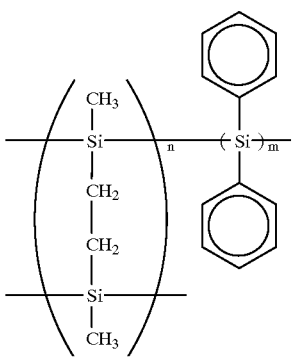
[1-85] 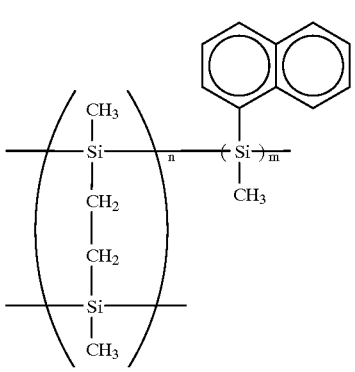
[1-86] 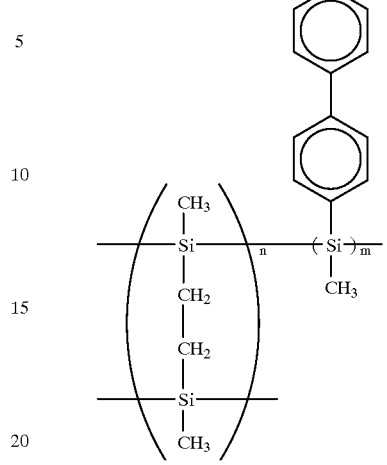
[1-87] 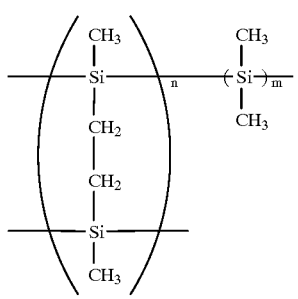
[1-88] 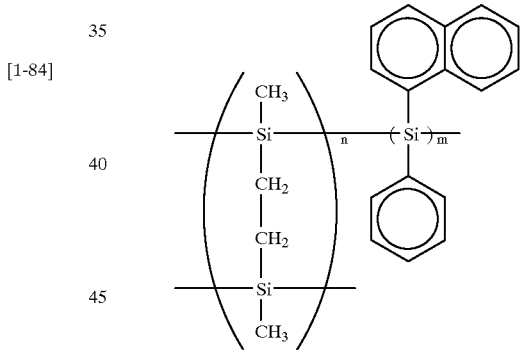
[1-89] 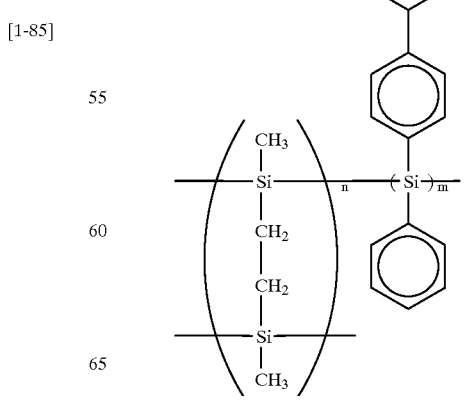

[1-90] 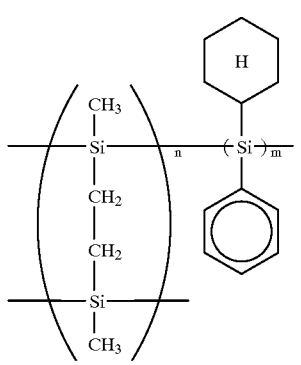
[1-91] 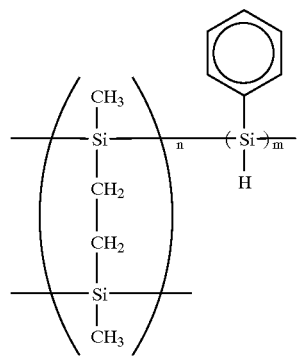
[1-92] 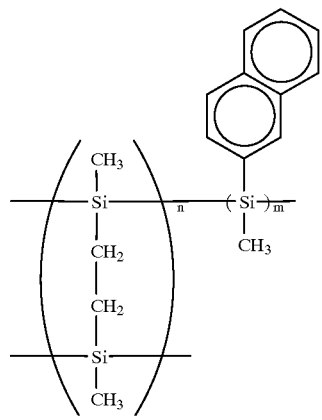
[1-93] 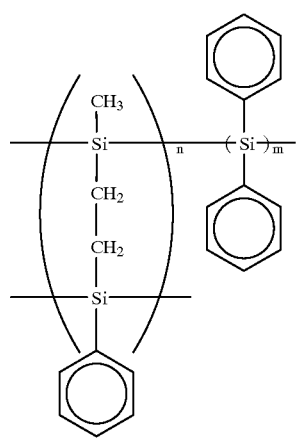
[1-94] 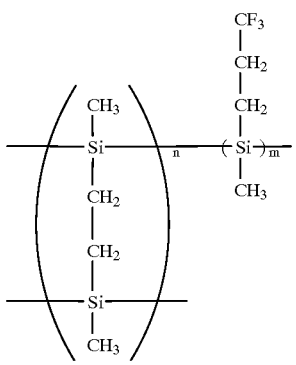
[1-95] 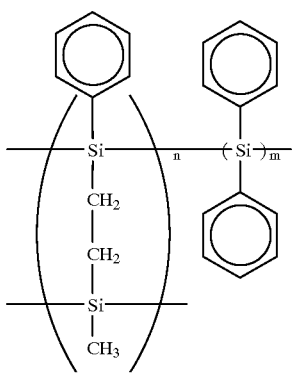
[1-96] 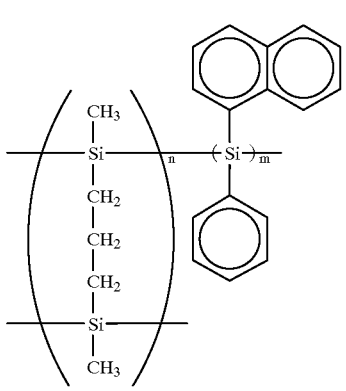
[1-97] 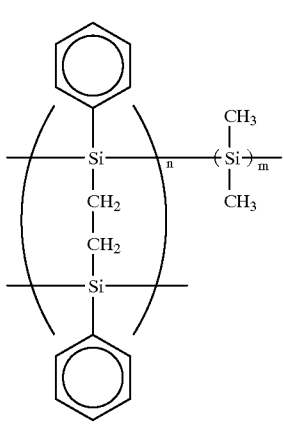

[1-98]
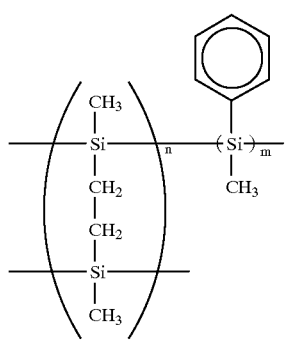
[1-99]
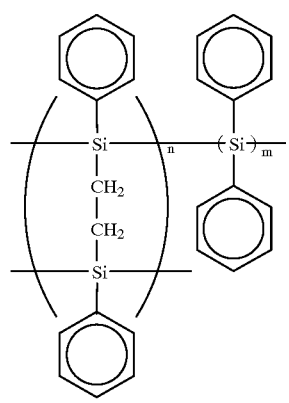
[1-100]
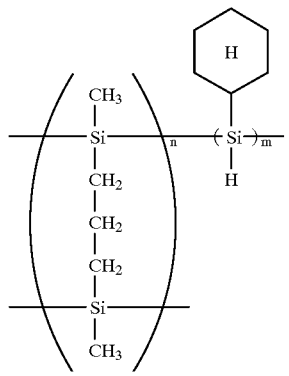
[1-101]
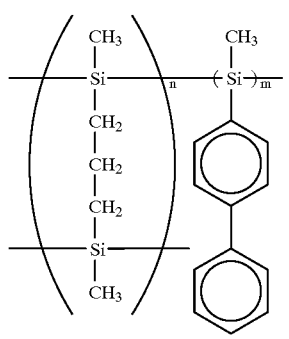
[1-102]
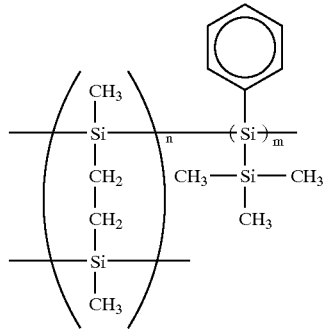
[1-103]
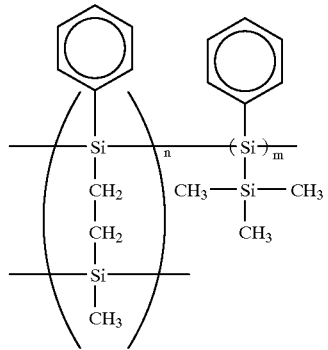
[1-104]
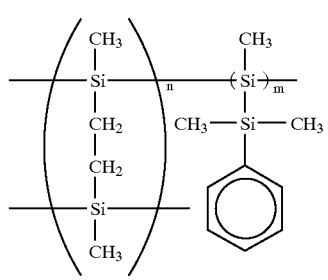
[1-105]
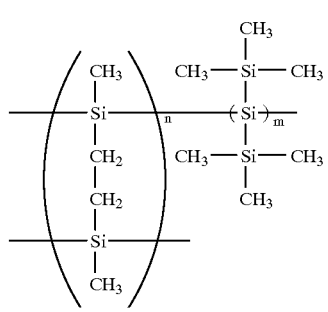
[1-106]
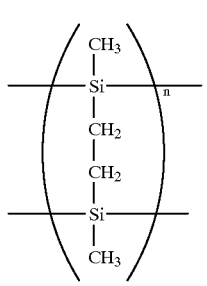

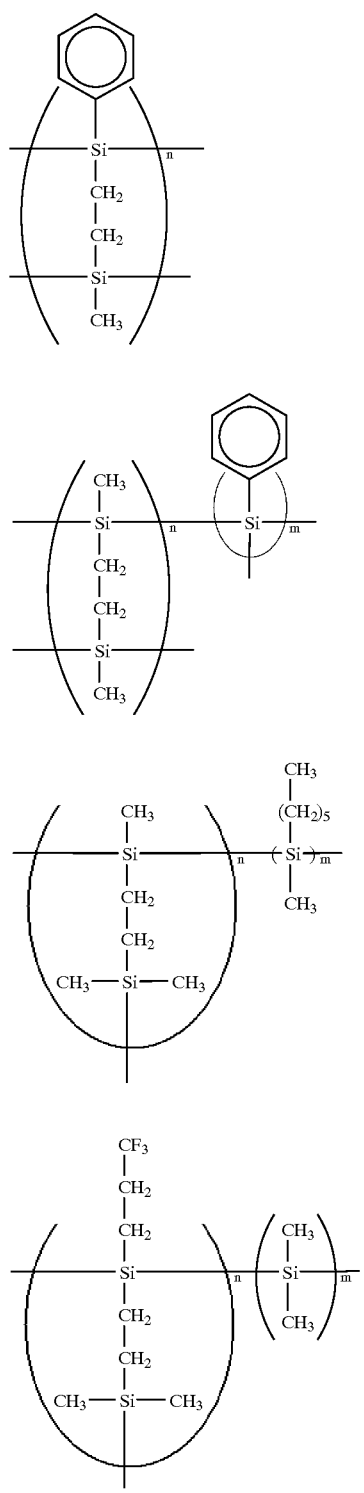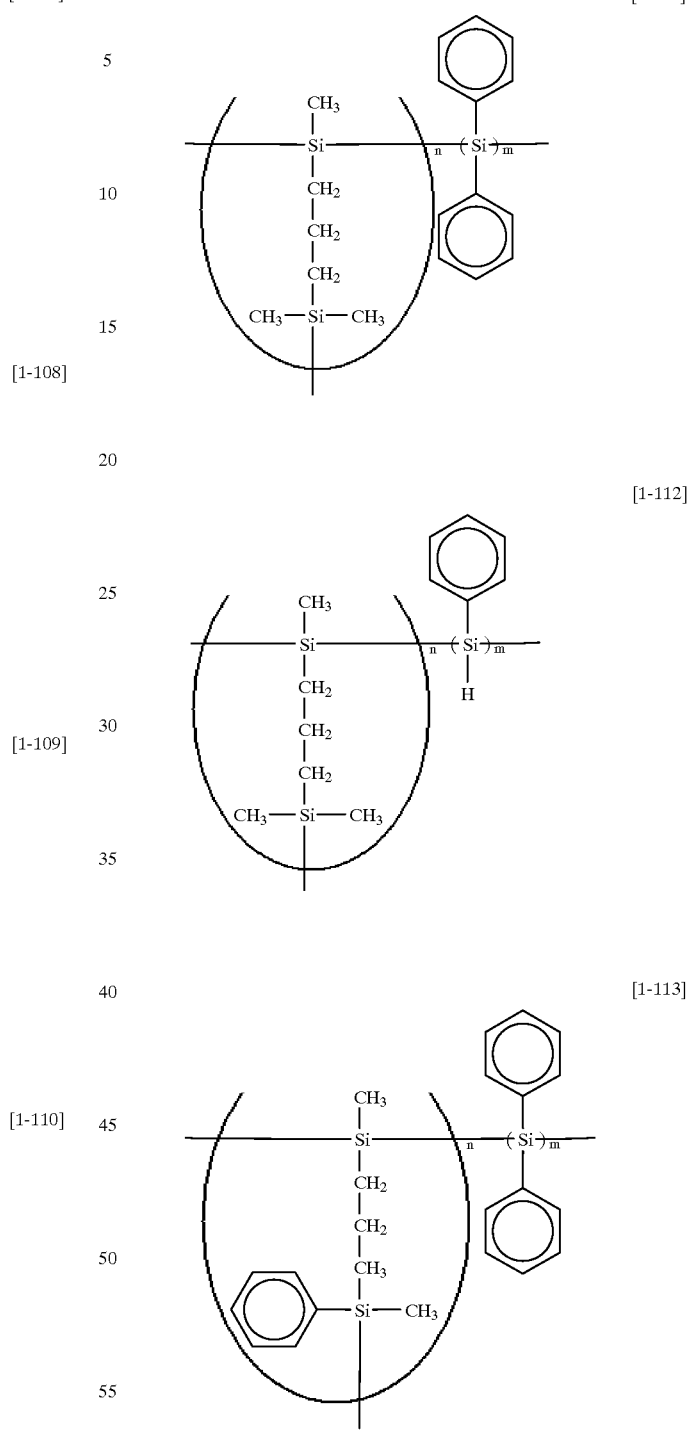

-continued

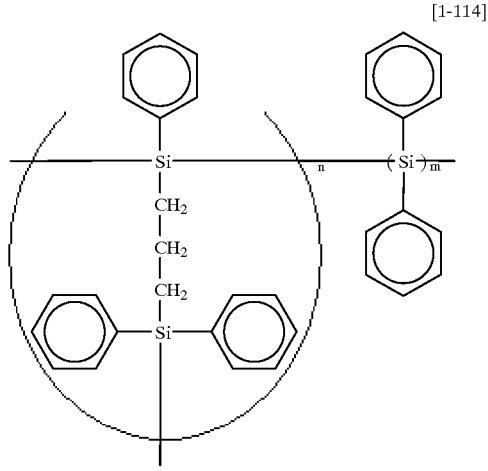

[1-114]

Any of these organic compounds is dissolved in an organic solvent so as to prepare a solution material. Then, the work film is coated with the solution material by means of spin coating method or a coating method such as a permeation method, followed by heating the coating layer so as to evaporate the organic solvent. Where the underlying film containing the organisilicon compound does not exhibit photoconductivity or does not exhibit a sufficiently high photoconductivity, it is possible to add a substance acting as a dopant relative to these compounds or a photoconductive compound. These compounds include, for example, organic sulfonic acid, organic carboxylic acid, polyhydric alcohol, polyhydric thiol (e.g., iodine and bromine), $SbF_5$, $PF_5$, $BF_5$, $SnF_5$, carbon cluster ($C60$, $C70$), cyano anthracene, dicyano anthracene, triphenyl pirium, tetrafluoroborate, tetracyanoxydimethane, tetracyanoethylene, phthalimide trifurate, perchloropenta cyclododecane, dicyano benzene, benzonitrile, trichloromethyl triazine, benzoyl peroxide, benzophenone tetracarboxylic acid, and t-butyl peroxide.

To be more specific, it is possible to use compounds represented by chemical formulas 2-1 to 2-183 given below. It is desirable to add any of these compounds in an amount of 0.1 to 40 parts by weight relative to 100 parts by weight of the underlying film after the heating. If the addition amount is smaller than 0.1 part by weight, it is difficult to obtain a sufficient photoconductivity. If the addition amount exceeds 40 parts by weight, however, the density of the silicon-to-silicon bond in the underlying layer is lowered. As a result, the absorption of the ultraviolet light is lowered, resulting in deterioration of the performance as a reflection preventing film in the light exposure step.

[2-1]
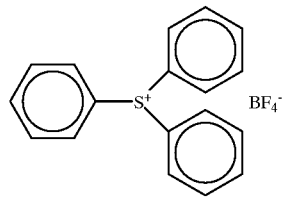

[2-2]
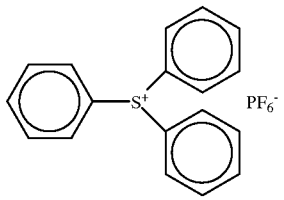

[2-3]
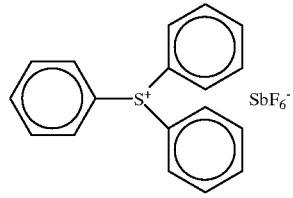

[2-4]
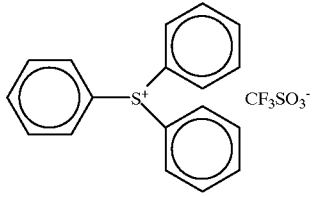

[2-5]
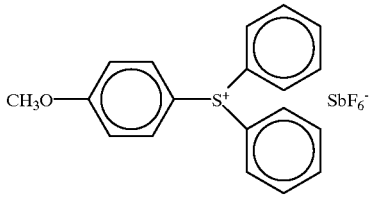

[2-6]
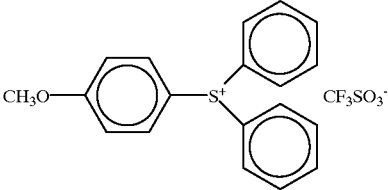

[2-7]
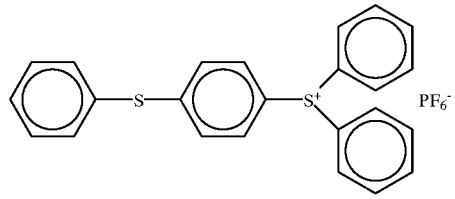

[2-8]
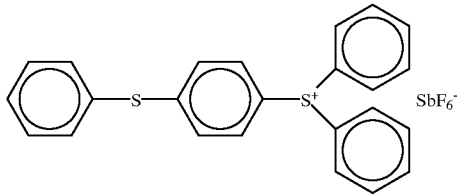

-continued
[2-9]
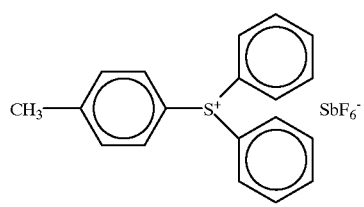
[2-10]
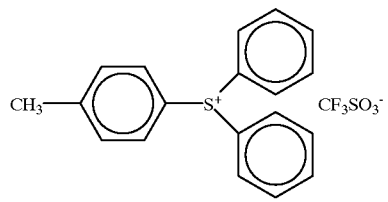
[2-11]
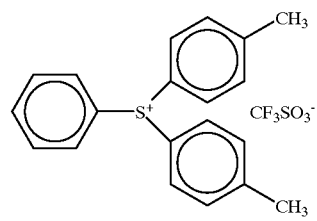
[2-12]
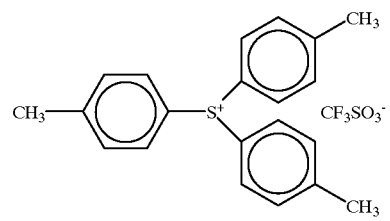
[2-13]
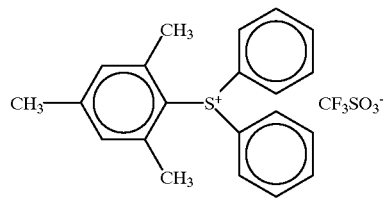
[2-14]
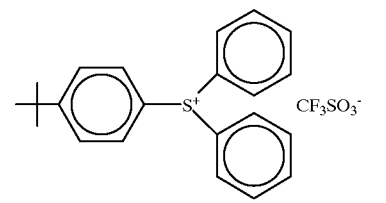
[2-15]
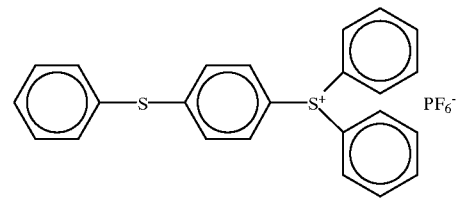
[2-16]
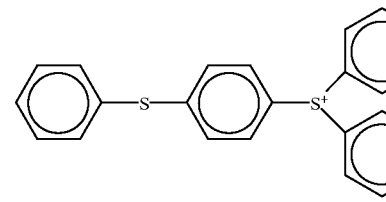
[2-17]
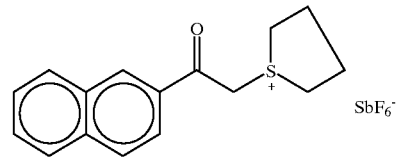
[2-18]
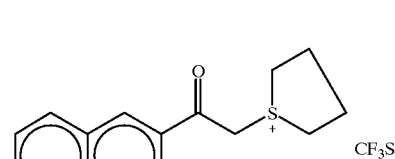
[2-19]
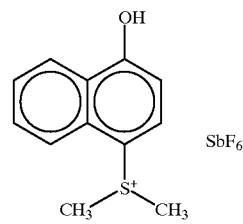
[2-20]
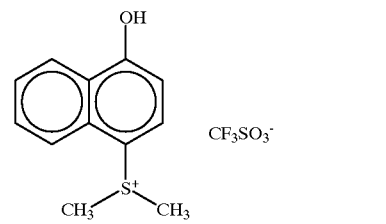
[2-21]
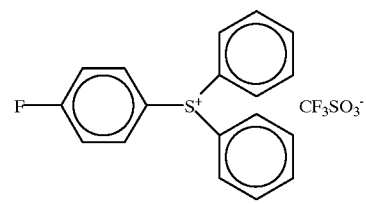
[2-22]
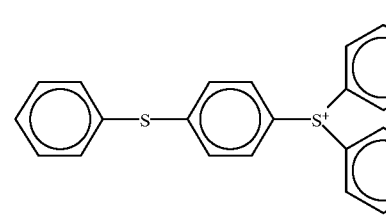

-continued
[2-23]
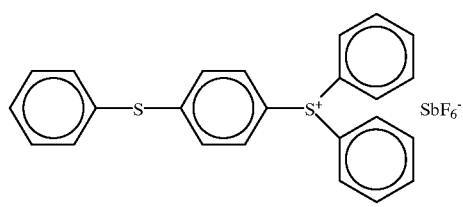 SbF$_6^-$
[2-24]
[2-25]
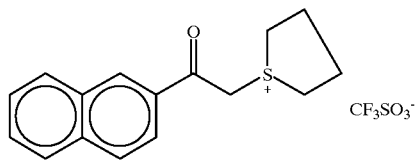 CF$_3$SO$_3^-$
[2-26]
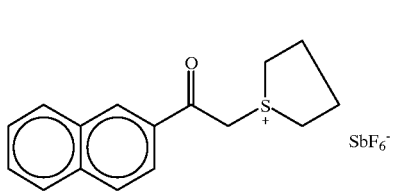 SbF$_6^-$
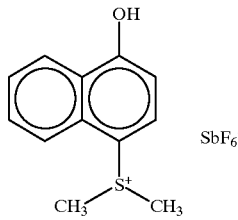 SbF$_6^-$
[2-27]
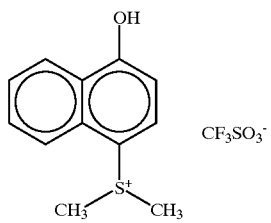 CF$_3$SO$_3^-$
[2-28]
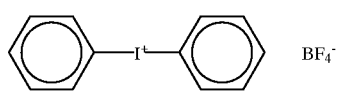 BF$_4^-$
[2-29]
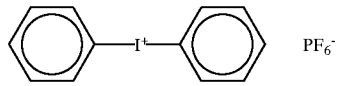 PF$_6^-$
[2-30]
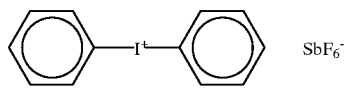 SbF$_6^-$
[2-31]
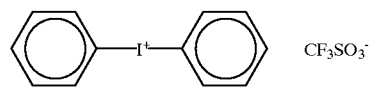 CF$_3$SO$_3^-$
[2-32]
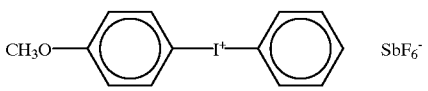 SbF$_6^-$
[2-33]
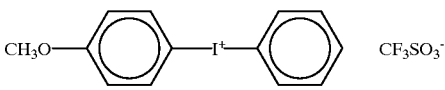 CF$_3$SO$_3^-$
[2-34]
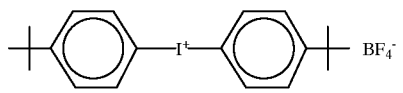 BF$_4^-$
[2-35]
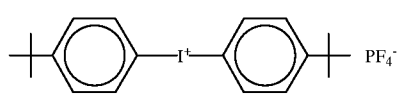 PF$_4^-$
[2-36]
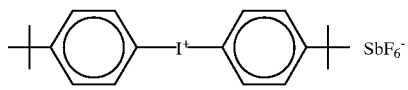 SbF$_6^-$
[2-37]
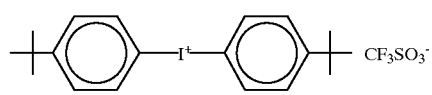 CF$_3$SO$_3^-$
[2-38]
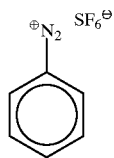 SF$_6^\ominus$ -continued
[2-39]
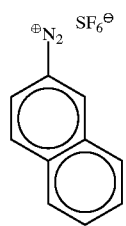
[2-40]
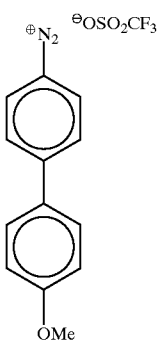
[2-41]
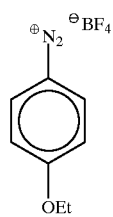
[2-42]
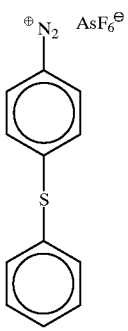
[2-43]
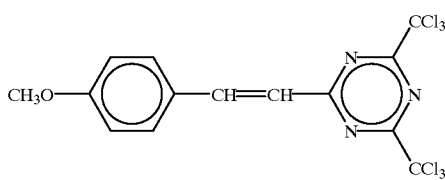
[2-44]
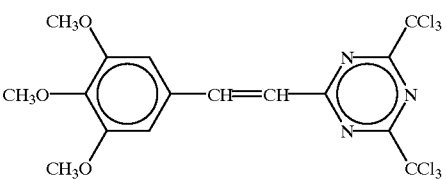
[2-45]
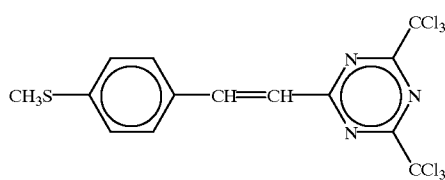
[2-46]
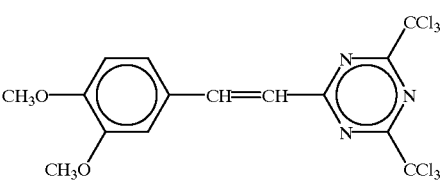
[2-47]
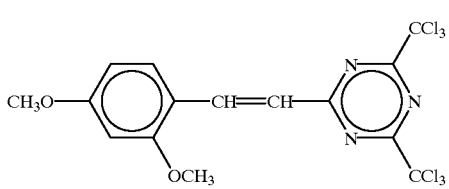
[2-48]
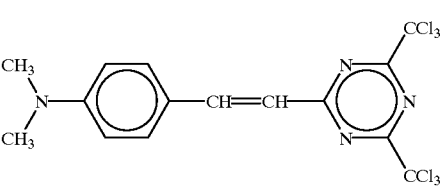
[2-49]
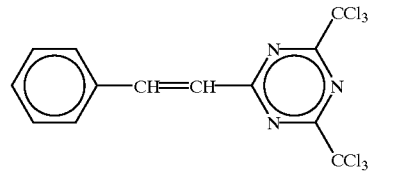
[2-50]
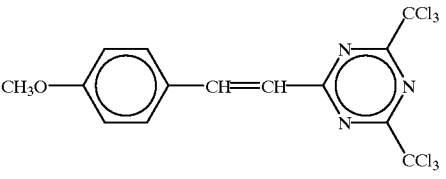

-continued
| [2-51] | [2-52] |
|---|---|
| 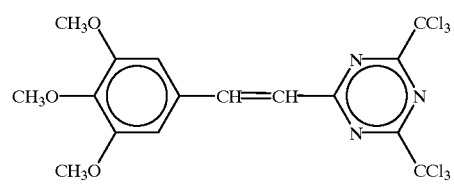 | 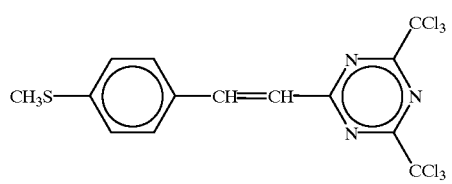 |
| [2-53] | [2-54] |
| 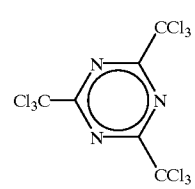 | 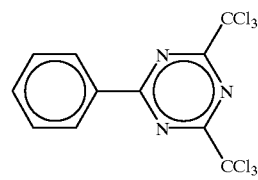 |
| [2-55] | [2-56] |
| 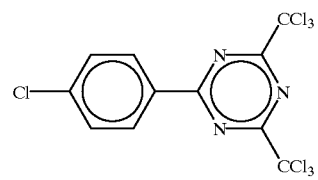 | 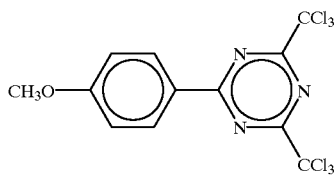 |
| [2-57] | [2-58] |
| 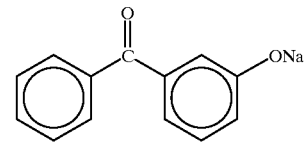 | 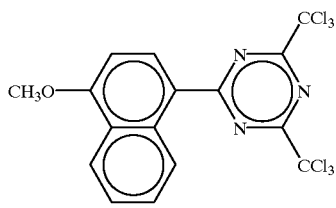 |
| [2-59] | [2-60] |
| 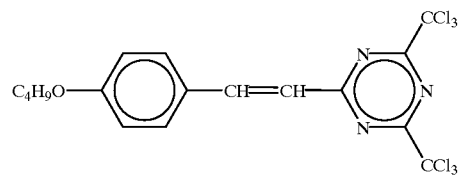 | 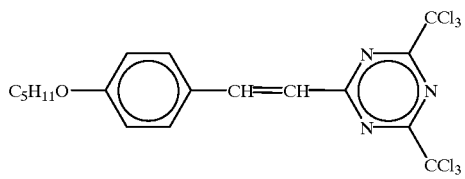 |
| [2-61] | [2-62] |
| 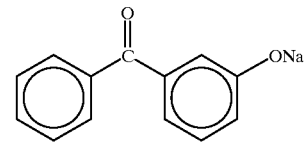 | 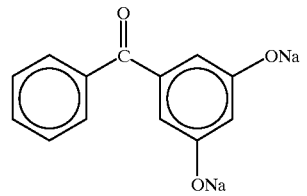 |
| [2-63] | [2-64] |
| 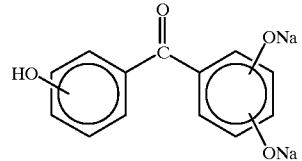 | 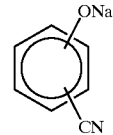 |

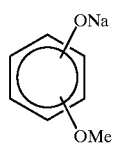
[2-65]
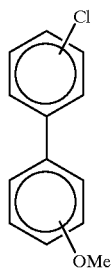
[2-66]
C₂H₅ONa
[2-67]
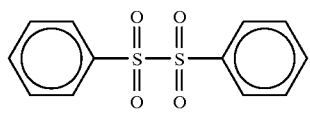
[2-68]
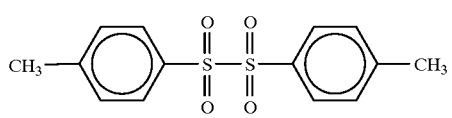
[2-69]
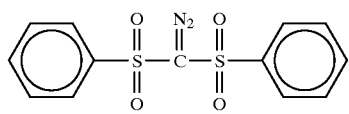
[2-70]
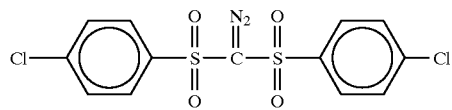
[2-71]
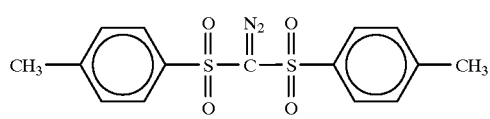
[2-72]
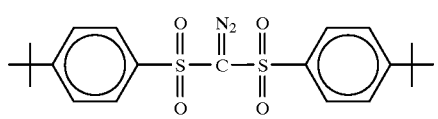
[2-73]
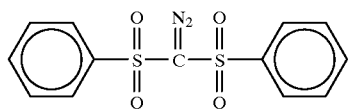
[2-74]
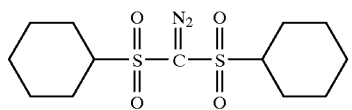
[2-75]
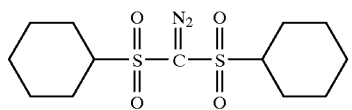
[2-76]
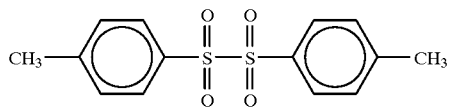
[2-77]
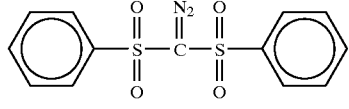
[2-78]
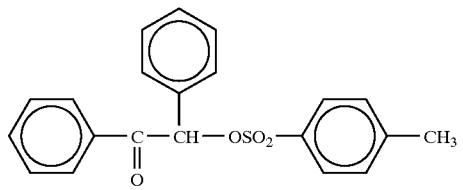
[2-79]
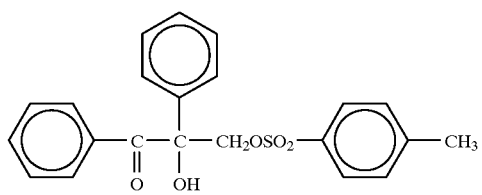
[2-80]
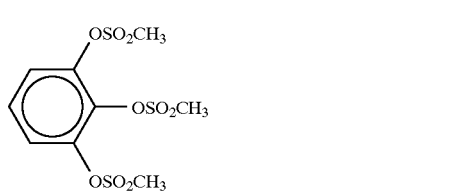
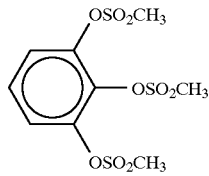
[2-81]

-continued
[2-82] 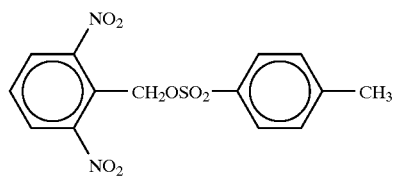
[2-83] 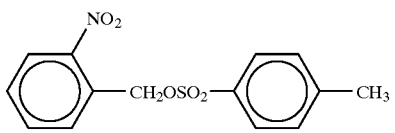
[2-84] 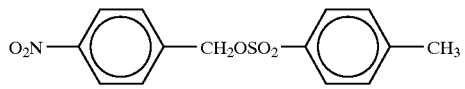
[2-85] 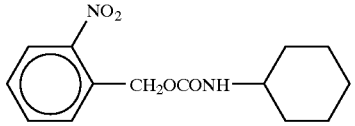
[2-86] 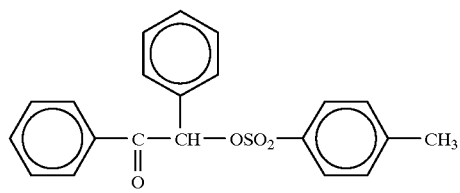
[2-87] 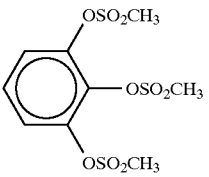
[2-88] 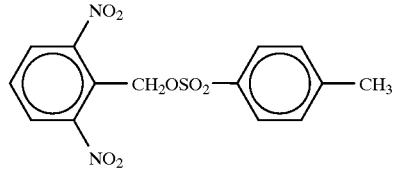
[2-89] 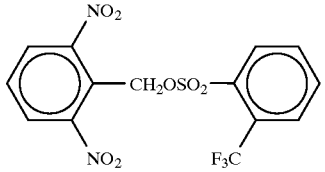
[2-90] 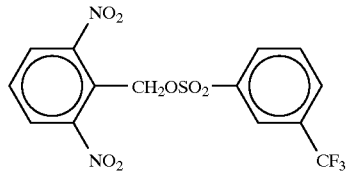
[2-91] 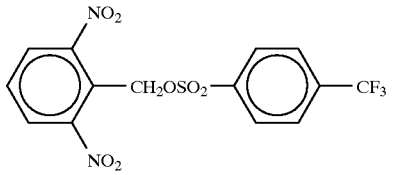
[2-92] 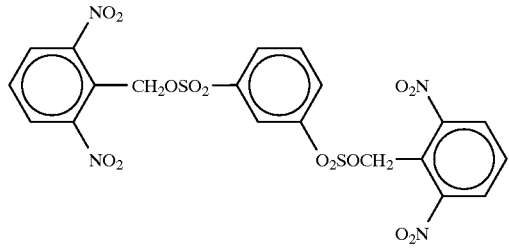
[2-93] 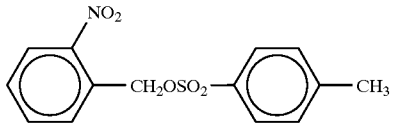
[2-94] 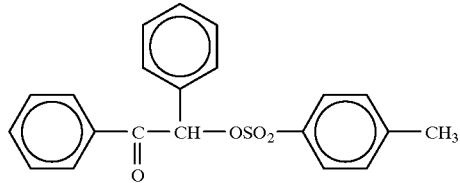
[2-95] 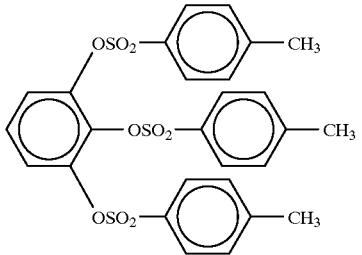

-continued
[2-96]
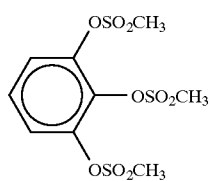
[2-97]
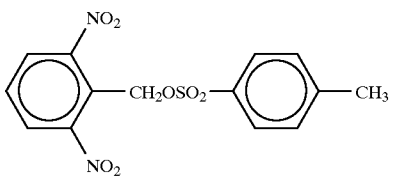
[2-98]
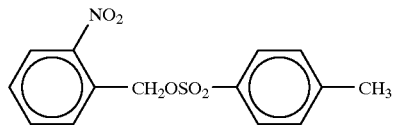
[2-99]
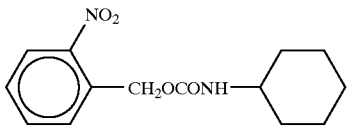
[2-100]
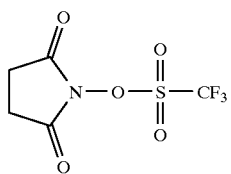
[2-101]
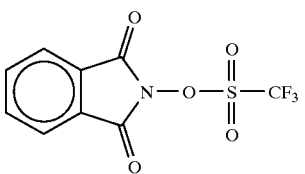
[2-102]
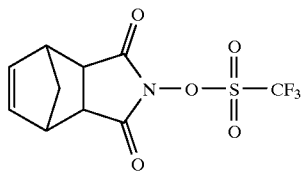
[2-103]
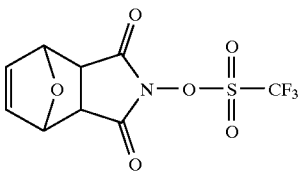
[2-104]
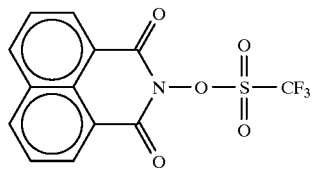
[2-105]
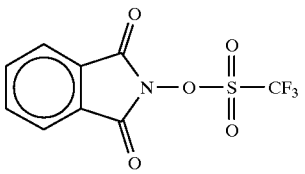
[2-106]
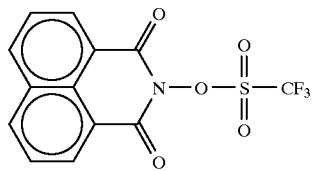
[2-107]
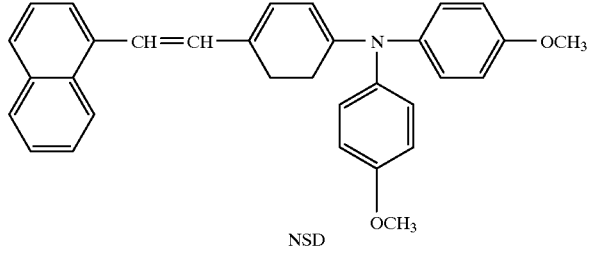
NSD
[2-108]
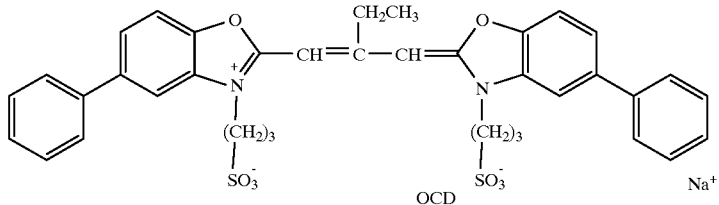
OCD -continued
[2-109]
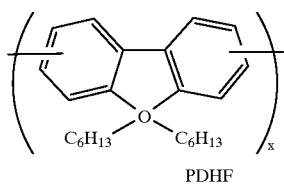
PDHF
[2-110]
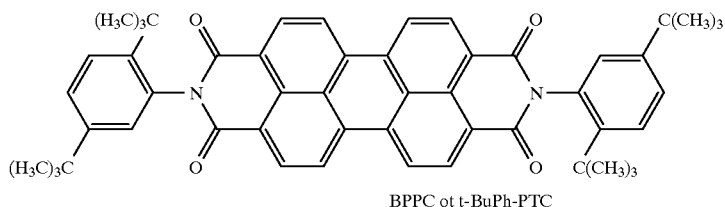
BPPC ot t-BuPh-PTC
[2-111]
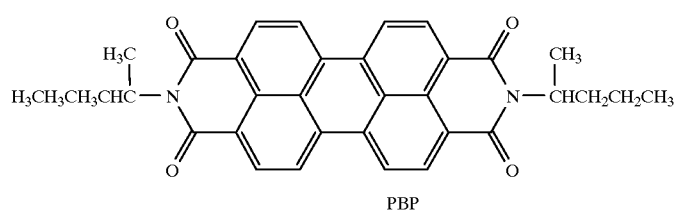
PBP
[2-112]
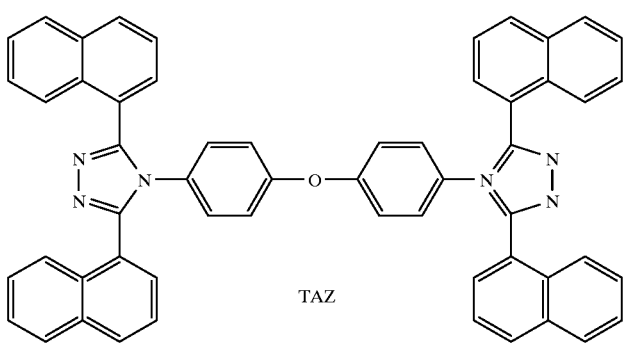
TAZ
[2-113]
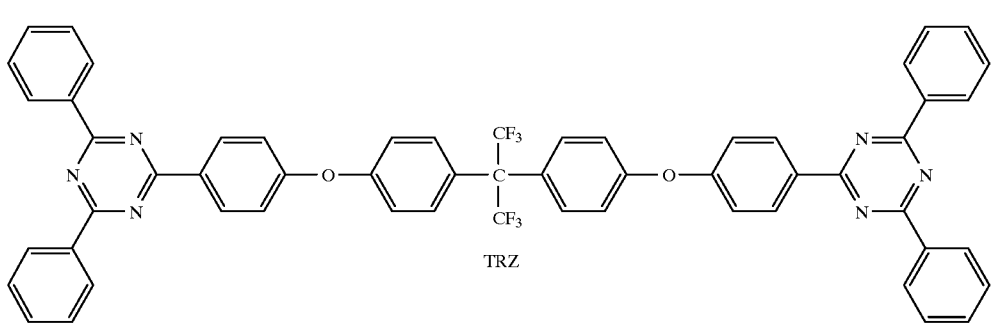
TRZ
[2-114]
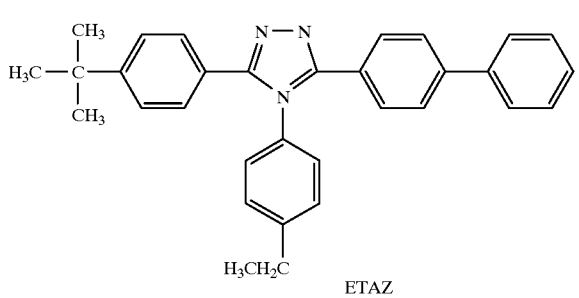
ETAZ -continued
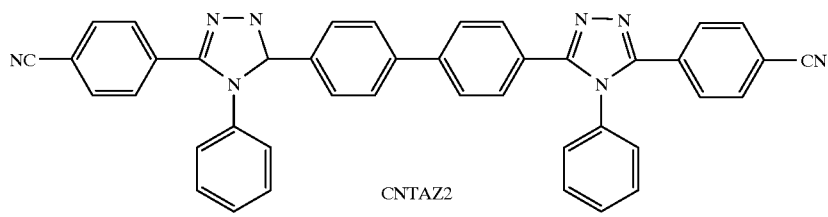
CNTAZ2 [2-115]
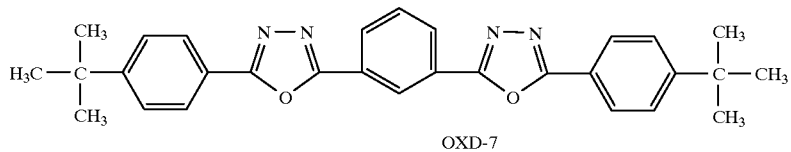
OXD-7 [2-116]
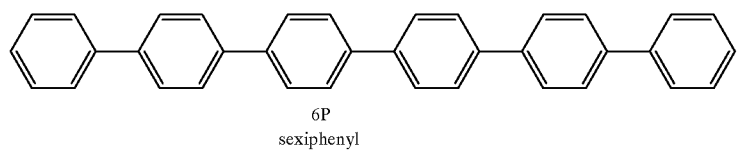
6P
sexiphenyl [2-117]
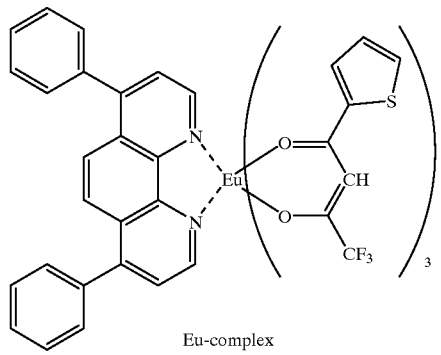
Eu-complex [2-118]
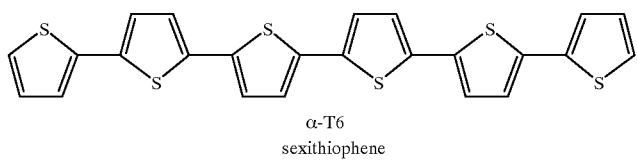
α-T6
sexithiophene [2-119]
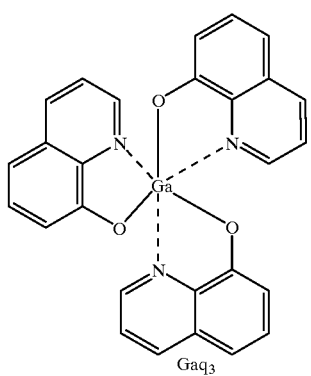
Gaq$_3$ [2-120]
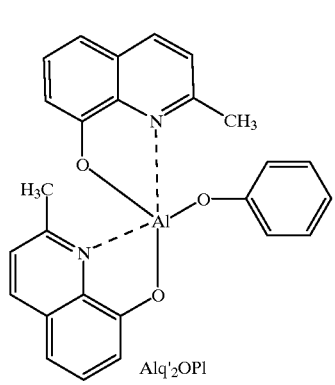
Alq'$_2$OPl [2-121]

[2-122]
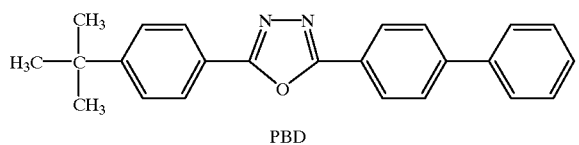
PBD
[2-123]
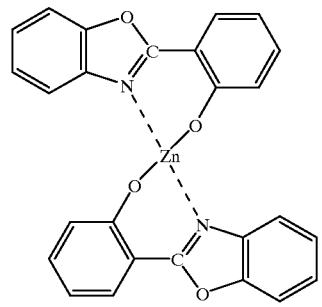
Zn(oxz)₂
[2-124]
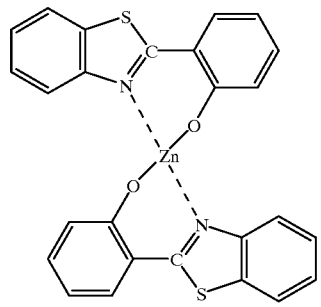
Zn(BTZ)₂
[2-125]
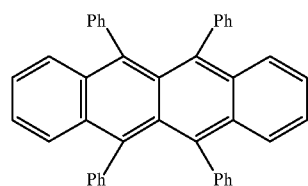
[2-126]
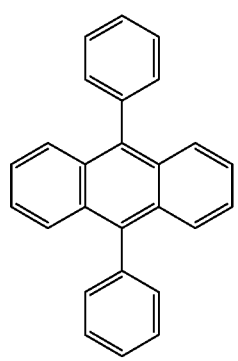
[2-127]
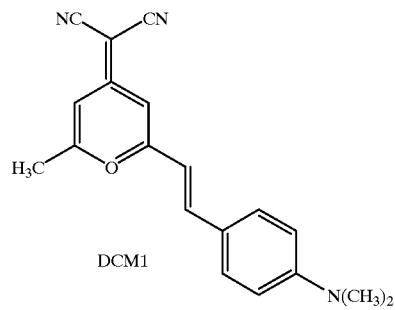
DCM1
[2-128]
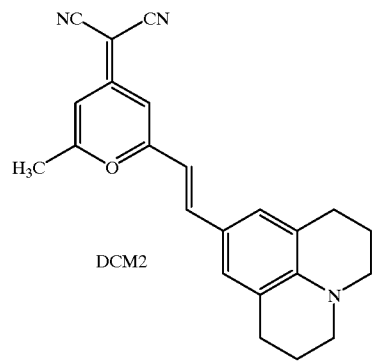
DCM2
[2-129]
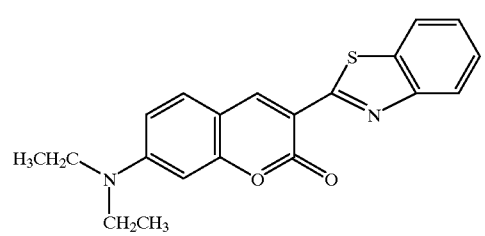
[2-130]
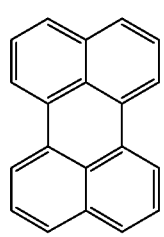

[2-131]
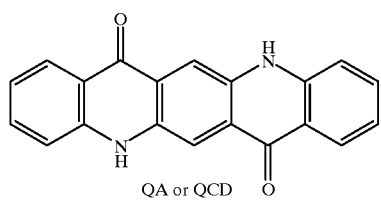
QA or QCD
[2-132]
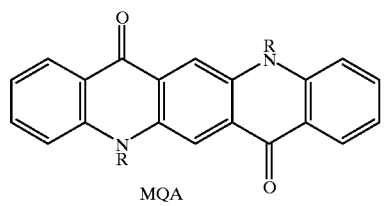
MQA
[2-133]
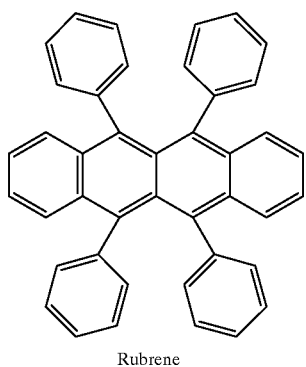
Rubrene
[2-134]
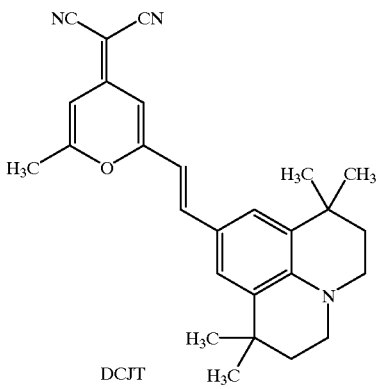
DCJT
[2-135]
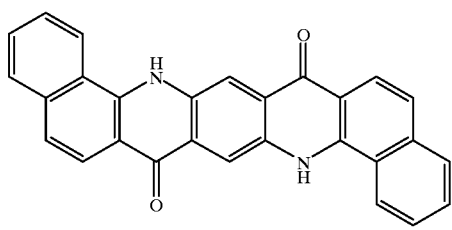
[2-136]
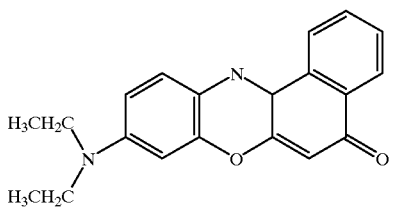
[2-137]
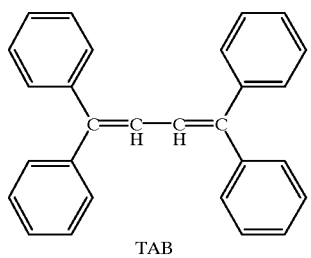
TAB
[2-138]
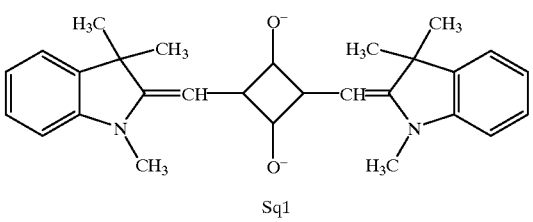
Sq1
[2-139]
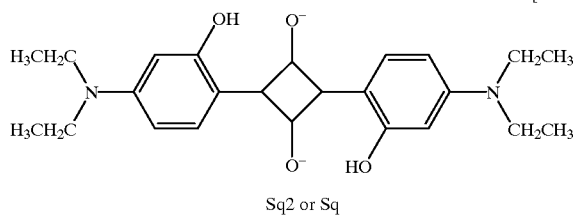
Sq2 or Sq
[2-140]
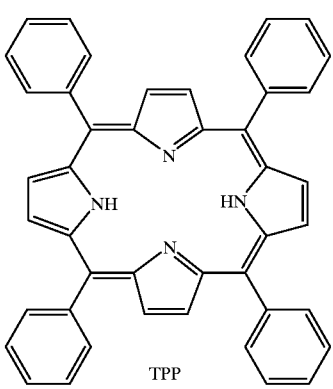
TPP -continued
[2-141]
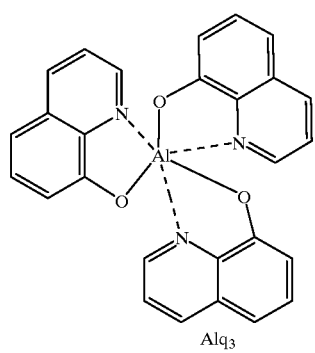
Alq3
[2-142]
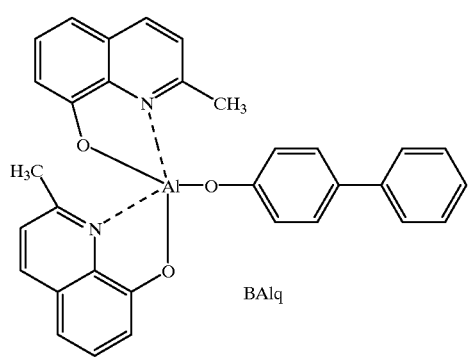
BAlq
[2-143]
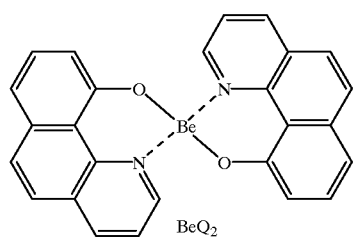
BeQ2
[2-144]
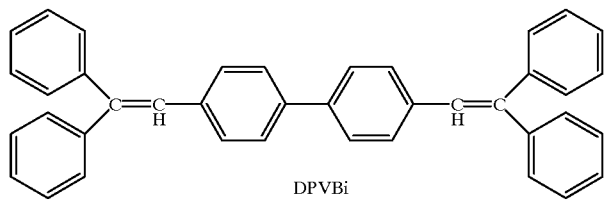
DPVBi
[2-145]
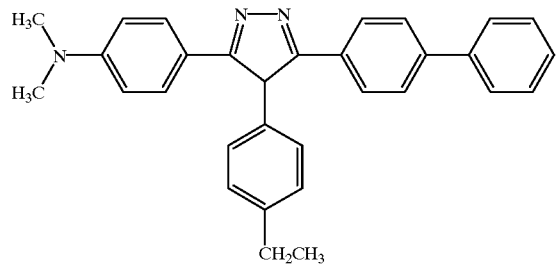
DA-TAZ
[2-146]
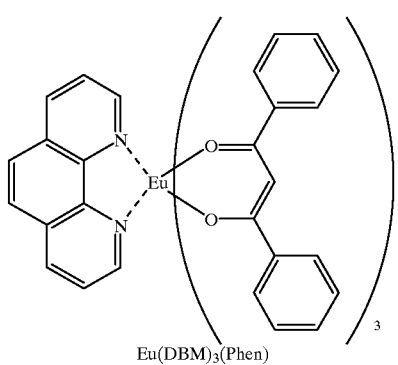
Eu(DBM)3(Phen)
[2-147]
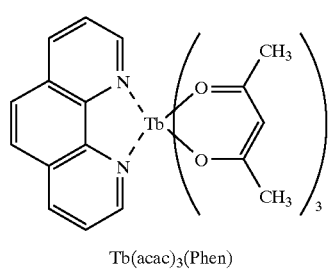
Tb(acac)3(Phen)
[2.-148]
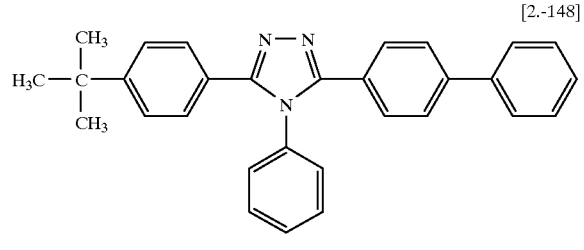
TAZ -continued
[2-149]
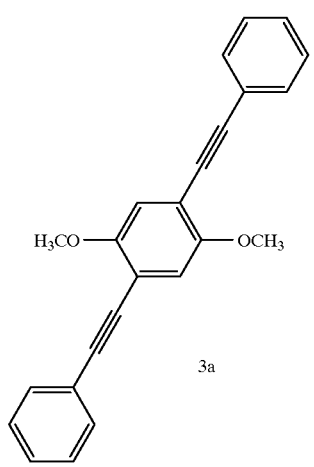
3a
[2-150]
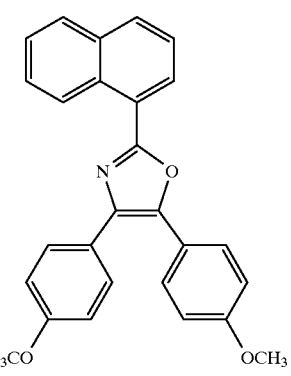
NAPOXA or 3b
[2-151]
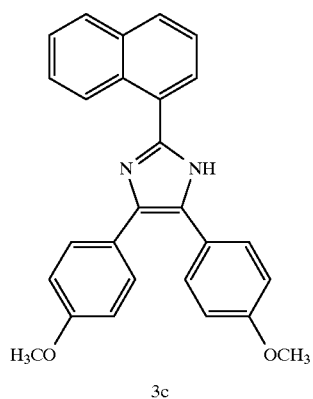
3c
[2-152]
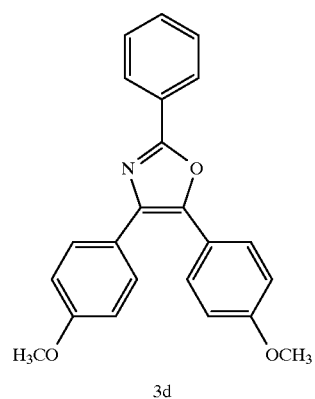
3d
[2-153]
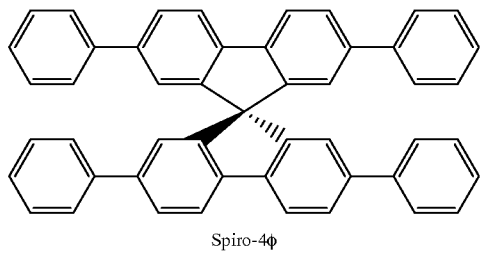
Spiro-4φ
[2-154]
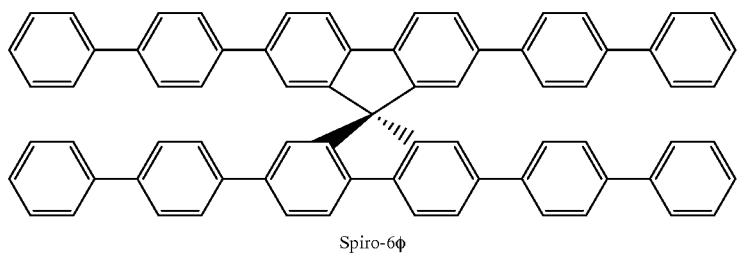
Spiro-6φ

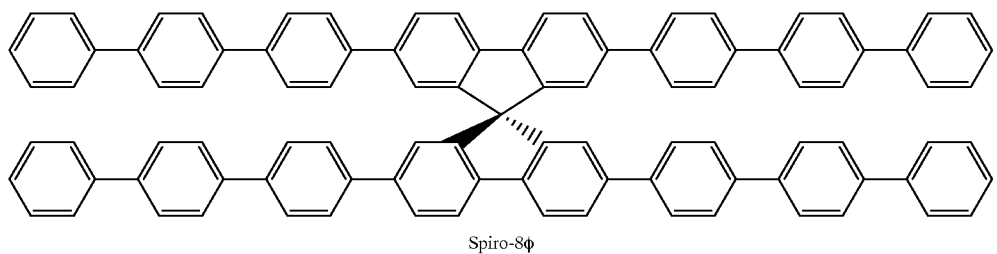
Spiro-8φ
[2-155]
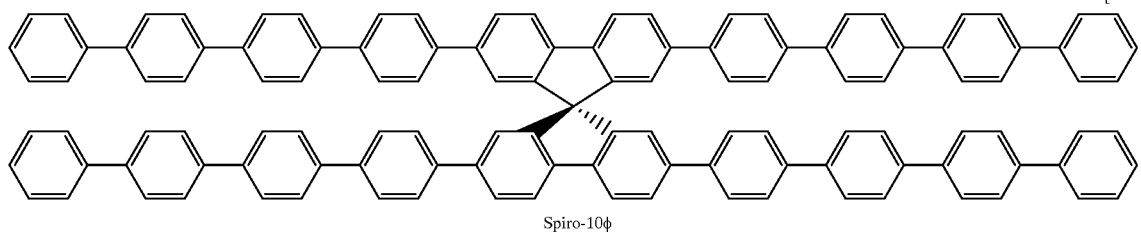
Spiro-10φ
[2-156]
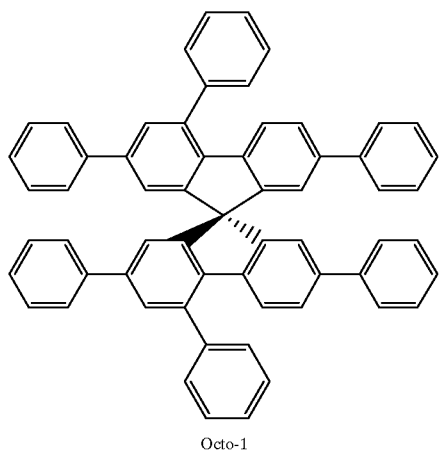
Octo-1
[2-157]
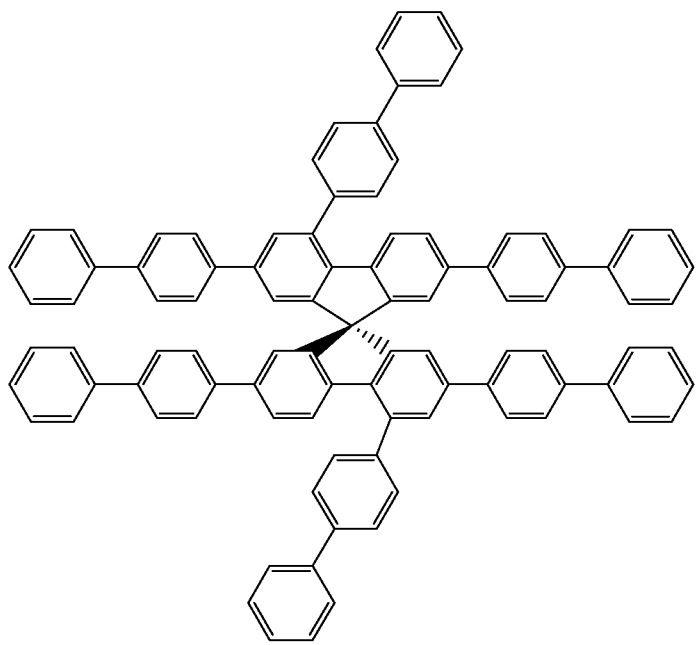
[2-158]

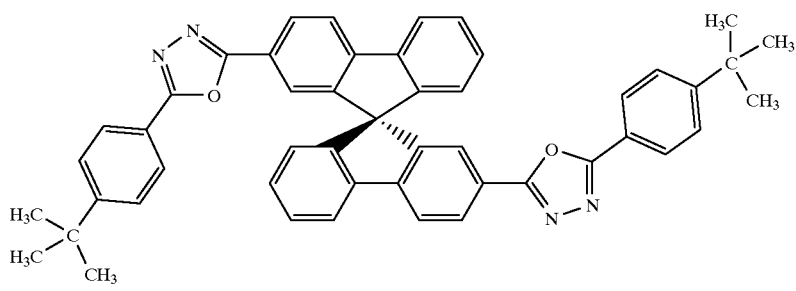
Spiro-PBD [2-159]
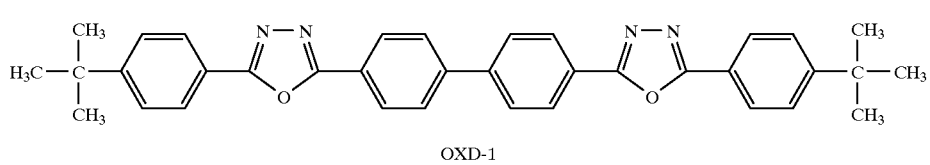
OXD-1 [2-160]
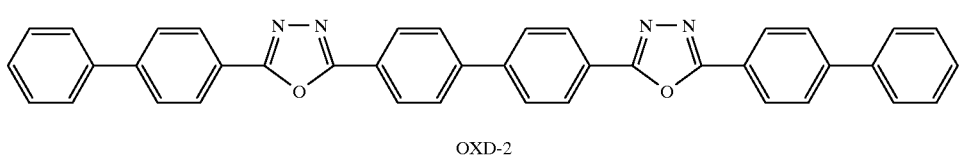
OXD-2 [2-161]
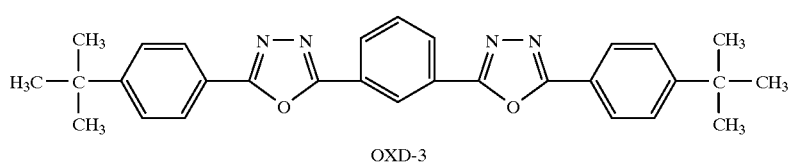
OXD-3 [2-162]
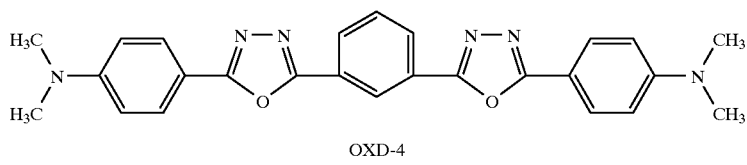
OXD-4 [2-163]
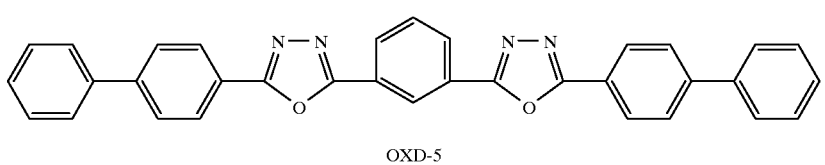
OXD-5 [2-164]
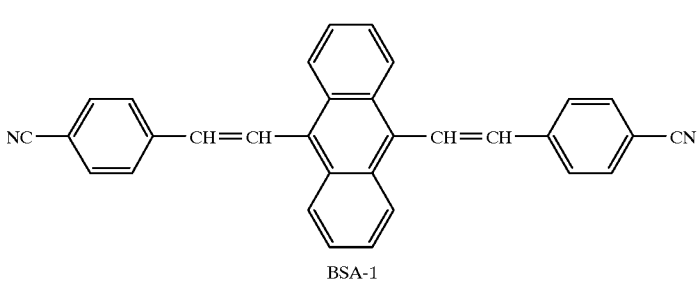
BSA-1 [2-165]

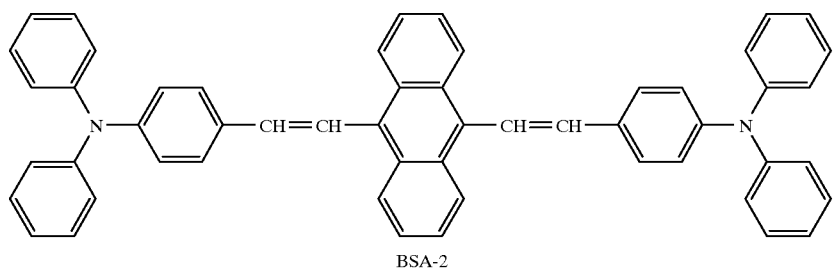
BSA-2 [2-166]
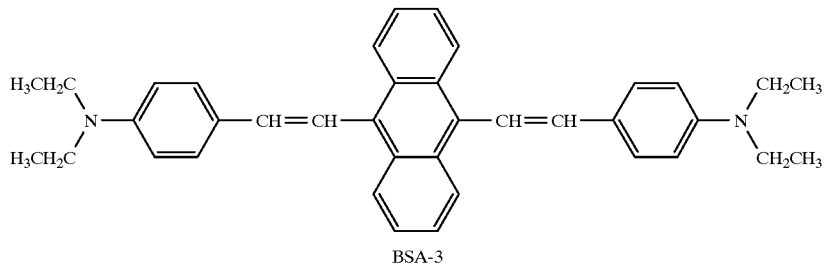
BSA-3 [2-167]
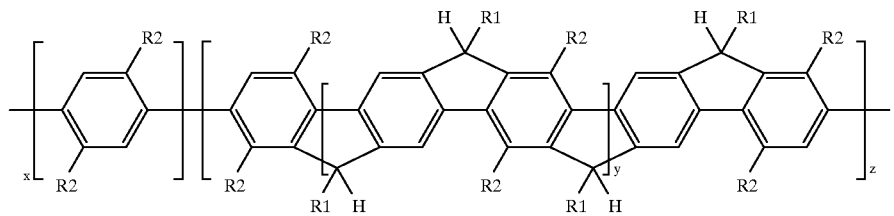
R1 = 1, 4 — $C_6H_{14}$ – $C_{10}H_{21}$
R2 = $C_6H_{13}$
[2-168]
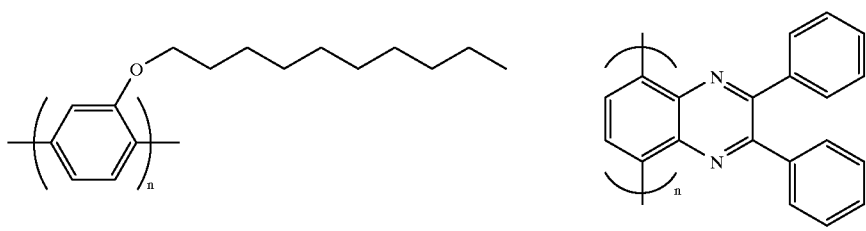
[2-169] [2-170]
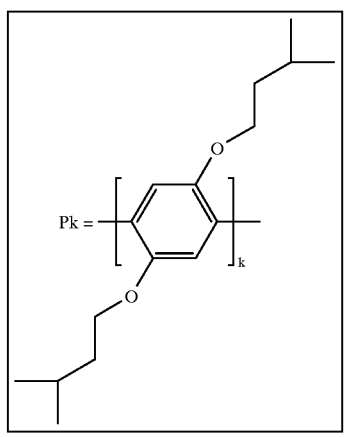
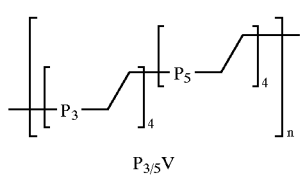
$P_{3/5}V$
[2-171]

[2-172]
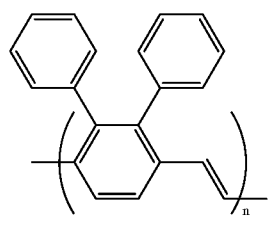
[2-173]
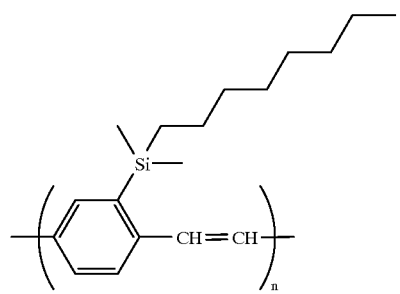
[2-174]
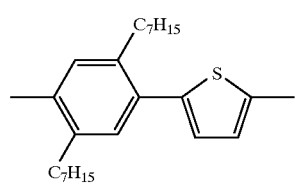
[2-175]
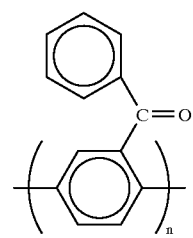
[2-176]
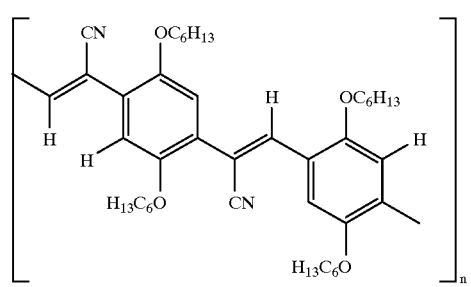
[2-177]
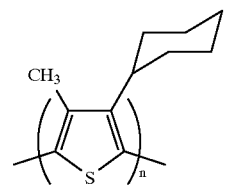
IV, PCHMT
[2-178]
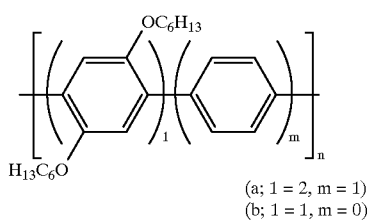
(a; l = 2, m = 1)
(b; l = 1, m = 0)
[2-179]
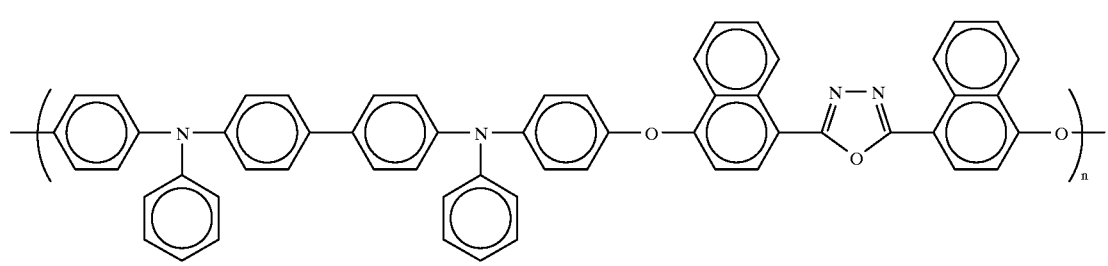

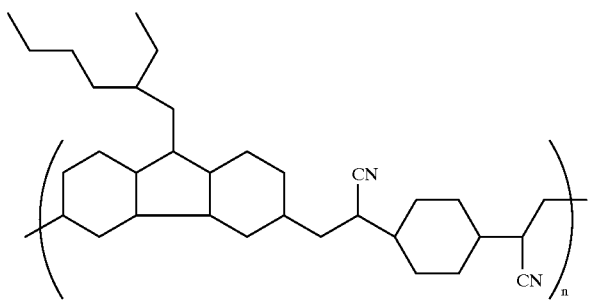

[2-180]

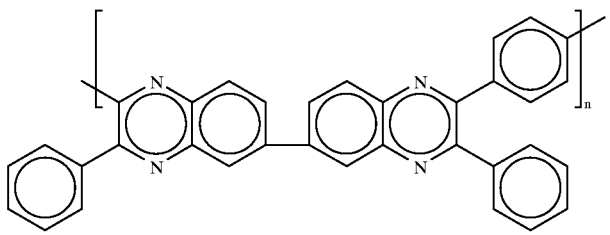

[2-181]

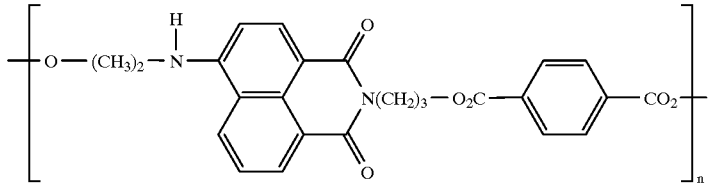

[2-182]

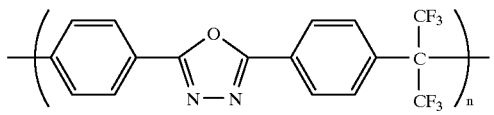

[2-183]

It is also possible to add as required a surfactant for obtaining a coating film having a uniform thickness over the entire wafer surface, a dye for preventing the light for the light exposure from being reflected into the resist film, or a crosslinking agent for suppressing dissolution of the underlying film in the solvent of the resist film.

Where a crosslinking agent is added, it is desirable for hydrogen to be bonded to silicon included in the backbone chain of the organisilicon compound. An organic material having a multiple bond can be used as the crosslinking agent. The organic material having a multiple bond includes a compound having a double bond or a triple bond, i.e., a compound having a vinyl group, an acrylic group, an allyl group, an imide group, or an acetylenyl group. The organic material having a multiple bond can be used in the form of any of monomer, oligomer and polymer.

An addition reaction is brought about between the organic material having a multiple bond and the Si—H bond of the organisilicon compound so as to crosslink the organisilicon compound. The organic material having a multiple bond may be in a self-polymerized form. The specific compounds represented by chemical formulas 3-1 to 3-88 given below can be used as an organic material having a multiple bond:

[3-1]

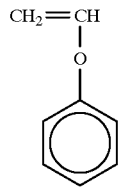

-continued
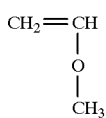
[3-2]
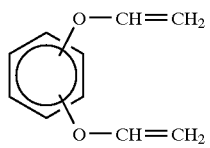
[3-3]
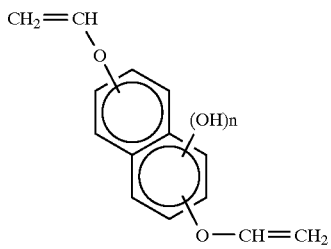
[3-4]
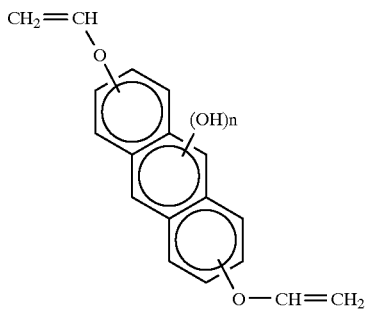
[3-5]
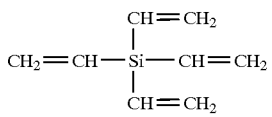
[3-6]
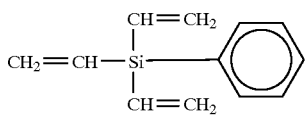
[3-7]
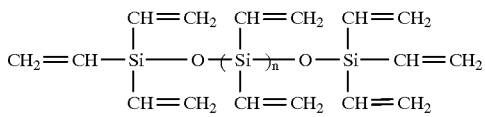
[3-8]
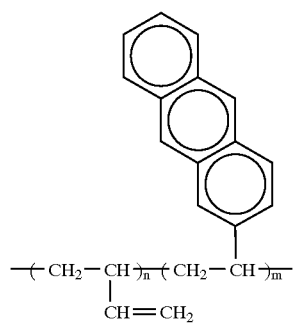
[3-9]

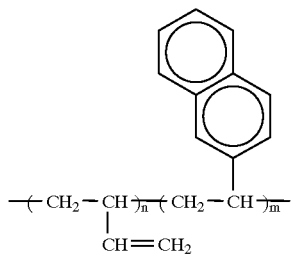 [3-10]
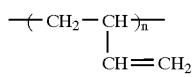 [3-11]
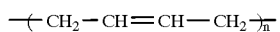 [3-12]
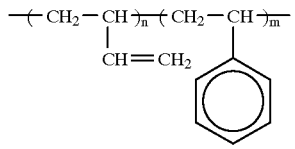 [3-13]
$CH_2 = CHCOOCH_2CH(CH_3)_2$ [3-14]
$CH_2 = CHCOOC(CH_3)_3$ [3-15]
$CH_2 = CHCOOC_{12}H_{25}$ [3-16]
$CH_2 = CHCOOC_nH_{2n+1}$ (n = 12, 13) [3-17]
$CH_2 = CHCOOC_{16}H_{33}$ [3-18]
$CH_2 = CHCOOC_{18}H_{37}$ [3-19]
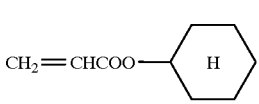 [3-20]
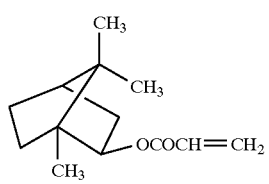 [3-21]
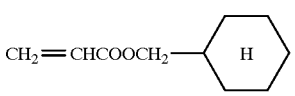 [3-22]
$CH_2 = CHCOOCH_2CH_2OCH_3$ [3-23]
$CH_2 = CHCOOCH_2CH_2CHCH_3$
$\qquad\qquad\qquad\qquad |$
$\qquad\qquad\qquad\quad OCH_3$ [3-24]
$CH_2 = CHCOO(CH_2CH_2O)_2CH_2CH_3$ [3-25]

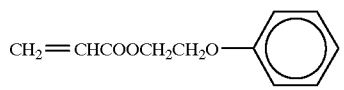
[3-26]
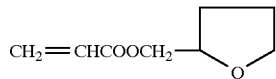
[3-27]
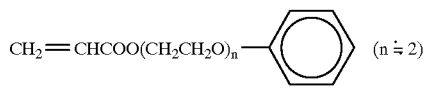
[3-28]
[3-29]
[3-30]
[3-31]
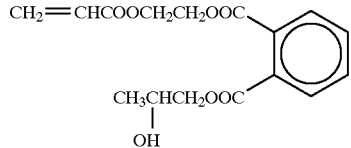
[3-32]
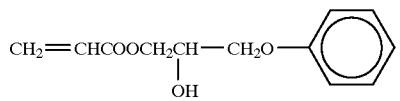
[3-33]
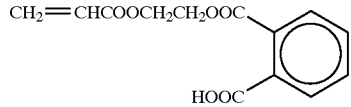
[3-34]
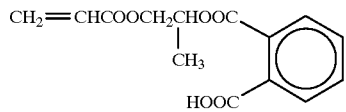
[3-35]
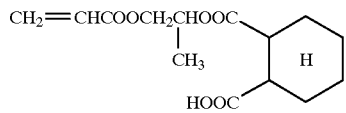
[3-36]
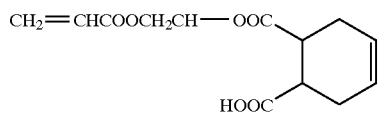
[3-37]
[3-38]
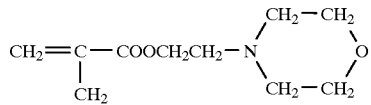
[3-39]

 [3-40]
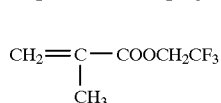 [3-41]
 [3-42]
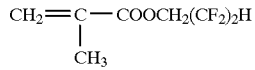 [3-43]
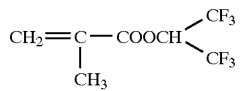 [3-44]
 [3-45]
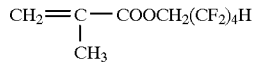 [3-46]
 [3-47]
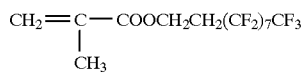 [3-48]
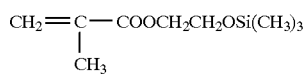 [3-49]
 [3-50]
 [3-51]
 [3-52]
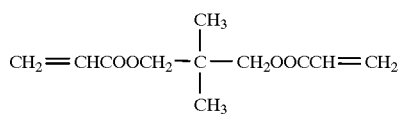 [3-53]
 [3-54]
 [3-55]
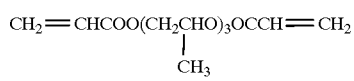 [3-56]
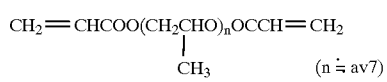 [3-57]
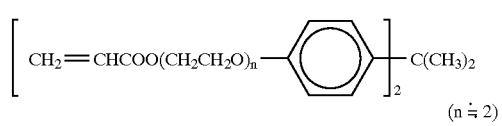 [3-58]

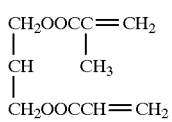 [3-59]
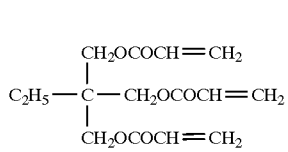 [3-60]
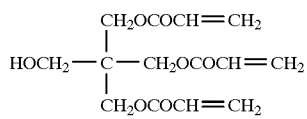 [3-61]
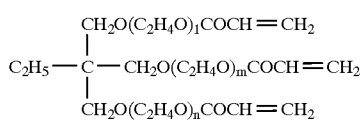 [3-62]
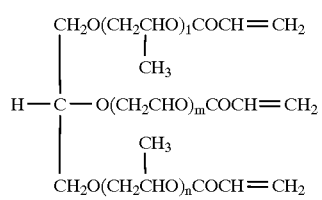 [3-63]
$(CH_2=CHCOOCH_2CH_2O)_3PO$ [3-64]
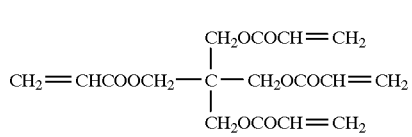 [3-65]
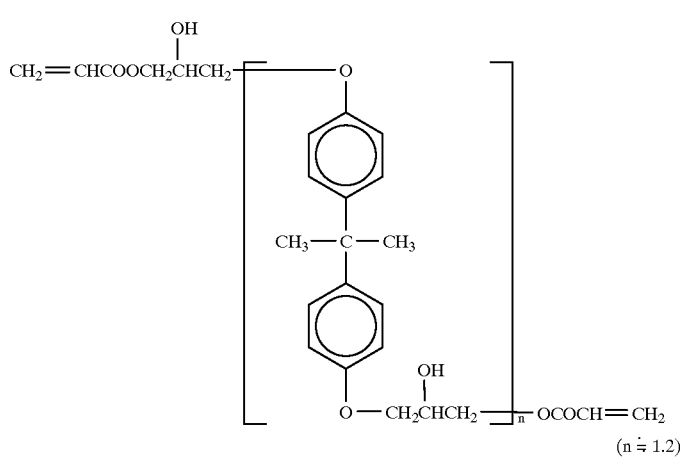 [3-66]
$CH_2=CHCOOCH_2CH_2CH_2CH_2OH$ [3-67]
$CH_2=CHCOO(CH_2CH_2O)_3CH_3$ [3-68]

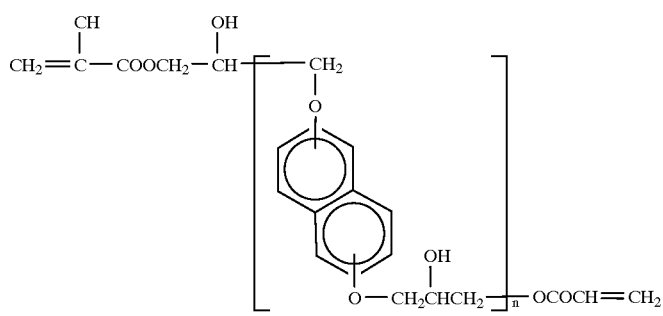
[3-69]
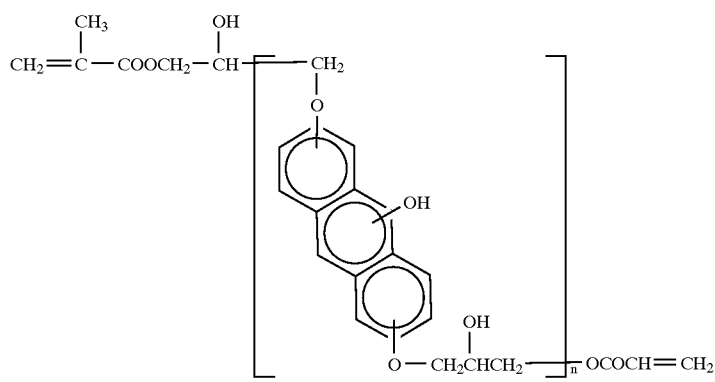
[3-70]
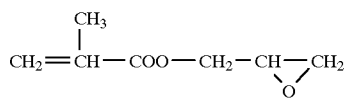
[3-71]
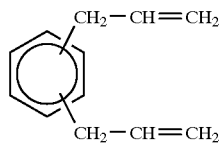
[3-72]
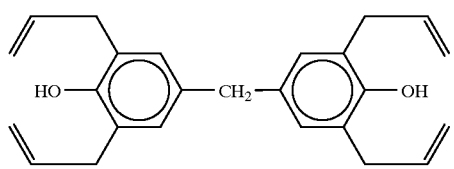
[3-73]
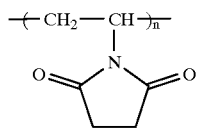
[3-74]
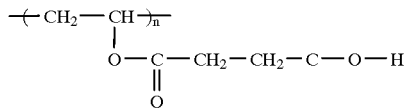
[3-75]

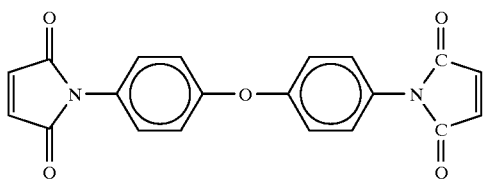
[3-76]
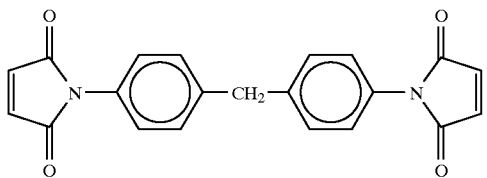
[3-77]
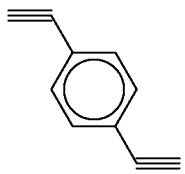
[3-78]
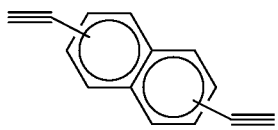
[3-79]
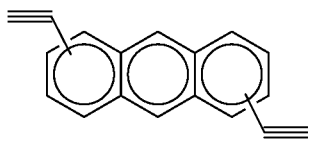
[3-80]
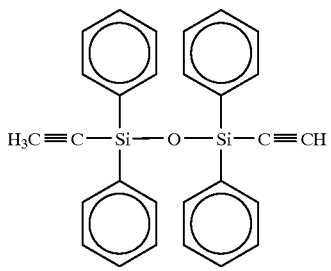
[3-81]
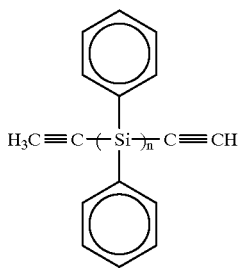
[3-82]

-continued

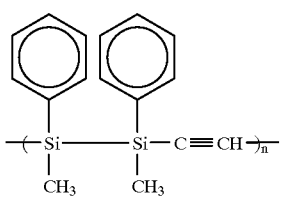
[3-83]

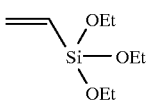
[3-84]

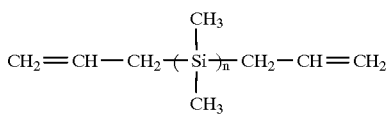
[3-85]

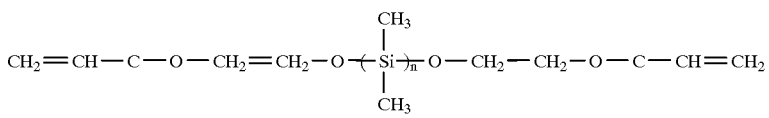
[3-86]

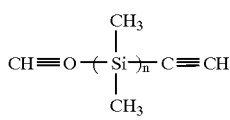
[3-87]

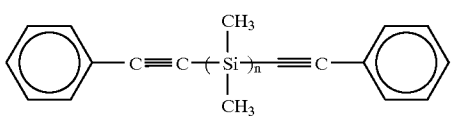
[3-88]

Where an organic compound having a multiple bond is mixed with the organisilicon compound, it is possible to add a radical generator or an acid generator as a catalyst. These radical generator or acid generator serves to assist the addition reaction between the organic material having a multiple bond and the Si—H bond of the organisilicon compound or to assist the self-polymerization of the organic material having a multiple bond.

The radical generator used in the present invention includes, for example, azo compounds (e.g., azobisisobutyronitrile), peroxides, alkyl aryl ketones, silyl peroxides and organic halogen compounds. Upon light irradiation or heating, the O—O bond or C—C bond within the molecule of the radical generator is decomposed so as to generate a radical. Specific compounds of the radical generator includes compounds 4-1 to 4-11 and compounds represented by chemical formulas 4-12 to 4-24 given below:

| | |
|---|---|
| benzoyl peroxide | [4-1] |
| di-t-butyl peroxide | [4-2] |
| benzoin | [4-3] |
| benzoin alkyl ether | [4-4] |
| benzoin alkyl aryl thioether | [4-5] |
| benzoyl allyl ether | [4-6] |
| benzyl alkyl aryl thioether | [4-7] |
| benzyl aralkyl ethanol | [4-8] |
| phenyl glyoxal alkyl acetal | [4-9] |
| benzoyl oxime | [4-10] |
| triphenyl-t-butyl silyl peroxide | [4-11] |

-continued

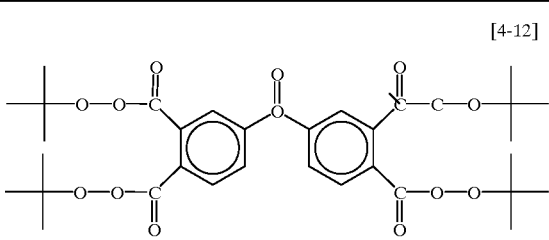
[4-12]

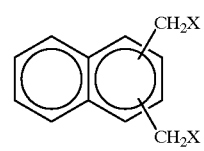
[4-13]

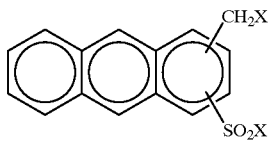
[4-14]

-continued

[4-15] 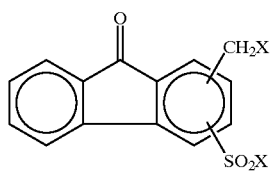

[4-16] 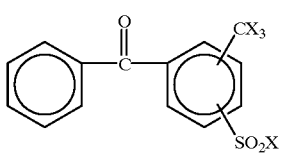

[4-17] 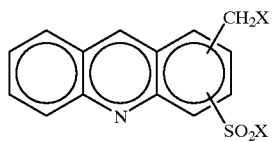

[4-18] 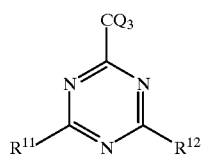

[4-19] 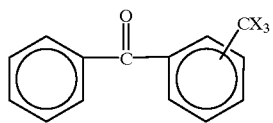

[4-20] 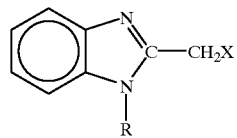

[4-21] 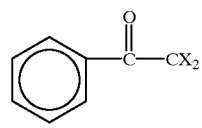

[4-22] 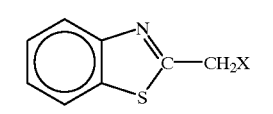

[4-23] 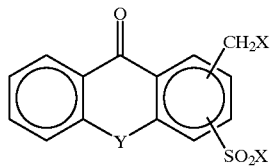

[4-24] 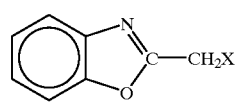

(Y=O, $CH_2$, CHX, S, C=O; X=Cl, Br, I)

Organic halogen compounds are included in the radical generators used in the present invention. It is desirable to use as the organic halogen compound trihalomethyl-s-triazine represented by general formula [4-18] (see, for example, U.S. Pat. No. 3,779,778). In the general formula [4-18], Q represents bromine or chlorine, $R^{11}$ represents —$CQ_3$, —$NN_2$, —$NHR^{13}$, —$OR^{13}$ or substituted or unsubstituted phenyl, $R^{12}$ represents —$CQ_3$, —$NN_2$, —$NHR^{13}$, —$N(R^{13})_2$, —$OR^{13}$, —$(CH=CH)_n$—W or substituted or unsubstituted phenyl group, (where $R^{13}$ denotes phenyl, naphthyl or a lower alkyl having 6 or less carbon atoms, n is an integer of 1 to 3, W is aromatic ring, heterocyclic ring or a group represented by the general formula given below. In some cases, these organic halogen compounds permit crosslinking a polysilane by light or heat even in the absence of a compound having a multiple bond.

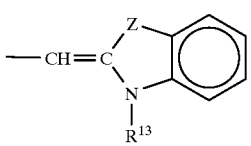

In the general formula given above, Z represents oxygen or sulfur, and $R^{13}$ denotes a lower alkyl or phenyl group.

Among the trihalomethyl-s-triazine represented by general formula [4-18], it is particularly desirable to use vinyl trihalomethyl-s-triazine, i.e., the compound of general formula [4-18] in which $R^{12}$ is —$(CH=CH)_n$—W (see, for example, U.S. Pat. No. 3,987,037). Vinyl trihalomethyl-s-triazine is a photodegradable s-triazine having a trihalomethyl group and an ethylenically unsaturated bond conjugated with a triazine ring.

It is possible for a substituent such as chlorine, bromine, phenyl group, lower alkyl group having 6 or less carbon atoms, nitro group, phenoxy group, alkoxy group, acetoxy group, acetyl group, amino group or alkylamino group to be substituted in the aromatic ring or heterocyclic ring represented by W.

The specific compounds of trihalomethyl-s-triazine represented by general formula [4-18] are denoted by chemical formulas [4-25] to [4-34], and other compounds of the radical generator are denoted by chemical formulas [4-35]to [4-39]. These halogen compounds permit in some cases crosslinking a polysilane by light or heat even in the absence of a compound having a multiple bond.

[4-25] 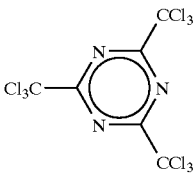

[4-26] 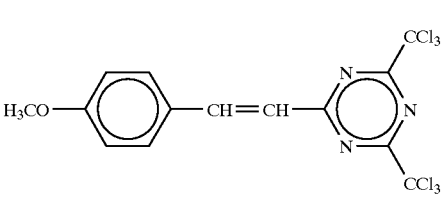

[4-27] 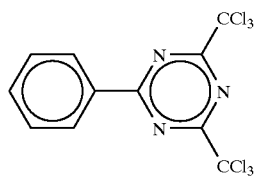

[4-28] 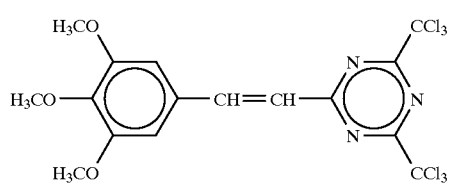

[4-29] 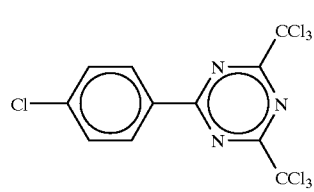

[4-30] 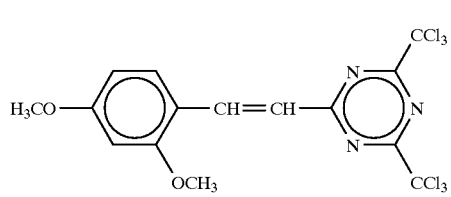

[4-31] 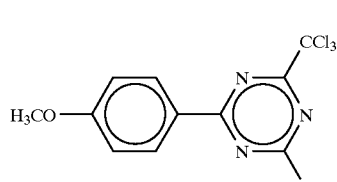

[4-32] 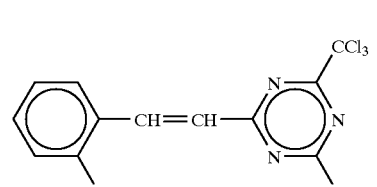

[4-33] 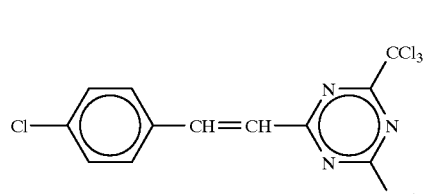

[4-34] 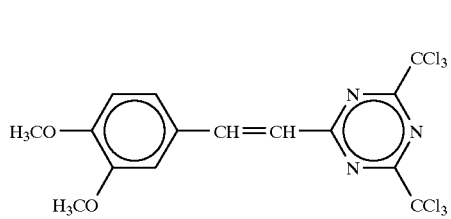

[4-35] 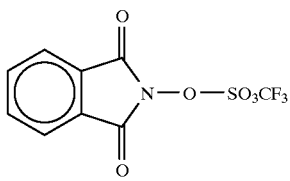

[4-36] 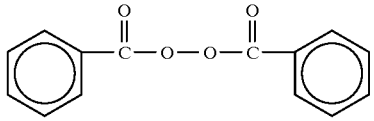

[4-37] 

[4-38] 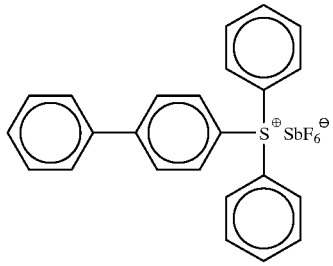

[4-39] 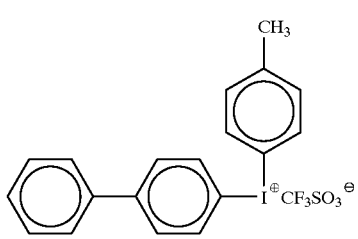

The acid generator used in the present invention includes, for example, onium salt, halogen-containing compound, o-quinone diazide compound, sulfone compound, and nitrobenzyl compound. Particularly, it is desirable to use onium salt and o-quinone diazide compound.

The onium salt includes, for example, iodonium salt, sulfonium salt, phosphonium salt, diazonium salt and ammonium salt. The compounds represented by general formulas [4-40] to [4-42] are used preferably.

The halogen-containing compound used in the present invention includes, for example, a haloalkyl group-containing hydrocarbon and a haloalkyl group-containing heterocyclic compound. Particularly, it is desirable to use compounds having the general formulas [4-43] and [4-44].

The o-quinone diazide compound used in the present invention includes, for example, diazo benzoquinone compound and diazo naphthoquinone compound. Particularly, it is desirable to use the compounds having the chemical formulas [4-45] to [4-48].

The sulfone compound used in the present invention includes, for example, β-ketosulfone, and β-sulfonyl sulfone. Particularly, it is desirable to use the compound represented by the general formula [4-49].

The nitrobenzyl compound used in the present invention includes, for example, a nitrobenzyl sulfonate compound, and dinitrobenzyl sulfonate compound. Particularly, it is desirable to use the compound represented by the general formula [4-50].

Further, the sulfonic acid compound used in the present invention includes, for example, alkyl sulfonic acid ester, haloalkyl sulfonic acid ester, aryl sulfonic acid ester, and iminosulfonate. Particularly, it is desirable to use the compounds represented by the general formulas [4-51] to [4-53].

[4-40]

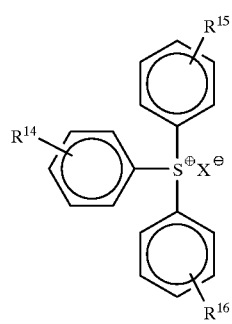

[4-41]

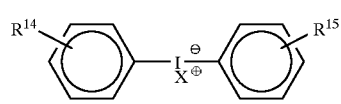

[4-42]

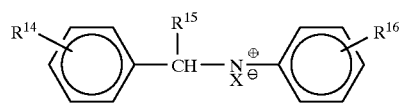

where $R^{14}$ to $R^{16}$, which may be the same or different, represent hydrogen atom, amino group, nitro group, cyano group, substituted or unsubstituted alkyl group or alkoxy group, and X represents $SbF_6$, $PF_6$, $BF_4$, $CF_3CO_2$, $ClO_4$, $CF_3SO_3$ and

,

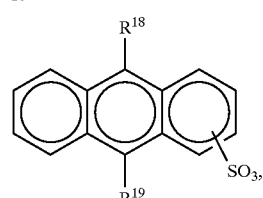

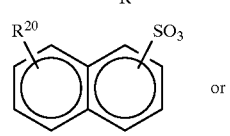

or

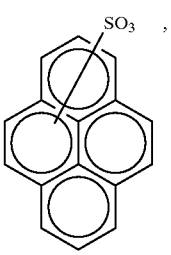, where $R^{17}$ represents hydrogen atom, amino group, anilino group, substituted or unsubstituted alkyl group or alkoxy group, $R^{18}$ and $R^{19}$, which may be same or different, represent substituted or unsubstituted alkoxy group, and $R^{20}$ represents hydrogen atom, amino group, anilino group, substituted or unsubstituted alkyl group or alkoxy group.

[4-43]

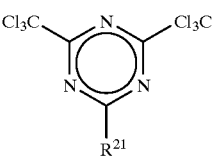

where $R^{21}$ represents trichloromethyl group, phenyl group, methoxy phenyl group, naphthyl group or methoxy naphthyl group.

[4-44]

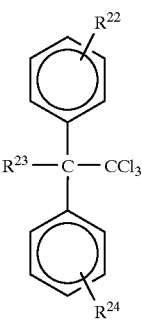

where $R^{22}$ to $R^{24}$, which may be the same or different, represent hydrogen atom, halogen atom, methyl group, methoxy group or hydroxyl group.

[4-45]

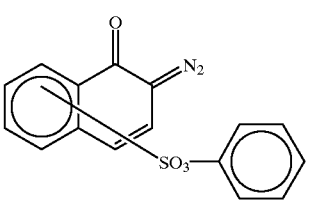

-continued

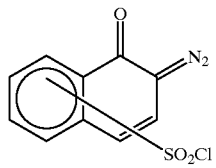
[4-46]

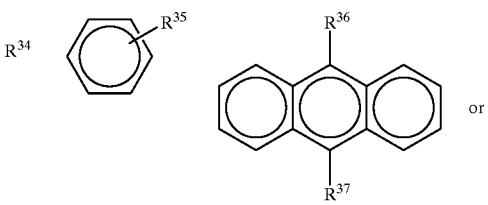
[4-50]

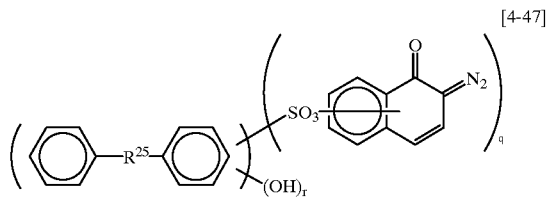
[4-47]

where $R^{25}$ represents —CH$_2$—, —C(CH$_3$)$_2$—, —C(=O)— or —SO$_2$—, q is an integer of 1 to 6, r is an integer of 0 to 5, and the sum of q and r is 1 to 6.

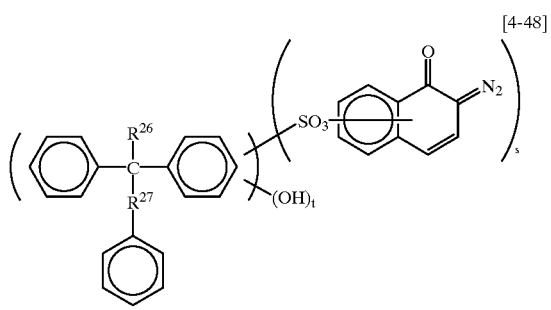
[4-48]

where $R^{26}$ represents —CH$_2$—, —C(CH$_3$)$_2$—, —C(=O)— or —SO$_2$—, s is an integer of 1 to 6, t is an integer of 0 to 5, and the sum of s and t is 1 to 6.

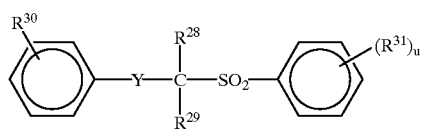
[4-49]

where $R^{28}$ to $R^{31}$, which may be the same or different, represent a substituted or unsubstituted alkyl group or halogen atom, Y represents —C(=O)— or —SO$_2$—, and u is an integer of 0 to 3.

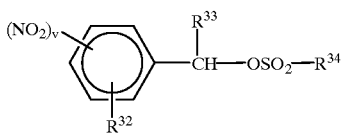
[4-50]

where $R^{32}$ is a substituted or unsubstituted alkyl group, $R^{33}$ is hydrogen atom or methyl group, and $R^{34}$ is:

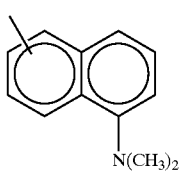

where $R^{35}$ is hydrogen atom or methyl group, $R^{36}$ and $R^{37}$, which may be the same or different, represent a substituted or unsubstituted alkoxy group, and v is an integer of 1 to 3.

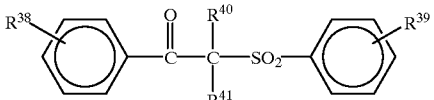
[4-51]

where $R^{38}$ and $R^{39}$, which may be the same or different, represent hydrogen atom or a substituted or unsubstituted alkyl group, and $R^{40}$ and $R^{41}$, which may be the same or different, represent hydrogen atom or a substituted or unsubstituted alkyl group or aryl group.

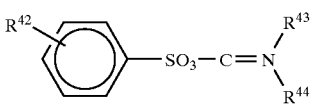
[4-52]

where $R^{42}$ represents hydrogen atom or a substituted or unsubstituted alkyl group, and $R^{43}$ and $R^{44}$, which may be the same or different, represent hydrogen a substituted or unsubstituted alkyl group or aryl group, and $R^{43}$ and $R^{44}$ are bonded to each other to form a ring structure.

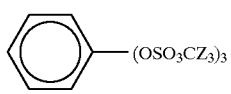
[4-53]

where Z represents fluorine atom or chlorine atom.

In addition to the organic compounds having a multiple bond, which are exemplified above, it is also possible to use in the present invention as a crosslinking agent of the organisilicon compound organic compounds having a hydroxyl group, organic compounds having an epoxy group, organic compounds having an amino group, pyridine oxide, silicon compounds having an alkoxy silyl group, silyl ester group, oxime silyl group, emoxy silyl group, amino silyl group, amide silyl group, aminoxy silyl group, or halogen, organometallic compounds, halogen-containing compounds, etc.

The compounds having a hydroxyl group include, for example, polyhydric alcohol, novolak resin, compounds having a carboxyl group, and silanol. These compounds carry out reaction with the Si—H bond under light or heat so as to crosslink the organisilicon compound. The specific compounds having a hydroxyl group are represented by chemical formulas [5-1] to [5-28].

The compounds having an epoxy group include, for example, resins which are called generally epibis-type epoxy resin or alicyclic epoxy resin. A hydroxyl group may be added to a part of these resins. It is also possible to add the acid generator described previously together with these resins. The specific compounds having an epoxy group are represented by chemical formulas [6-1] to [6-12].

The compounds having an amino group are represented by chemical formulas [7-1] to [7-9].

The pyridine oxide compounds are represented by chemical formulas [8-1] to [8-6].

The silicon compounds having an alkoxy silyl group, a silyl ester group, an oxime silyl group, an enoxy silyl group, amino silyl group, amide silyl group, aminoxy silyl group, or halogen are represented by chemical formulas [9-1] to [9-52]. In these chemical formulas, X represents the substituents noted above. It is possible to use a metallic catalyst such as platinum, an organic tin compound or a base, which are generally used as a condensation catalyst of silicone, together with the compounds represented by chemical formulas noted above.

The organometallic compounds used in the present invention represent metal salts or metal complex compound having an organic group substituted therein. The metals contained in the organometallic compounds include B, Mg, Al, Ca, Ti, V, Mn, Fe, Co, Ni, Cu, Zn, Mo, Rh, Pd, Cd, In and Sn. The specific organometallic compounds used in the present invention are represented by chemical formulas [10-1] to [10-8].

Further, the halogen-containing compounds used in the present invention are represented by chemical formulas [11-1] to [11-9]

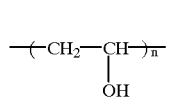
[5-1]

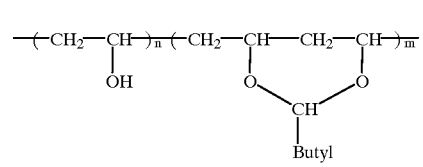
[5-2]

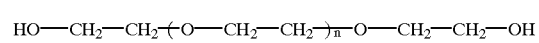
[5-3]

[5-4]

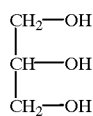
[5-5]

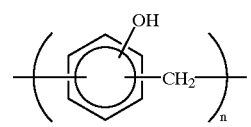
[5-6]

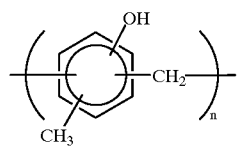
[5-7]

[5-8]

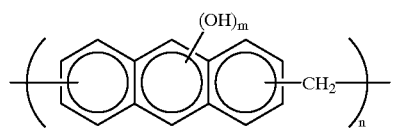
[5-9]

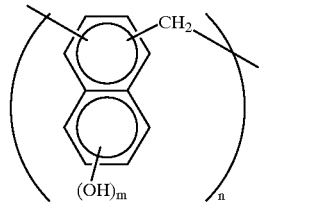
[5-10]

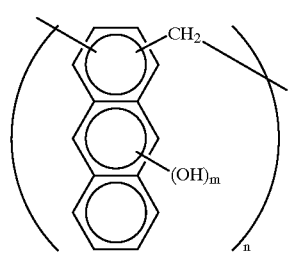
[5-11]

[5-12]

-continued

[5-13] [5-14]

[5-15] [5-16]

[5-17] [5-18]

[5-19] [5-20]

[5-21] [5-22]

[5-23] [5-24]

[5-25] [5-26]

[5-27] [5-28]

[6-1] [6-2]

[6-3]
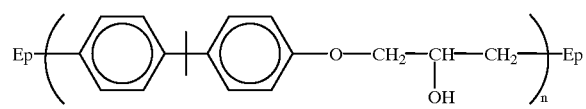
[6-4]
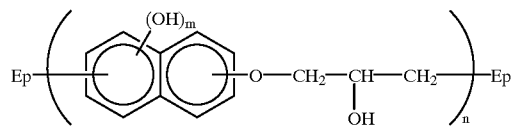
[6-5]
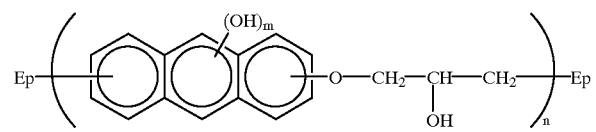
[6-6]
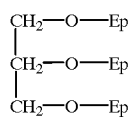
[6-7]
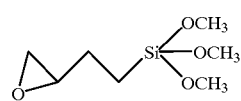
[6-8]
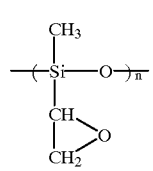
[6-9]
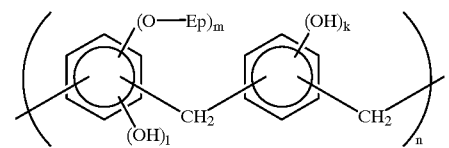
[6-10]
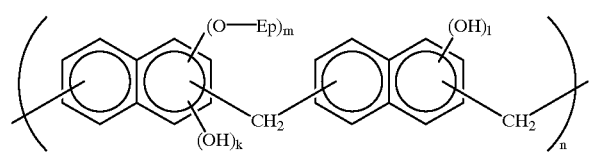
[6-11]
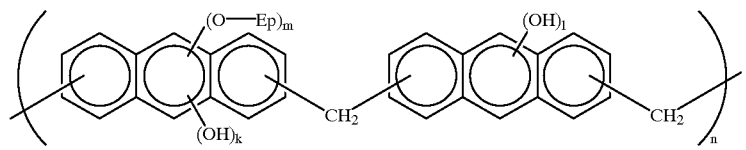
[6-12]
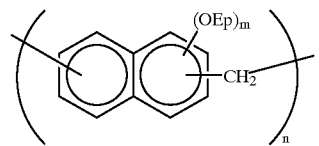
[7-1]
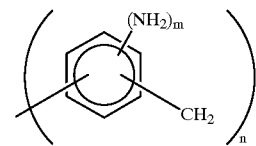
[7-2]
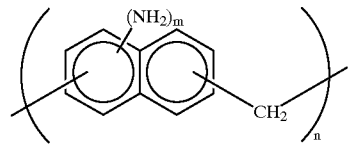
[7-3]
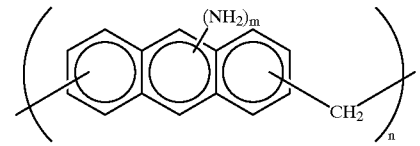

-continued
[7-4]
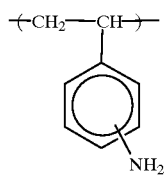
[7-5]
[7-6]
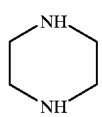
[7-7]
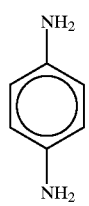
[7-8]
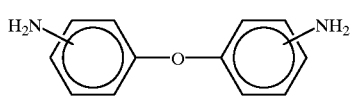
[7-9]
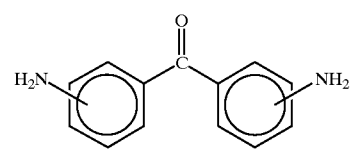
[7-10]
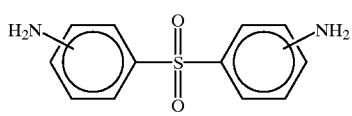
[7-11]
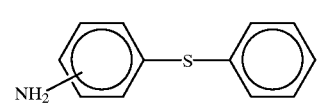
[7-12]
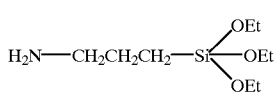
[7-13]
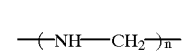
[8-1]
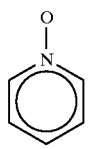
[8-2]
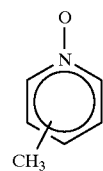
[8-3]
[8-4]
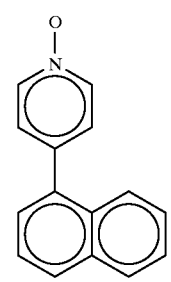

-continued
[8-5] 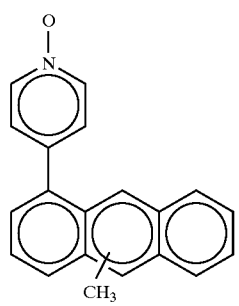
[8-6] 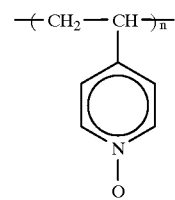
[9-1] 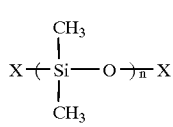
[9-2] 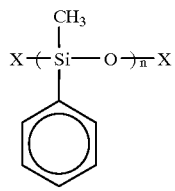
[9-3] 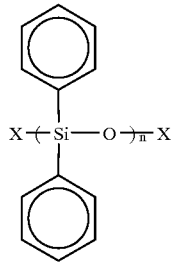
[9-4] 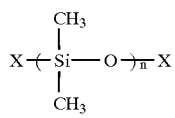
[9-5] 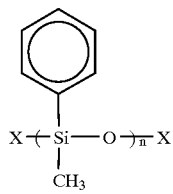
[9-6] 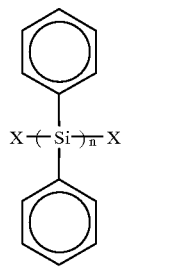
[9-7] 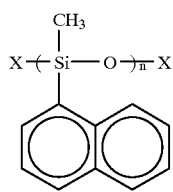
[9-8] 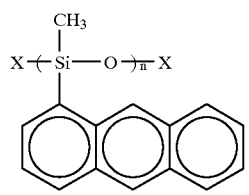
[9-9] 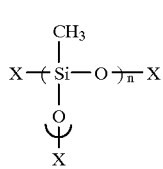
[9-10] 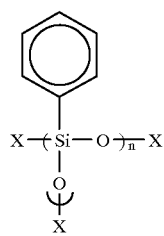

-continued
[9-11]
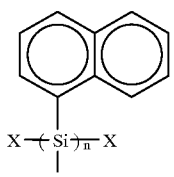
[9-12]
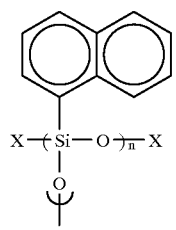
[9-13]
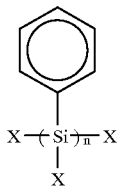
[9-14]
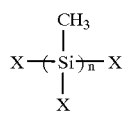
[9-15]
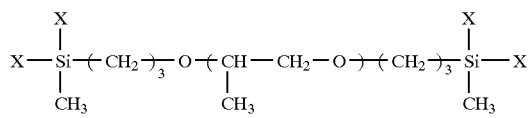
[9-16]
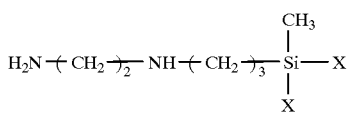
[9-17]
X—(CH$_2$)$_3$—SiX$_3$
[9-18]
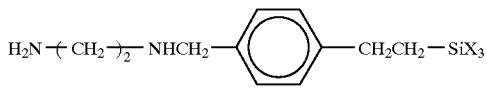
[9-19]
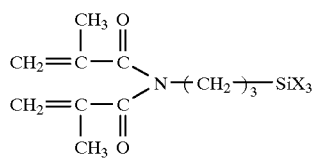
[9-20]
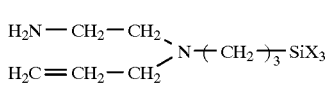
[9-21]
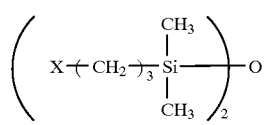
[9-22]
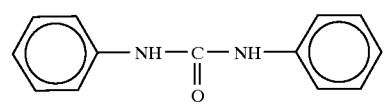
[9-23]
(CH$_3$)$_3$Si—CN
[9-24]
(CH$_3$)$_3$SiH$_3$
[9-25]
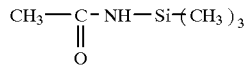
[9-26]
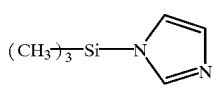
[9-27]
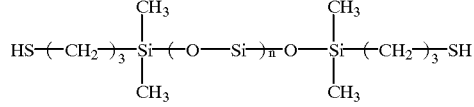
[9-28]
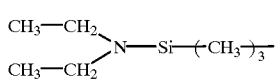
[9-29]
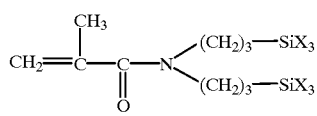

-continued

[9-30]
$\mathrm{-(SiH_2-NH)_n-}$

[9-31]
$\mathrm{CH_2=CHSiX_3}$

[9-32]
$\mathrm{CH_2=CHSi(OX)_3}$

[9-33]
$\mathrm{Cl(CH_2)_3Si(OX)_3}$

[9-34]
$\mathrm{Cl(CH_2)_3\overset{Me}{\underset{|}{Si}}X_2}$

[9-35]
$\mathrm{Cl(CH_2)_3\overset{Me}{\underset{|}{Si}}(OX)_2}$

[9-36]
$\mathrm{Cl(CH_2)_3\overset{Me}{\underset{|}{Si}}(OX)_2}$

[9-37]
$\mathrm{H_2N(CH_2)_3Si(OX)_3}$

[9-38]
$\mathrm{H_2N(CH_2)_2NH(CH_2)_3Si(OX)_3}$

[9-39]
$\mathrm{H_2N(CH_2)_2NH(CH_2)_3\overset{Me}{\underset{|}{Si}}(OX)_2}$

[9-40]
$\mathrm{HS(CH_2)_3Si(OX)_3}$

[9-41]
glycidoxypropyl trialkoxysilane (epoxide–$\mathrm{CH_2\text{-}CHCH_2O(CH_2)_3Si(OX)_3}$)

[9-42]
glycidoxypropyl dialkoxymethylsilane (epoxide–$\mathrm{CH_2\text{-}CHCH_2O(CH_2)_3\overset{Me}{\underset{|}{Si}}(OX)_2}$)

[9-43]
$\mathrm{CH_2=\overset{Me}{\underset{|}{C}}-\underset{\underset{O}{\|}}{C}-O(CH_2)_3Si(OX)_3}$

[9-44]
$\mathrm{CH_2=\overset{Me}{\underset{|}{C}}-\underset{\underset{O}{\|}}{C}-O(CH_2)_3\overset{Me}{\underset{|}{Si}}(OX)_2}$

[9-45]
$\mathrm{Me_3SiNHSiMe_3}$

[9-46]
$\mathrm{[Me_2SiNH]_n\ (n=3\text{-}4)}$

[9-47]
$\mathrm{Me_3SiNHCONHSiMe_3}$

[9-48]
$\mathrm{CH_3CONHSiMe_3}$

[9-49]
$\mathrm{Me_3NSiMe_3}$

[9-50]
$\mathrm{Et_2NSiMe_3}$

[9-51]
$\mathrm{Me_3Si\text{-}imidazole}$

[9-52]
$\mathrm{Ph-NH-\underset{\underset{SiMe_3}{|}}{\overset{\overset{O}{\|}}{C}}-N-Ph}$

[10-1]
$\mathrm{Al(acac)_3}$

[10-2]
$\mathrm{Al(Etaa)_3}$

[10-3]
$\mathrm{Al(SA)_3}$

[10-4]
$\mathrm{Al(-O-\underset{\underset{O}{\|}}{C}(CH_2)_6CH_3)_3}$

[10-5]
$\mathrm{TiO(acac)_2}$

[10-6]
$\mathrm{Zr(acac)_4}$

[10-7]
$\mathrm{SnO(acac)_2}$

[10-8]
$\mathrm{VO(acac)_2}$ acac =  Etaa =  SA =

-continued

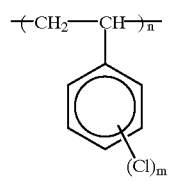
[11-1]

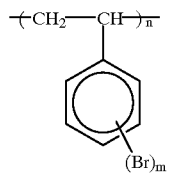
[11-2]

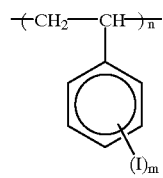
[11-3]

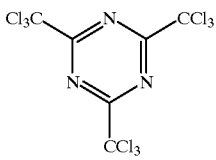
[11-4]

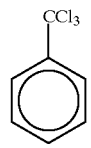

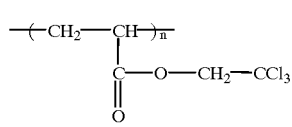
[11-5]

[11-6]

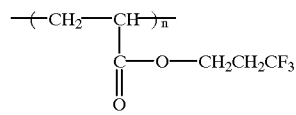
[11-7]

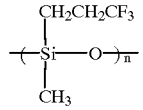
[11-8]

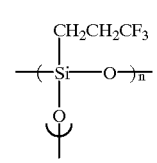
[11-9]

Figure 1C:
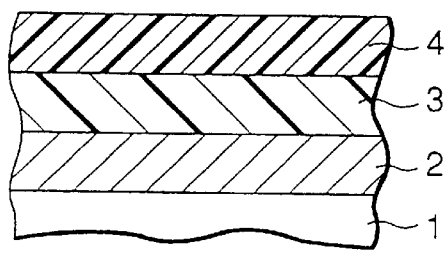

In the next step, a resist film 4 is formed by coating the underlying film 3 with a resist solution and subsequently applying a heat treatment, as shown in FIG. 1C. If the thickness of the resist film 4 is decreased, it is possible to improve the allowance in the exposure amount in the light exposure step, the focus allowance or resolution. Therefore, it is desirable to decrease the thickness of the resist film 4 as much as possible as far as the underlying film 3 can be etched with a high size controllability. Preferably, the thickness of the resist film 4 should be 0.01 to 10 μm.

The kind of the resist is not particularly limited. It is possible to use a positive or negative resist depending on the object. Specifically, the positive resist includes, for example, IX-770, which is a trade name of a resist manufactured by JSR and consisting of naphthoquinone diazide and novolak resin, and APEX-E, which is a trade name of a chemical amplification type resist manufactured by Shiplay Co., and consisting of polyvinyl phenol resin protected by t-BOC and an onium salt. On the other hand, the negative resist includes, for example, SNR200, which is a trade name of a chemical amplification type resist manufactured by Shiplay Co., and consisting of polyvinyl phenol, melamine resin and a photo acid generator, and RD-2000N, which is a trade name of a resist manufactured by Hitachi Kasei K. K. and consisting of polyvinyl phenol and bisazide compound. Of course, the resist used in the present invention is not limited to those exemplified above.

If necessary, an anti-reflection film or an eaves-preventive film for preventing the adsorption of basic material onto the resist film can also be formed on the resist film. The anti-reflection film or the eaves-preventive film should be insulating. The film may be formed of AQUATAR (trade name) manufactured by Clariant company.

In the next step, a hybrid light exposure, i.e., exposure to light and to a charged beam, is applied to the resist film. As a result of an extensive research conducted in an attempt to obtain a resist pattern having a good profile by a light exposure with a wide process allowance, the present inventors have found that it is necessary for the underlying film to be an insulator in the light exposure step. It is considered reasonable to understand that the photosensitive agent contained in the resist film is decomposed by exposure to light so as to generate a charged material. The charged material thus generated serves to change the solubility of the resist. It follows that, where the underlying film is conductive, the decomposed charged material is diffused into the underlying film, resulting in failure to obtain a resist pattern having a fidelity to the optical image. On the other hand, where the underlying layer is an insulator, it is considered possible to suppress the diffusion of the decomposed charged material into the underlying film, making it possible to obtain a resist pattern having a fidelity to the optical image.

Let us describe the case where a charged beam exposure is carried out after the light exposure. It should be noted that, where the photoconductivity of the underlying layer is reversible, i.e., where the photoconductivity is brought about during the light irradiation step and is not brought about during the non-irradiation step in the case of repeating the light irradiation and non-irradiation, it is possible to carry out the light exposure after the charged beam exposure. It is also possible to carry out repeatedly the light exposure and the charged beam exposure.

Figure 1D:
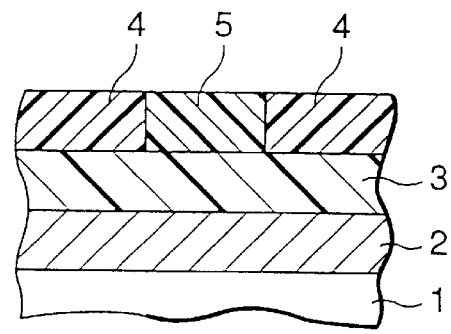

As shown in FIG. 1D, light exposure is performed by irradiating the resist film 4 with a visible light or an ultraviolet light through a mask having a predetermined pattern so as to form a latent image within the resist film 4. The light source used for the ultraviolet light irradiation includes, for example, a mercury lamp, and excimer lasers such as XeF (wavelength of 351 nm), XeCl (wavelength of 308 nm), KrF (wavelength of 248 nm), KrCl (wavelength of 222 nm), ArF (wavelength of 193 nm) and $F_2$ (wavelength of 151 nm).

The light passing through the resist film 4 in the light exposure step reaches the underlying film 3. However, the amount of the light exposure required for patterning the resist film is much smaller than the light exposure amount required for bringing about photoconductivity within the underlying film 3. Therefore, photoconductivity is not brought about in the underlying film 3 by the light irradiating the resist film 4 in the light exposure step, with the result that the underlying film 3 becomes insulating in the light exposure step. Since the underlying film 3 is an insulator in the light exposure step, the decomposed material of the photosensitive material generated in the light exposure step is not diffused into the underlying film, making it possible to obtain a resist pattern of a good profile, which is free from footing in the case of the positive resist and is free from undercut of resist in the case of the negative resist.

It should also be noted that, since it is possible to obtain a clear latent image having a fidelity to the optical image, a wide process allowance can be obtained. After the light exposure step, a post-exposure baking is carried out, if necessary, by using a hot plate or an oven.

Figure 1E:
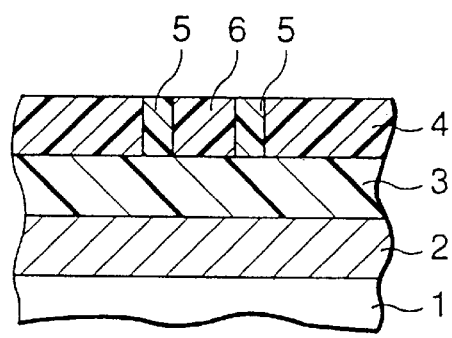

In the next step, a charged beam exposure is performed by irradiating the resist film 4 with a charged beam such as an electron beam or an ion beam, as shown in FIG. 1E. The charged beam exposure is carried out while irradiating the underlying film 3 with light having a wavelength suitable for imparting conductivity to the underlying film 3. It is desirable to carry out the light irradiation from above the resist film using a light of a wavelength or with a light exposure amount controlled not to sensitize the resist.

For example, the wavelength preferably ranges between 50 to 900 nm. When the wavelength is less than 50 nm, a sufficient photoconductivity is not obtained due to decomposition of the photoconductive material. When the wavelength is more than 900 nm, a sufficient photoconductivity is not obtained due to very weak photon energy. The amount of the light exposure preferably ranges between 0.01 to 100 $J/cm^2$. When the amount of the light exposure is less than 0.01 $J/cm^2$, a sufficient photoconductivity is not obtained due to a low intensity of the light. When the amount of the light exposure is more than 100 $J/cm^2$, a sufficient photoconductivity is not obtained due to decomposition of the photoconductive material.

Since photoconductivity is imparted to the underlying film 3 as described above, charge is unlikely to be accumulated within the resist film 4, with the result that it is possible to obtain a latent image 6 free from a positional deviation caused by the charge accumulation. Incidentally, where the underlying film 3 contains an organisilicon compound having a Si—Si bond, charge is unlikely to be accumulated if the organisilicon compound resistance is deviated the charged beam, even if the underlying film 3 is not irradiated with light. As a result, it is possible to suppress the positional deviation caused by the charge accumulation. In this case, it is not absolutely necessary to carry out the charged beam exposure while applying a light irradiation. Also, where the photoconductivity of the underlying film is irreversible, i.e., where the photoconductivity once brought about by light irradiation is maintained even if the light irradiation is stopped, it is not absolutely necessary to carry out the charged beam exposure while applying a light irradiation. To be more specific, it is possible to carry out the light irradiation after the light exposure step to bring about photoconductivity, followed by carrying out the charged beam exposure.

Figure 1F:
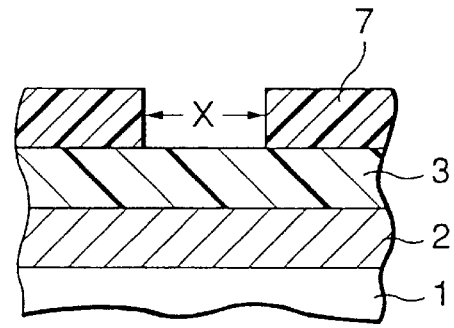
Figure 10A:
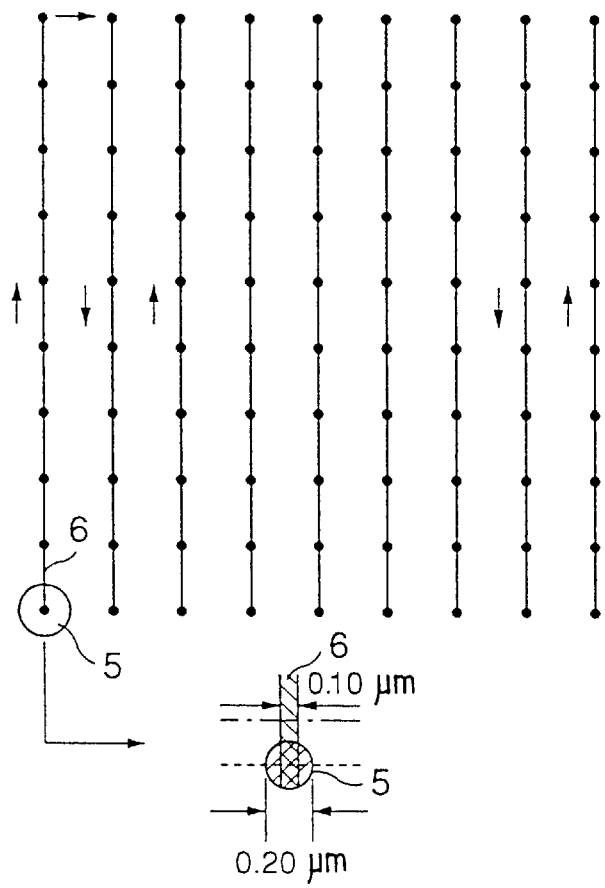
FIGS. 10A and 10B are top views each showing a resist pattern formed by a developing treatment.

After completion of the exposure to light and to a charged beam, a post-exposure baking is performed, if necessary, by using a hot plate or an oven. Then, a developing treatment is applied by using an organic alkaline aqueous solution such as tetramethyl ammonium hydroxide, or choline, an inorganic alkaline aqueous solution such as sodium hydroxide, or potassium hydroxide, or an organic solvent such as xylene or acetone so as to form a resist pattern 7 as shown in FIG. 1F. FIG. 10A is a top view showing the resist pattern 7. FIG. 1F shows a section cut along dotted line shown in FIG. 10A.

In the embodiment described above, the post-exposure baking is performed after the light exposure and also after the electron beam exposure. However, it is also possible to apply the post-exposure baking after completion of each of the light exposure and the electron beam exposure, with substantially the same effect.

In modification of the first embodiment, even if an upper film formed of photoconductive material is formed on the resist film, the same effect as the first embodiment can be obtained. In this case, the film immediately below the resist film should be insulating. The sheet resistance of the insulating film immediately below the resist film is preferably at least $1 \times 10^{12}/\square$, and includes, for example, silicon oxide, silicon nitride, silicon oxynitride, spin-on glass, a silicon-based insulating film such as a blank material used in the manufacture of a mask, and resins such as quinone diazide-novolak resin, polystyrene, polysulfone, polyamide, polyimide, polymethylmethacrylate, polyvinyl phenol novolak resin, polyester, polyvinyl alcohol, polypropylene, polybutadiene, polyvinylacetate, polyvinyl butyral polyimide, polyhydroxystyrene, phenolic resin and polysilane.

Next, a resist film is formed on the insulating film as the same manner as in the first embodiment. Then, an upper film formed of photoconductive material is formed on the resist film. It is desirable for the upper film to have a thickness of 0.001 to 10 $\mu$m. If the thickness is less than 0.001 $\mu$m, it is impossible for the upper film to release sufficiently the charge accumulated in the resist film in the step of exposure to a charged beam. On the other hand, if the thickness of the upper film exceeds 10 $\mu$m, a sensitivity is lowered in the step of exposure to a charged beam. The upper film is preferably formed of a water-soluble material. The reason is that, since the subsequent developing step is performed by using an alkali developer, the upper film can be removed in the developing step.

Subsequently, the resist film is exposed to a light as in the first embodiment, followed by irradiating the upper film with a light so as to impart photoconductivity to the upper film. Then, a charged beam is applied to the resist film, followed by development treatment, thus forming a resist pattern.

Where the photoconductivity of the upper layer is irreversible, it is not absolutely necessary to carry out the charged beam exposure while applying a light irradiation. To be more specific, it is possible to carry out the light irradiation after the light exposure step to bring about photoconductivity, followed by carrying out the charged beam exposure.

Even if both the upper film and the underlying film are formed of photoconductive material, the same effect as the first embodiment can be obtained.

That is, an underlying film and a resist film are formed on a work film as in the first embodiment, and an upper film is formed on the resist film as in the modification of the first embodiment. Subsequently, the resist film is exposed to a light as in the first embodiment, followed by irradiating the upper film and the underlying film with a light so as to impart photoconductivity to the upper film and the underlying film. Then, a charged beam is applied to the resist film, followed by development treatment, thus forming a resist pattern.

Where the photoconductivity of the upper layer or the underlying film is irreversible, it is not absolutely necessary to carry out the charged beam exposure while applying a light irradiation. To be more specific, it is possible to carry out the light irradiation after the light exposure step to bring about photoconductivity, followed by carrying out the charged beam exposure.

Let us describe a pattern forming method according to a third embodiment of the present invention.

Figure 3A:
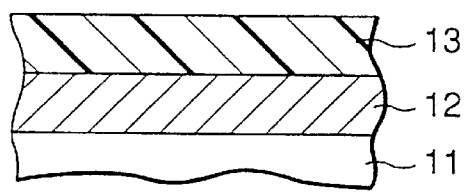
FIGS. 3A to 3F are cross sectional views collectively showing a pattern forming method according to a third embodiment of the present invention.

Specifically, FIGS. 3A to 3F are cross sectional views collectively showing the pattern forming method according to the third embodiment of the present invention. In the first step, a work film 12 is formed on a semiconductor wafer 11, as shown in FIG. 3A. The material of the work film 2 includes, for example, a silicon oxide film, a silicon nitride film, a silicon oxynitride film, a spin-on glass, a silicon-based insulating film such as a blank material used in the manufacture of a mask, a silicon-based material such as amorphous silicon, polycrystalline silicon, or a silicon substrate, and a wiring material such as aluminum, aluminum silicide, copper, or tungsten.

Figure 3B:
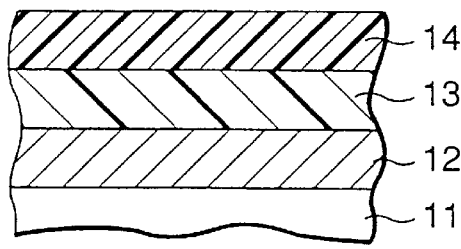

Then, an insulating film 13 is formed on the work film 12, as shown in FIG. 3B. Where the work film is insulating, the insulating film 13 is unnecessarily formed. The material of the insulating film 13 preferably exhibits a sheet resistance of at least $1 \times 10^{12}$ $\Omega/\square$, and includes, for example, silicon oxide, silicon nitride, silicon oxynitride, spin-on glass, a silicon-based insulating film such as a blank material used in the manufacture of a mask, and resins such as quinone diazide-novolak resin, polystyrene, polysulfone, polyamide, polyimide, polymethylmethacrylate, polyvinyl phenol novolak resin, polyester, polyvinyl alcohol, polypropylene, polybutadiene, polyvinylacetate, polyvinyl butyral polyimide, polyhydroxystyrene, phenolic resin and polysilane.

In order to suppress the reflection of the exposure light from the underlying substrate so as to obtain a resist pattern having a good size controllability, it is desirable for the complex refractive index of the insulating film at the wavelength of the exposure light to fall within a range of $1.0<n<3.0$, $0.1<k<1.0$. It is also desirable for the insulating film to have a thickness of at least 0.001 $\mu$m. If the insulating film is thinner than 0.001 $\mu$m, it is impossible to suppress sufficiently the reflection.

Figure 3C:
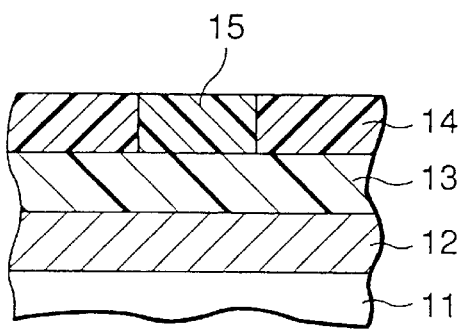

In the next step, a resist film 14 is formed on the insulating film 13 as in the first and second embodiments, as shown in FIG. 3B. Then, the resist film 14 is exposed to light, followed by applying a post-exposure baking, if necessary, as in the first and second embodiments, as shown in FIG. 3C. Since the insulating film is positioned immediately below the resist film in this step, it is possible to obtain a resist pattern of a good profile, which is free from footing (i.e., failure to etch completely the bottom portion of the pattern) or undercut of resist. Also, since a clear latent image 15 having a fidelity to the optical image can be obtained, it is possible to ensure a wide process allowance.

Figure 3D:
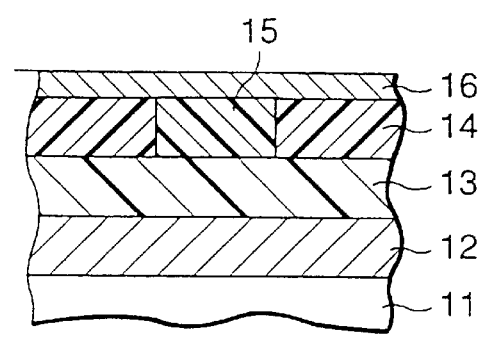

Then, an upper film 16 consisting of a conductive material is formed on the resist film 14, as shown in FIG. 3D. It is desirable for the upper film 16 to have a thickness of 0.001 to 10 $\mu$m. If the upper film 16 is thinner than 0.001 $\mu$m, it is impossible to release sufficiently the charge which may be accumulated in the resist film in the step of the charged beam exposure. On the other hand, if the thickness exceeds 10 $\mu$m, the sensitivity of the resist is lowered in the step of the charged beam exposure.

The material of the upper film 16 preferably exhibits a sheet resistance of $1 \times 10^{12}$ $\Omega/\square$ or less, and it is desirable to use a water-soluble material. In general, an alkaline developing solution is used in the subsequent developing step. Therefore, if the upper film 16 is formed of a water-soluble material, the upper film is dissolved in the developing solution so as to be removed in the developing step. The water-soluble conductive material used in the present invention includes, for example, the compounds having chemical structures [12-1] to [12-8] given below:

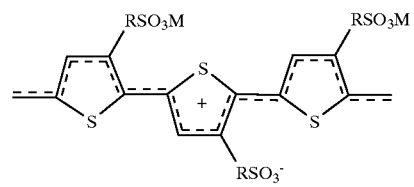

[12-1]

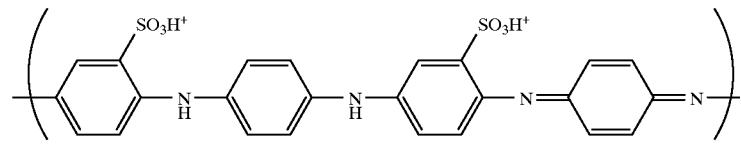

[12-2]

-continued

[12-3]

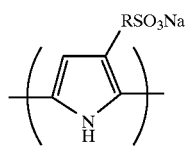

[12-4]

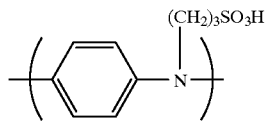

[12-5]

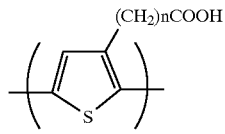

[12-6]

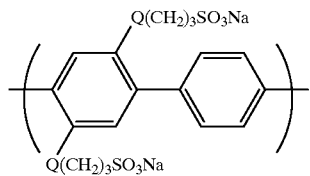

[12-7]

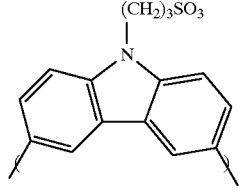

[12-8]

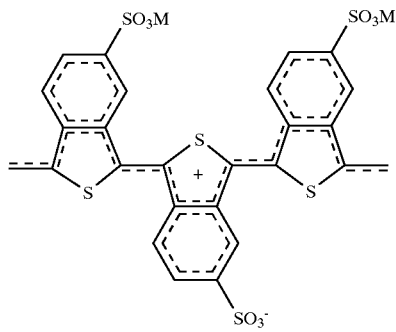

where M represents an alkyl group.

The resist film is coated with an aqueous solution of the conductive material, followed by heating the coating by using a hot plate or an oven so as to form the upper film 16.

Figure 3E:
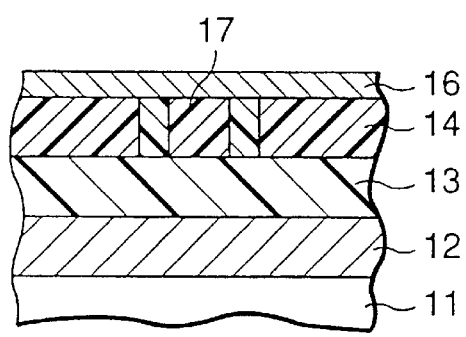

Then, the resist film is irradiated with a charged beam such as an electron beam or an ion beam. Since the upper film 16, which is conductive, is formed on the resist film 14 in this step, it is possible to obtain a latent image 17 free from a positional deviation caused by the charge accumulation, as shown in FIG. 3E.

Figure 3F:
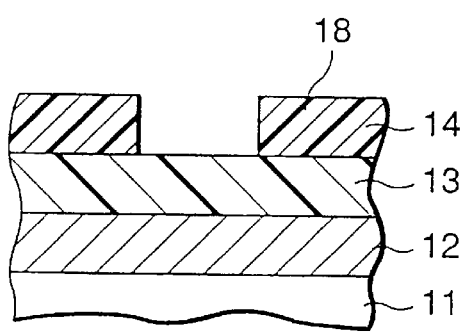
Figure 4A:
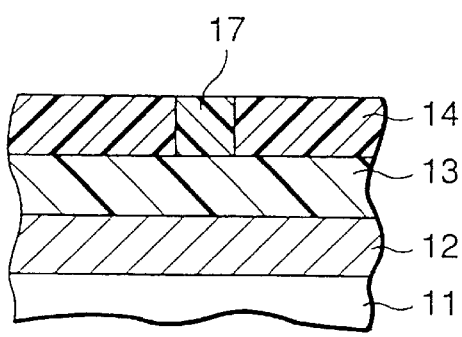
FIGS. 4A and 4B are cross sectional views collectively showing a pattern forming method according to the third embodiment of the present invention.
Figure 4B:
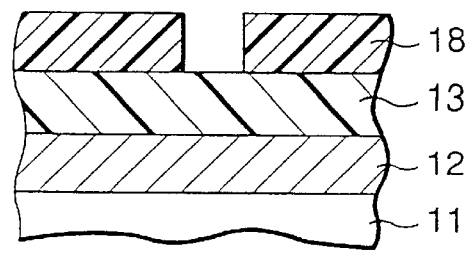

After completion of the light exposure and the charged beam irradiation, a post-exposure baking is applied, if necessary, followed by applying a developing treatment by using an organic alkaline aqueous solution containing, for example, tetramethyl ammonium hydroxide or choline, an inorganic alkaline aqueous solution containing, for example, sodium hydroxide or potassium hydroxide, or an organic solvent such as xylene or acetone, so as to form a resist pattern 18, as shown in FIG. 3F. FIG. 3F shows a section cut along dotted line shown in FIG. 10A. It should be noted that the upper film 16 is dissolved in and removed by the developing solution during the developing treatment. FIG. 10A is a top view showing the resist pattern 18.

In the third embodiment described above, the conductive upper film is formed on the resist film, making it possible to obtain a resist pattern free from a positional deviation caused by a charge up in the step of the charged beam exposure. It should be noted that, in the hybrid exposure to light and to a charged beam employed in the present invention, the coating step of the conductive upper film is interposed between the light exposure step and the charged beam exposure step, making it possible to widen the process allowance in the light exposure step and to prevent the positional deviation caused by the charge up in the charged beam exposure step.

Let us describe a pattern forming method according to fourth and fifth embodiments of the present invention.

Figure 5:
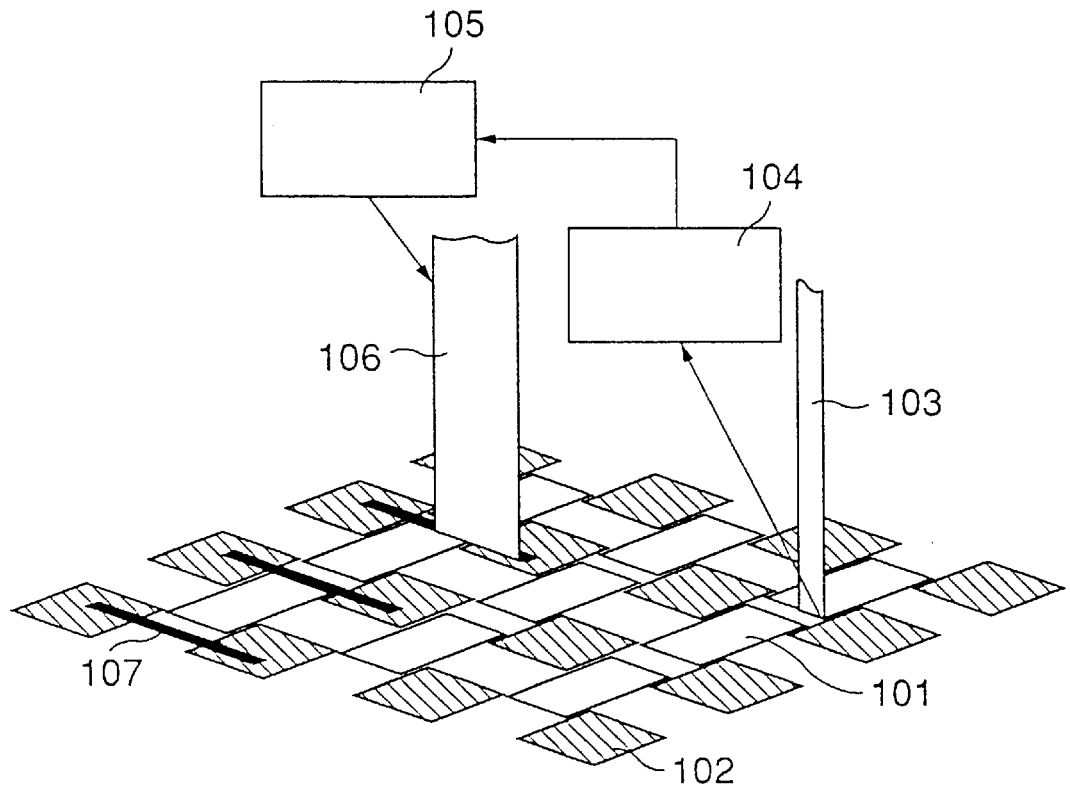
FIG. 5 is for explaining a pattern forming method according to fourth and fifth embodiments of the present invention.

Specifically, FIG. 5 is for explaining a direct aligning method between a light exposure pattern and a charged beam pattern within the same layer and a direct aligning method between a substrate pattern and a charged beam exposure pattern.

Shown in FIG. 5 are a substrate pattern 101 below the underlying film, a latent image 102 of the light exposure pattern formed in the resist film, a detecting beam 103 for detecting the latent image (or substrate pattern), means 104 for detecting the latent image (or substrate pattern), means 105 for comparing the position of the latent image (or substrate pattern) with design data so as to correct the pattern position in the step of the charged beam exposure, a charged beam 106 used for the pattern exposure, and a latent image 107 of the charged beam exposure pattern formed by a charged beam.

In the system shown in FIG. 5, the detecting beam 103 and the exposure beam 106 are arranged separately from each other in order to permit these beams to perform their operations in parallel during the operation of the stage having the substrate mounted thereon and, thus, to increase the processing capacity of the charged beam exposure.

Let us describe the direct aligning method between the light exposure pattern and the charged beam exposure pattern formed within the same layer by using the system of the particular construction.

In the mix and match of the light and charged beam within the same layer, a latent image is formed within the resist film by the light exposure which is carried out first. The latent image is observed as if the latent image provides an aligning mark of the charged beam exposure which is carried out later. Also, a deviation of the light exposure pattern from the design value is read out from the detection signal so as to correct the position of the charged beam exposure pattern based on the design value. The exposure is continued in this fashion.

Where the latent image formed by the light exposure is detected by a charged beam, it is necessary to suppress the sum of the charged beam used for irradiation of the resist film at a value smaller than the sum of the charged beam required for exposure of the resist film. Where the latent image is detected by light, it is necessary to use light having a wavelength differing from the wavelength of the light sensitive to the resist. In the case of using light having a component sensitive to the resist, it is desirable to irradiate the resist with the light in an amount smaller than the exposure amount required for the light exposure of the resist film.

Also, the underlying film is formed of a photoconductive material, and a charged beam exposure pattern is formed while irradiating the underlying film with light to impart conductivity to the underlying film. Where the photoconductivity is irreversible, it is not absolutely necessary to perform the charged beam exposure while irradiating the underlying film with light to impart conductivity to the underlying film. In this case, it suffices to interpose the step of irradiating the underlying film with light to impart conductivity to the underlying film between the latent image forming step by light exposure and the charged beam exposure step. In irradiating the resist film with light from an upper portion, it is desirable to use light having a wavelength differing from the wavelength of the light sensitive to the resist. In the case of using light having a component sensitive to the resist, it is desirable to irradiate the resist with the light in an amount smaller than the exposure amount required for the light exposure of the resist film.

Where the underlying film is formed of a photoconductive material and the charged beam exposure is performed while irradiating the underlying film with light, the underlying film can be made an insulating film during the light exposure and a conductive film during the charged beam exposure. As a result, where a latent image is formed within the resist film by light exposure, the conductive material generated from the acid generating agent is unlikely to be diffused into the underlying film because the underlying film is an insulating film. It follows that a clear latent image can be obtained, making it possible to form both light exposure pattern and charged beam exposure pattern accurately within the same layer by direct alignment.

Where a charged beam exposure is performed, it is possible to form a pattern free from a positional deviation caused by charge up because the underlying film is a conductive film.

Incidentally, the underlying film, photoconductive material, resist, light used for light exposure, electron beam, etc. are equal to those used in the first to third embodiments described above and, thus, description thereof is omitted.

If necessary, an anti-reflection film or an eaves-preventive film for preventing the adsorption of basic material onto the resist film can also be formed on the resist film. The anti-reflection film or the eaves-preventive film should be insulating. The film may be formed of AQUATAR (trade name) manufactured by Clariant company.

Let us describe the direct aligning method between the substrate pattern and the charged beam exposure pattern.

In the direct aligning method, a light exposure pattern and a charged beam exposure pattern within the same layer can be aligned with a high accuracy as described in the embodiments described above. It should be noted in this connection that a charged beam exposure pattern is required in some cases to be aligned with a pattern position within the substrate where a critical positional accuracy is required. In this case, light exposure is performed by observing a pattern within the substrate below the resist film in place of the latent image formed by the light exposure performed first as if the observed pattern provides an aligning mark of the charged beam exposure which is to be performed later, followed by reading out a deviation of the light exposure pattern from the design value from the detection signal thereof so as to correct the position of the charged beam exposure pattern based on the design value in accordance with the reading of the deviation.

In this case, it is also necessary to suppress the sum of the charged beam used for irradiating the resist film for detecting the substrate pattern at an amount smaller than the sum of the charged beam required for exposure of the resist film. Also, a charged beam exposure pattern is formed by applying a charged beam exposure while irradiating the underlying film, which is formed of a photoconductive material, with light to impart conductivity to the underlying film.

Where the photoconductivity is irreversible, it is not absolutely necessary to perform the charged beam exposure while irradiating the underlying film with light to impart conductivity to the underlying film. Specifically, it suffices to interpose the step of irradiating the underlying film with light to impart conductivity to the underlying film between the latent image forming step by light exposure and the charged beam exposure step. Where the resist film is irradiated with light from above in this case, it is desirable to use light having a wavelength differing from the wavelength of light sensitive to the resist film. In the case of using light having a component sensitive to the resist, it is desirable to irradiate the resist with the light in an amount smaller than the exposure amount required for the light exposure of the resist film.

By using an underlying film formed of a photoconductive material and by performing a charged beam exposure while irradiating the underlying film with light, the underlying film can be made an insulating film in the step of detecting the substrate pattern and a conductive film in the charged beam exposure step. During detection of the position information of the pattern formed within the substrate below the resist film, the electrons applied for detection of the position information, those reflected from the substrate pattern or secondary electrons are not diffused within the underlying film because the underlying film is an insulating film. As a result, the position information can be detected accurately, making it possible to form a resist pattern with a high superposing accuracy.

It should also be noted that, since the underlying film is a conductive film, it is possible to form a pattern free from a positional deviation caused by charge up in the step of the electron beam exposure. It follows that it is possible to form a pattern with a high superposing accuracy.

Let us describe various Examples of the present invention to set forth more clearly the technical idea of the present invention.

EXAMPLE 1

This Example relates to the first embodiment of the present invention.

In the first step, a work film 2 made of $SiO_2$ was formed in a thickness of 500 nm by an LPCVD method on a silicon wafer 1, as shown in FIG. 1A, followed by forming an underlying film 3, which exhibits a photoconductivity, in a thickness of 100 nm on the $SiO_2$ film 2. The underlying film 3 was formed by the methods (S1) to (S18) described below:

(S1): The $SiO_2$ film 2 was coated by a spin coating method with a solution prepared by dissolving 9.9 g of the organosilicon compound (n/m=¼) represented by the chemical formula [1-84] and having a weight average molecular weight of 12,000 and 0.1 g of fralen (C60) used as a charge generator in 90 g of anisole, followed by heating the coating at 160° C. for 90 seconds by using a hot plate.

(S2): The $SiO_2$ film 2 was coated by a spin coating method with a solution prepared by dissolving 9.9 g of the organosilicon compound (n/m=¼) represented by the chemical formula [1-95] and having a weight average molecular weight of 12,000 and 0.1 g of fralen (C60) used as a charge generator in 90 g of anisole, followed by heating the coating at 160° C. for 90 seconds by using a hot plate.

(S3): The $SiO_2$ film 2 was coated by a spin coating method with a solution prepared by dissolving 9.9 g of the organosilicon compound (n/m=¼) represented by the chemical formula [1-93] and having a weight average molecular weight of 12,000 and 0.1 g of fralen (C60) used as a charge generator in 90 g of anisole, followed by heating the coating at 160° C. for 90 seconds by using a hot plate.

(S4): The $SiO_2$ film 2 was coated by a spin coating method with a solution prepared by dissolving 9.9 g of the organosilicon compound (n/m=¼) represented by the chemical formula [1-98] and having a weight average molecular weight of 18,000 and 0.1 g of fralen (C60) used as a charge generator in 90 g of anisole, followed by heating the coating at 160° C. for 90 seconds by using a hot plate.

(S5): The $SiO_2$ film 2 was coated by a spin coating method with a solution prepared by dissolving 9.9 g of the organosilicon compound (n/m=¼) represented by the chemical formula [1-56] and having a weight average molecular weight of 13,000 and 0.1 g of fralen (C60) used as a charge generator in 90 g of anisole, followed by heating the coating at 160° C. for 90 seconds by using a hot plate.

(S6): The $SiO_2$ film 2 was coated by a spin coating method with a solution prepared by dissolving 8.7 g of the organosilicon compound represented by the chemical formula [1-1] and having a weight average molecular weight of 3,000, 0.2 g of azobisisobutyro nitrile used as a radical generator, and 0.1 g of fralen (c60) used as a charge generator in 90 g of anisole, followed by heating the coating at 160° C. for 10 minutes under a nitrogen atmosphere (oxygen concentration being 50 ppm or less).

(S7): The $SiO_2$ film 2 was coated by a spin coating method with a solution prepared by dissolving 9 g of the organosilicon compound (n/m=¼) represented by the chemical formula [1-84] and having a weight average molecular weight of 12,000 and 1 g of a charge generator represented by chemical formula [2-18] in 90 g of anisole, followed by heating the coating at 160° C. for 90 seconds by using a hot plate.

(S8): The $SiO_2$ film 2 was coated by a spin coating method with a solution prepared by dissolving 9 g of the organosilicon compound (n/m=¼) represented by the chemical formula [1-95] and having a weight average molecular weight of 12,000 and 1 g of a charge generator represented by chemical formula [2-30] in 90 g of anisole, followed by heating the coating at 160° C. for 90 seconds by using a hot plate.

(S9): The $SiO_2$ film 2 was coated by a spin coating method with a solution prepared by dissolving 9 g of the organosilicon compound (n/m=¼) represented by the chemical formula [1-93] and having a weight average molecular weight of 12,000 and 1 g of a charge generator represented by chemical formula [2-42] in 90 g of anisole, followed by heating the coating at 160° C. for 90 seconds by using a hot plate.

(S10) The $SiO_2$ film 2 was coated by a spin coating method with a solution prepared by dissolving 9 g of the organosilicon compound (n/m=¼) represented by the chemical formula [1-98] and having a weight average molecular weight of 12,000 and 1 g of a charge generator represented by chemical formula [2-47] in 90 g of anisole, followed by heating the coating at 160° C. for 90 seconds by using a hot plate.

(S11) The $SiO_2$ film 2 was coated by a spin coating method with a solution prepared by dissolving 9 g of the organosilicon compound (n/m=¼) represented by the chemical formula [1-56] and having a weight average molecular weight of 12,000 and 1 g of a charge generator represented by chemical formula [4-34] in 90 g of anisole, followed by heating the coating at 160° C. for 90 seconds by using a hot plate.

(S12) The $SiO_2$ film 2 was coated by a spin coating method with a solution prepared by dissolving 9 g of the organosilicon compound represented by the chemical formula [1-1] and having a weight average molecular weight of 2,000, 1.8 g of a crosslinking agent represented by chemical formula [3-87], 0.2 g of benzoyl oxide used as a radical generator, and 0.2 g of fralen (C70) in 90 g of anisole, followed by heating the coating at 160° C. for 90 seconds by using a hot plate.

(S13) The $SiO_2$ film 2 was coated by a spin coating method with a solution prepared by dissolving 9 g of the organosilicon compound (n/m=¼) represented by the chemical formula [1-84] and having a weight average molecular weight of 12,000 and 1 g of a charge generator represented by chemical formula [2-143] in 90 g of anisole, followed by heating the coating at 160° C. for 90 seconds by using a hot plate.

(S14) The $SiO_2$ film 2 was coated by a spin coating method with a solution prepared by dissolving 9 g of the organosilicon compound (n/m=¼) represented by the chemical formula [1-84] and having a weight average molecular weight of 12,000 and 1 g of a charge generator represented by chemical formula [2-170] in 90 g of anisole, followed by heating the coating at 160° C. for 90 seconds by using a hot plate.

(S15) The $SiO_2$ film 2 was coated by a spin coating method with a solution prepared by dissolving 9.9 g of the organosilicon compound (n/m=¼) represented by the chemical formula [1-84] and having a weight average molecular weight of 12,000 and 0.1 g of fralen used as a charge generator in 90 g of anisole, followed by heating the coating at 160° C. for 90 seconds by using a hot plate.

(S16) The $SiO_2$ film 2 was coated by a spin coating method with a solution prepared by dissolving 9.9 g of the organosilicon compound (n/m=¼) represented by the chemical formula [1-84] and having a weight average molecular weight of 12,000 and 1 g of TCNQ used as a charge generator in 90 g of anisole, followed by heating the coating at 160° C. for 90 seconds by using a hot plate.

(S17) The $SiO_2$ film 2 was coated by a spin coating method with a solution prepared by dissolving 10 g of the organosilicon compound (n/m=¼) represented by the chemical formula [1-84] and having a weight average molecular weight of 12,000 in 90 g of anisole, followed by heating the coating at 160° C. for 90 seconds by using a hot plate. Further, the coating was exposed to an $I_2$ atmosphere having an $I_2$ vapor pressure of 40 Torr for doping iodine in the coating.

(S18) The $SiO_2$ film 2 was coated by a spin coating method with a solution prepared by dissolving 10 g polyvinyl carbazole in 90 g of toluene, followed by heating the coating at 160° C. for 90 seconds by using a hot plate.

For comparison, an underlying film was formed of a conductive material by the methods (C1) to (C4) given below or of an insulating material by the methods (I1) to (I3) given below in a thickness of 100 nm:

(C1): An aluminum silicide film was formed by a sputtering method.

(C2): A tungsten silicide film was formed by a sputtering method.

(C3): A polycrystalline silicon film was formed by a CVD method, followed by doping the polycrystalline silicon film with phosphorus.

(C4): A carbon film was formed by a sputtering method.

(I1): A TEOS oxide film was formed by a LPCVD method.

(I2): A $SiO_xN_y$ (x=y=0.5) film was formed by a sputtering method.

(I3): The $SiO_2$ film 2 was coated by a spin coating method with a solution prepared by dissolving 10 g of polysulfone having a weight average molecular weight of 12,000 in 90 g of cyclohexanone, followed by heating the coating at 220° C. for 90 seconds by using a hot plate.

The sheet resistance of each of the underlying films thus formed was measured, with the results as shown in Tables 1 to 3 given below:

TABLE 1

| Underlying film | Complex refractive index | Sheet resistance [Ω/□] | Focus allowance [μm] | Wavelength & dose of light irradiation | Amount of positional deviation |
|---|---|---|---|---|---|
| (S1) | n = 2.01, k = 0.30 | 2 × 10¹⁷ | 0.6 | 365 nm, 100 mJ/cm² | <1 nm |
| (S2) | n = 2.03, k = 0.31 | 4 × 10¹⁸ | 0.7 | 365 nm, 100 mJ/cm² | <1 nm |
| (S3) | n = 2.05, k = 0.29 | 3 × 10¹⁸ | 0.7 | 365 nm, 100 mJ/cm² | <1 nm |
| (S4) | n = 2.01, k = 0.29 | 8 × 10¹⁷ | 0.7 | 365 nm, 100 mJ/cm² | <1 nm |
| (S5) | n = 2.01, k = 0.29 | 5 × 10¹⁷ | 0.6 | 365 nm, 100 mJ/cm² | <1 nm |
| (S6) | n = 2.06, k = 0.38 | 5 × 10¹⁷ | 0.8 | 365 nm, 100 mJ/cm² | <1 nm |
| (S7) | n = 2.01, k = 0.30 | 6 × 10¹⁷ | 0.6 | 436 nm, 200 mJ/cm² | <1 nm |
| (S8) | n = 2.03, k = 0.31 | 7 × 10¹⁸ | 0.8 | 436 nm, 200 mJ/cm² | <1 nm |
| (S9) | n = 2.05, k = 0.29 | 3 × 10¹⁷ | 0.6 | 436 nm, 200 mJ/cm² | <1 nm |

TABLE 2

| Underlying film | Complex refractive index | Sheet resistance [Ω/□] | Focus allowance [μm] | Wavelength & dose of light irradiation | Amount of positional deviation |
|---|---|---|---|---|---|
| (S10) | n = 2.01, k = 0.29 | 6 × 10¹⁷ | 0.7 | 436 nm, 200 mJ/cm² | <1 nm |
| (S11) | n = 2.01, k = 0.29 | 4 × 10¹⁷ | 0.6 | 436 nm, 200 mJ/cm² | <1 nm |

TABLE 2-continued

| Underlying film | Complex refractive index | Sheet resistance [Ω/□] | Focus allowance [μm] | Wavelength & dose of light irradiation | Amount of positional deviation |
|---|---|---|---|---|---|
| (S12) | n = 2.06, k = 0.38 | 6 × 10$^{17}$ | 0.7 | 365 nm, 100 mJ/cm$^2$ | <1 nm |
| (S13) | n = 2.01, k = 0.30 | 9 × 10$^{17}$ | 0.6 | 436 nm, 200 mJ/cm$^2$ | <1 nm |
| (S14) | n = 2.01, k = 0.30 | 1 × 10$^{17}$ | 0.7 | 436 nm, 200 mJ/cm$^2$ | <1 nm |
| (S15) | n = 2.01, k = 0.30 | 2 × 10$^{17}$ | 0.6 | 436 nm, 200 mJ/cm$^2$ | <1 nm |
| (S16) | n = 2.01, k = 0.30 | 2 × 10$^{17}$ | 0.7 | 436 nm, 200 mJ/cm$^2$ | <1 nm |
| (S17) | n = 2.01, k = 0.30 | 7 × 10$^{17}$ | 0.8 | 436 nm, 200 mJ/cm$^2$ | <1 nm |
| (S18) | n = 1.97, k = 0.10 | 9 × 10$^{17}$ | 0.7 | 436 nm, 200 mJ/cm$^2$ | <1 nm |

TABLE 3

| Underlying film | Complex refractive index | Sheet resistance [Ω/□] | Focus allowance [μm] | Wavelength & dose of light irradiation | Amount of positional deviation |
|---|---|---|---|---|---|
| (C1) | n = 2.01, k = 2.31 | 1 × 10$^{-2}$ | 0.3 | — | <1 mm |
| (C2) | n = 2.45, k = 3.01 | 2 × 10$^{-2}$ | 0.3 | — | <1 mm |
| (C3) | n = 1.62, k = 3.82 | 2 × 10$^{-3}$ | 0.2 | — | <1 mm |
| (C4) | n = 1.46, k = 0.71 | 2 × 10$^{-4}$ | 0.2 | — | <1 mm |
| (I1) | n = 1.52, k = 0.02 | 2 × 10$^{17}$ | 0.8 | — | 10 μm |
| (I2) | n = 1.92, k = 0.30 | 2 × 10$^{18}$ | 0.6 | — | 13 μm |
| (I3) | n = 1.72, k = 0.24 | 7 × 10$^{17}$ | 0.8 | — | 12 μm |

As apparent from Tables 1 and 2, any of the photoconductive materials (S1) to (S18) exhibited a sheet resistance of at least 1×10$^{17}$ Ω/□, indicating that these materials act as insulators when these materials are not irradiated with light.

Figure 6:
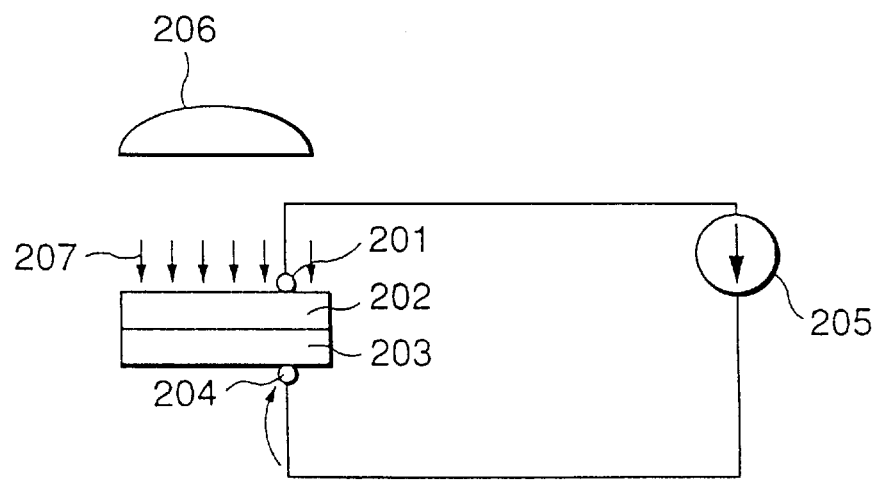
FIG. 6 schematically shows an apparatus used in an experiment for examining the photoconductivity of the photoconductive material.

In order to examine the photoconductivity of the photoconductive materials (S1) to (S18), an experiment was conducted as follows. Specifically, FIG. 6 schematically shows the apparatus used for the experiment. First of all, the photoconductivity of the photoconductive material (S1) was examined. In this case, an underlying film 202 was formed on an aluminum substrate 203 by the method of (S1), followed by bringing about ionization discharge by using a charge generating apparatus 206 so as to permit electrons to be accumulated in the underlying film 202. Then, the underlying film 202 was irradiated with light 207 while changing the wavelength and intensity of the light so as to measure the potential difference between electrodes 201 and 204 with a voltmeter 205 and, thus, to measure the conductivity of the underlying film 202.

The conductivity of the underlying film 202 was measured as follows. Specifically, ultraviolet light having a wavelength of 365 nm was taken out by using a spectroscope from the light emitted from a light source of a mercury lamp, and the underlying film 202 was irradiated with the ultraviolet light thus taken out at a dose of 100 mJ/cm$^2$. The ultraviolet light irradiation was started from the point denoted by an arrow shown in FIG. 7A showing the change with time in voltage.

Figure 7A:
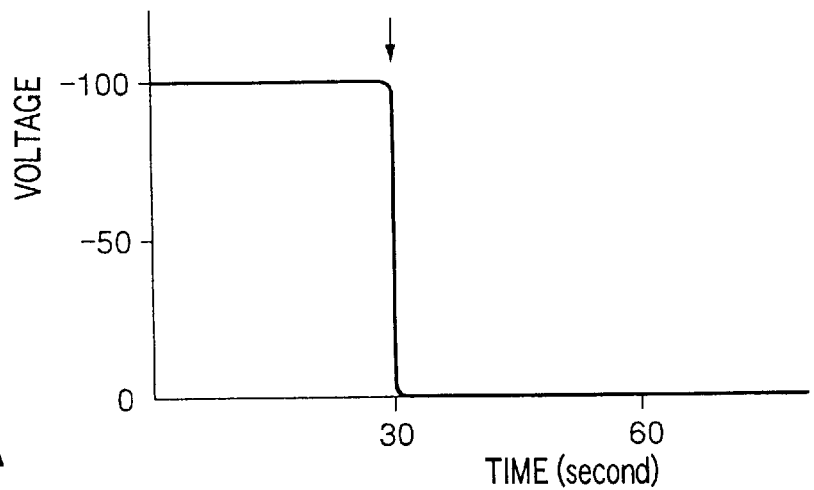
FIGS. 7A to 7C are graphs showing changes in potential when the underlying film is irradiated with light.

FIG. 7A shows that, since the underlying layer was changed from an insulator into a conductor as a result of the light irradiation, the voltage was changed into zero V. A similar experiment was conducted by accumulating a positive charge in the underlying film by means of ionization discharge, finding that the underlying film also exhibits a photoconductivity upon irradiation with a positive charge. A similar experiment was also applied to each of the photoconductive materials (S2) to (S18) so as to examine the photoconductivity, with substantially the same result as that of the photoconductive material (S1) under the wavelength and dose of the light irradiation shown in Tables 1 and 2.

Figure 7B:
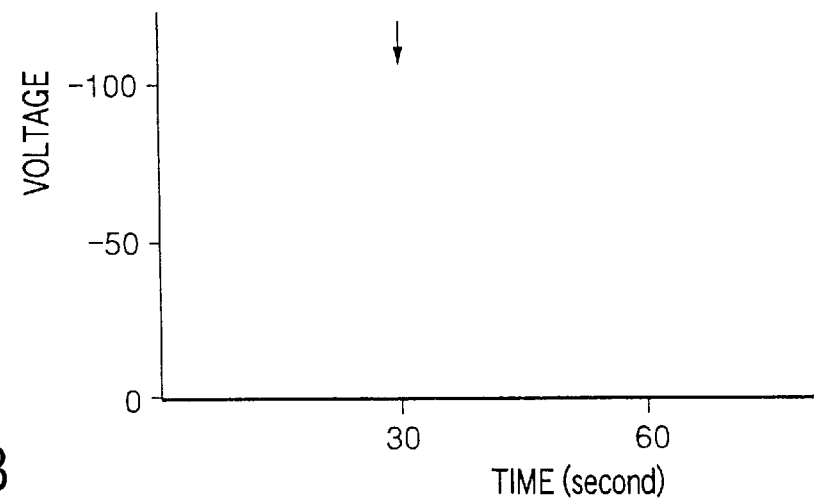
Figure 7C:
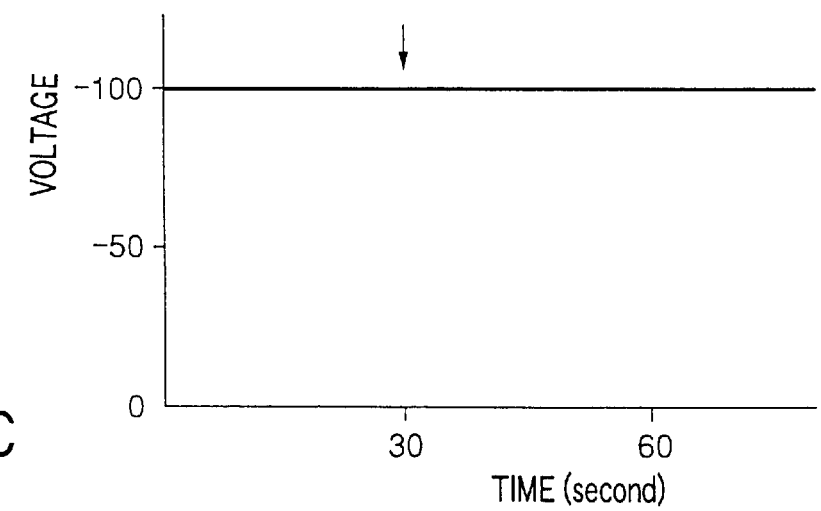

A similar experiment was also applied to each of the conductive materials (C1) to (C4) and each of the insulating materials (I1) to (I3). However, charge was not accumulated in the underlying film formed of each of the conductive materials (C1) to (C4), with the result that the potential remained to be zero even if ionization discharge was brought about, as shown in FIG. 7B. On the other hand, charge was certainly accumulated in the underlying film formed of each of the insulating materials (I1) to (I3). However, the charge was kept accumulated even after the light irradiation, with the result that the voltage was not changed into zero as shown in FIG. 7C.

In order to confirm that photoconductivity is not imparted to the underlying film by the light used for the light exposure, which is transmitted through the resist film in the light exposure step, the underlying film was irradiated with a KrF excimer laser light having a wavelength of 248 nm at a light exposure dose of 25 mJ/cm$^2$. It has been found that the charge was left accumulated in the underlying film even after the light irradiation, indicating that the resist does not exhibit photoconductivity in the light exposure step.

Further, the complex refractive index of the underlying film at the light wavelength of 248 nm in the light exposure step was measured by using a spectral eripsometer, with the results as shown in Tables 1 to 3. As apparent from these Tables, each of the photoconductive materials (S1) to (S18), the insulating material (I2) and (I3) and the conductive material (C4) exhibits complex refractive index suitable for suppressing the reflection of the light used for the light exposure and, thus, acts as an antireflection film in the step of the light exposure.

In the next step, a resist film was formed on the underlying film, as shown in FIG. 1C. The resist solution was prepared by dissolving 4.8 g of polyvinyl phenol resin having a weight average molecular weight of 12,000, 5 g of an inhibitor resin prepared by substituting t-butoxy carbonyl group in 50% of the hydroxyl groups of a polyvinyl phenol resin having a weight average molecular weight of 18,000, and 0.2 g of sulfonimide as an acid generator in 90 g of ethyl lactate. The underlying film was coated with the resist solution thus prepared by a spin coating method, followed by heating the coating at 110° C. for 90 seconds by using a hot plate so as to form the resist film. The resist film thus formed was 200 nm thick.

Then, the resist film was exposed to light and to an electron beam, i.e., hybrid exposure using light and electron beam, in a test pattern which permits monitoring the resolution in the light exposure step and the positional deviation caused by the charge accumulation in the step of the electron beam exposure.

Figure 8:
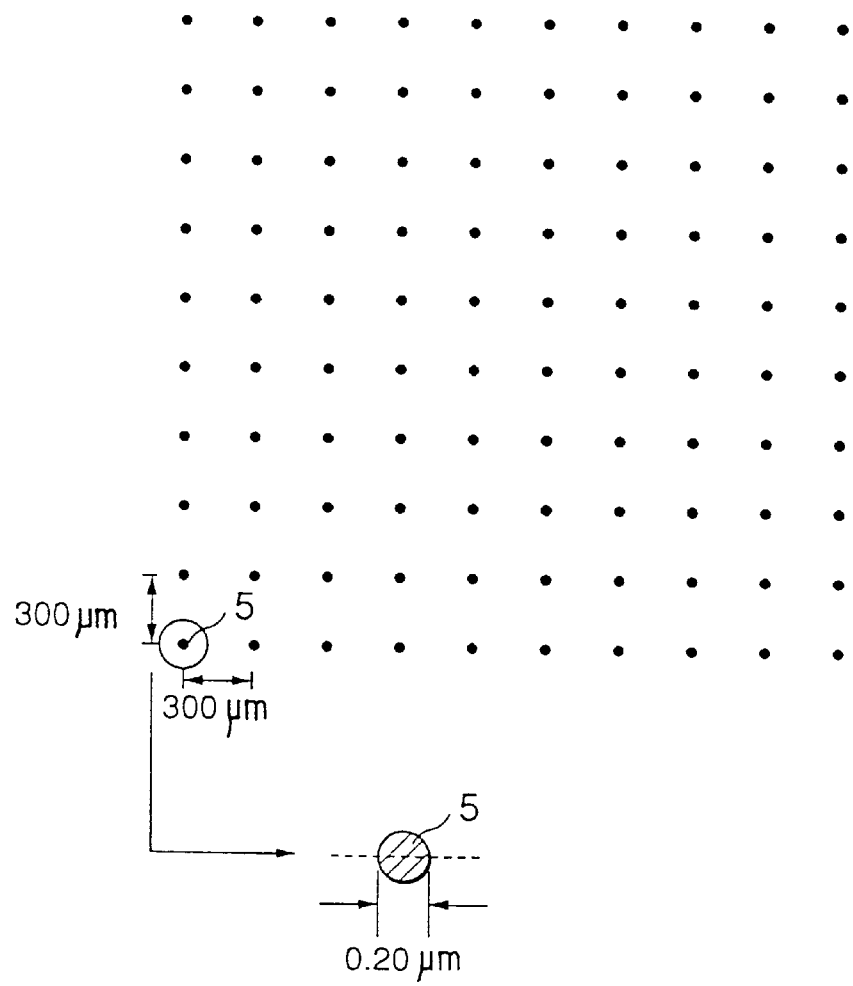
FIG. 8 is a top view showing a resist film having a latent image formed therein by light exposure.

In the next step, the resist film was selectively exposed to light in a pattern by using a reduced optical type stepper including a KrF excimer laser as a light source at a light exposure dose of 25 mJ/cm$^2$ so as to form a latent image 5 having a pattern of contact holes arranged at a pitch of 300 μm and each having a diameter of 0.20 μm. The upper surface of the resist film is exposed to an atmosphere (i.e., insulating atmosphere) at a light exposure. FIG. 8 is a top view of the resist film having the latent image 5 formed therein. FIG. 1D is a cross sectional view showing in a magnified fashion the portion denoted by a dotted line in FIG. 8.

Figure 2A:
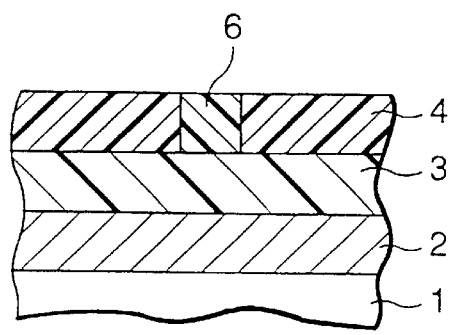
FIGS. 2A and 2B are cross sectional views collectively showing a pattern forming method according to the first and second embodiments of the present invention.
Figure 9A:
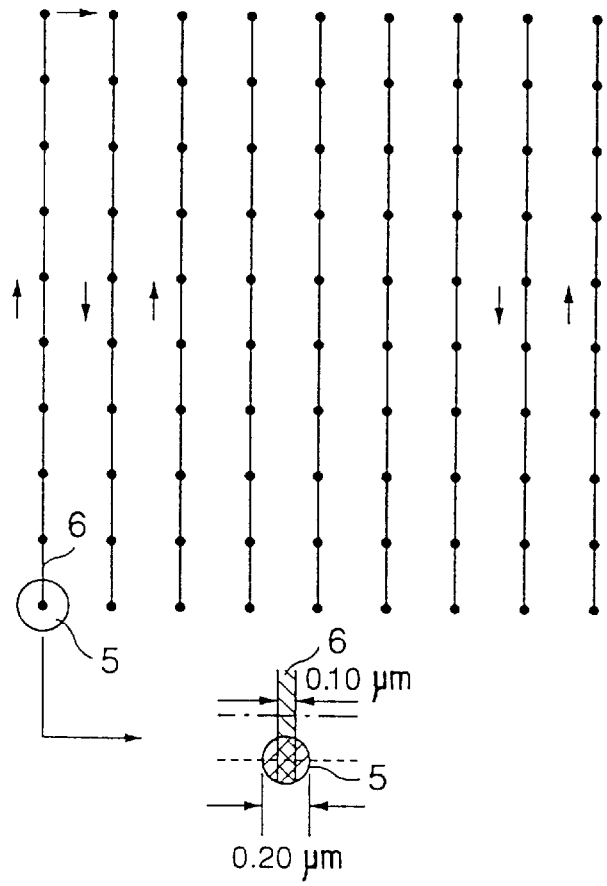
FIGS. 9A and 9B are top views each showing a resist film having a latent image formed therein by an electron beam exposure.
Figure 9B:
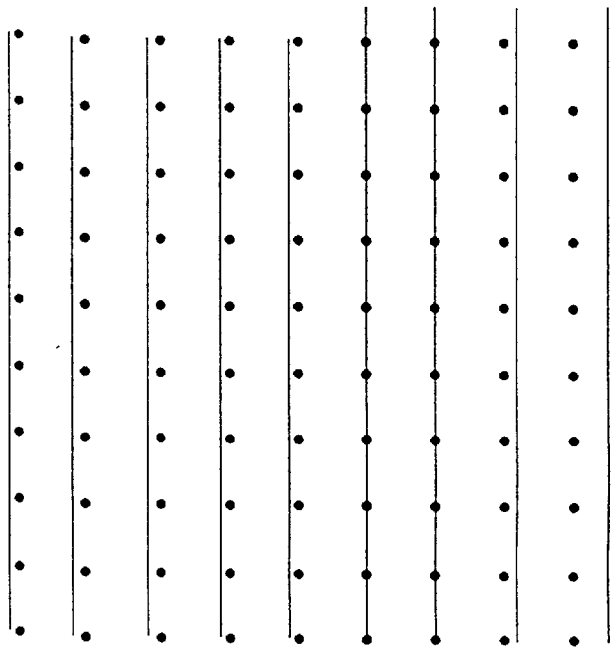

Then, a latent image 6 having a pattern of grooves arranged at a pitch of 300 μm and each having a width of 0.1 μm was formed by using a variable forming type electron beam image-depicting apparatus under an accelerating energy of 10 keV and a current density of 5A/cm$^2$. In order to impart photoconductivity to the underlying film, the electron beam exposure was performed while irradiating the entire wafer surface with light of the wavelength and dose shown in Tables 1 and 2 from above the resist film. FIGS. 9A and 9B are top views showing the resist film having the latent image 6 formed therein. FIG. 1E is a cross sectional view showing in a magnified fashion the portion denoted by a dotted line in FIG. 9A. On the other hand, FIG. 2A is a cross sectional view showing in a magnified fashion the portion denoted by a dot-and-dash line in FIG. 9A. The electron beam exposure was performed in the order denoted by arrows in FIG. 9A.

FIG. 9A covers the case where the underlying film is formed a photoconductive material or an electrically conductive material, with FIG. 9B covering the case where the underlying film is formed of an insulating material.

Figure 10B:
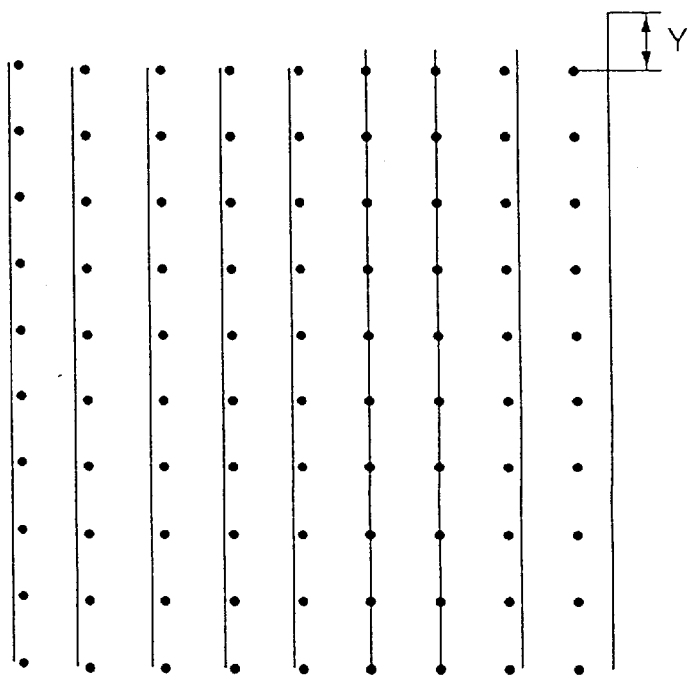
Figure 13:
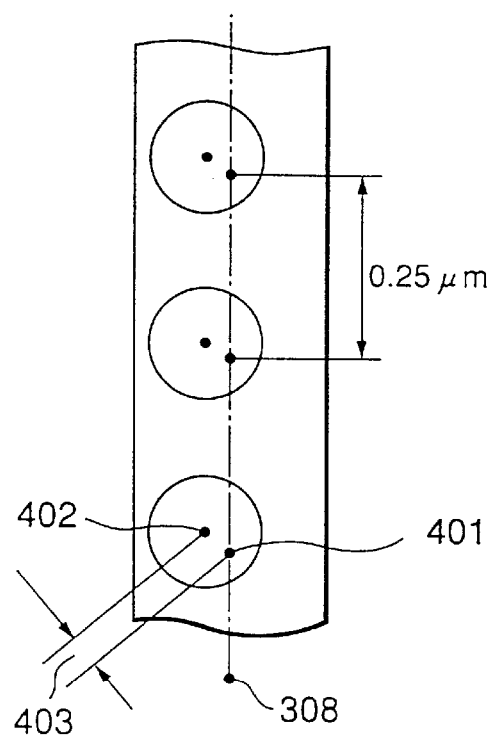
FIG. 13 shows a deviation between the position on which the center of a contact hole pattern should be positioned and the center of the contact hole actually formed.
Figure 16:
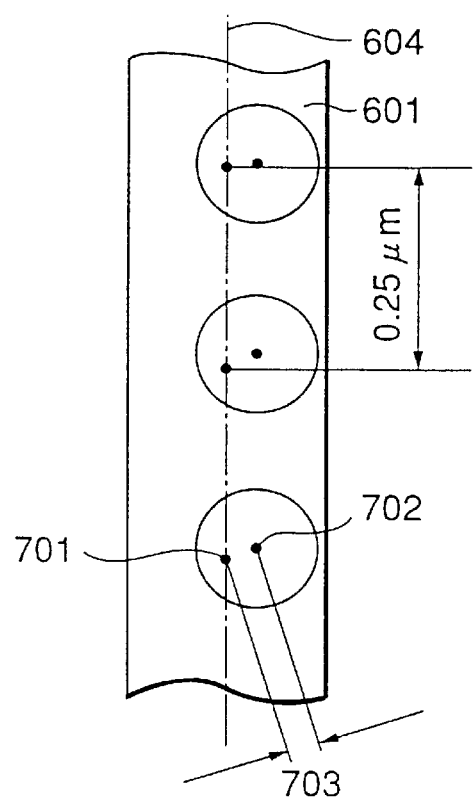
FIG. 16 is for defining the amount of deviation between the position on which the center of a contact hole pattern should be positioned and the center of the contact hole actually formed.

Then, a post-exposure baking was applied to the wafer at 110° C. for 90 seconds by using a hot plate, followed by performing a developing treatment by using a tetramethyl ammonium hydroxide solution of 0.21N so as to form a resist pattern. FIGS. 10A and 10B are top views each showing the resist pattern. FIG. 1F is a cross sectional view showing in a magnified fashion the portion denoted by a dotted line in FIG. 10A, with FIG. 2B being a cross sectional view showing the portion denoted by a dot-and-dash line in FIG. 10A. FIG. 10A covers the case where the underlying film is formed of a photoconductive material or an electrically conductive material, with FIG. 10B covering the case where the underlying film is formed of an insulating material.

Figure 11:
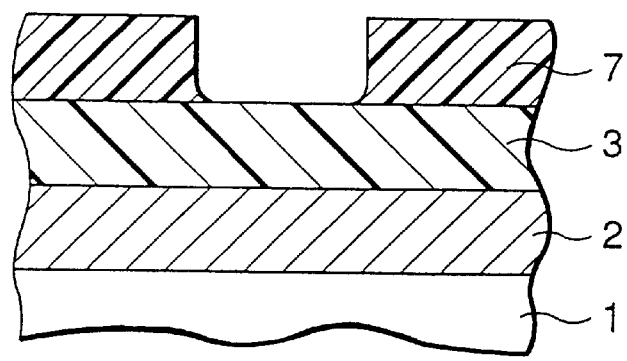
FIG. 11 shows footing of a resist pattern.

A cross section of the contact hole pattern formed by the light exposure, i.e., the cross section of the portion denoted by the dotted line in the magnified drawing included in FIG. 10A, was observed with a scanning electron microscope (SEM). Where the underlying film was formed of each of the photoconductive materials (S1) to (S18) and the insulating materials (I1) to (I3), obtained was a contact hole pattern of a good profile, i.e., contact hole pattern substantially free from footing and having a vertical side wall, as shown in FIG. 1F. On the other hand, where the underlying film was formed of a conductive material, footing took place as shown in FIG. 11, resulting in failure to form a satisfactory contact hole.

Figure 2B:
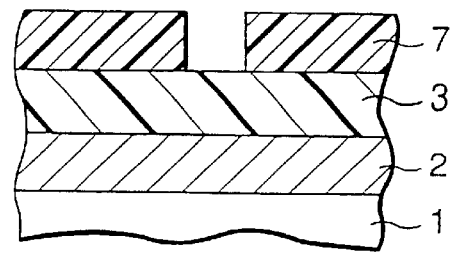

FIG. 2B is a cross sectional view showing the groove formed by the electron beam exposure, i.e., the portion denoted by a dot-and-dash line in FIG. 10A. A satisfactory groove free from footing was formed in every case where the underlying film was formed of any of the materials (S1) to (S18), (I1) to (I3) and (C1) to (C4).

Further, the focus allowance at a fixed light exposure dose of 25 mJ/cm$^2$ was examined, with the results as shown in Tables 1 to 3. The focus allowance is defined to denote a range of focus which permits the diameter of the contact hole to fall within a range of between 0.18 and 0.22 μm. The diameter of the contact hole is defined to denote the size in an upper portion of the resist pattern, i.e., size x shown in FIG. 1F. Where the underlying film is formed of a photoconductive material or an insulating material, the focus allowance was found to be 0.6 μm or more, supporting a sufficient process allowance. On the other hand, where the underlying film is formed of an electrically conductive material, the focus allowance was found to be small, i.e., 0.3 μm or less.

The experimental data clearly support that, if the underlying film is formed of an insulating material, a good profile can be obtained by the light exposure with a wide process allowance. It is considered reasonable to understand that the acid generating agent within the resist film is decomposed by the light exposure to generate an acid. Where the underlying film is formed of an electrically conductive material, the generated acid, which is conductive, is diffused into the underlying film, resulting in failure to obtain a resist pattern having fidelity to the optical pattern. On the other hand, where the underlying film is formed of an insulating material, it is possible to suppress the diffusion of the acid generated within the resist film by the light exposure into the underlying film, making it possible to obtain a resist pattern having fidelity to the optical pattern.

It should be noted that footing did not take place in the groove pattern formed by the electron beam exposure regardless of the fact that the underlying film was a conductor in the step of the electron beam exposure, as described previously. It is considered reasonable to understand that the light exposure is lower in contrast than the electron beam exposure, and that deterioration of the resist film profile caused by deactivation of the acid generated from the acid generating agent is brought about more prominently in the case of the light exposure.

Also measured was the amount of positional deviation caused by the charge accumulation in the step of the electron beam exposure. The amount of the positional deviation is defined to denote a size Y shown in FIG. 10B. The results of the measurement are shown in Tables 1 to 3. As apparent from Tables 1 to 3, the amount of the positional deviation was less than 1 nm, which is much smaller than the allowable limit of 10 nm, in the case of using any of the photoconductive materials and the electrically conductive materials for forming the underlying film. It is considered reasonable to understand that, where the underlying film is conductive, electrons are not accumulated on the resist film so as to diminish the positional deviation.

On the other hand, where the underlying film was formed of an insulating material, the positional deviation took place prominently. It is considered reasonable to understand that, where the underlying film is formed of an insulating material, electrons are accumulated in the resist film so as to deflect the electron beam, leading to the prominent positional deviation. Incidentally, the electron beam irradiation was performed while irradiating the underlying film from above the resist film with light having a wavelength which permits imparting photoconductivity to the underlying film. However, since the light had not sufficient wavelength or exposure dose to sensitize the resist, the resist profile was not adversely affected.

As described above, a resist pattern of a good profile can be obtained with a wide process allowance by using an underlying film formed of a photoconductive material and by irradiating the underlying film with light only during the step of the electron beam exposure so as to impart conductivity to the underlying film during the electron beam exposure. In addition, a resist pattern free from positional deviation caused by the charge accumulation can be obtained by the electron beam exposure.

EXAMPLE 2

This Example is directed to the first embodiment of the present invention.

In Example 1, a charged beam irradiation was applied while employing a light irradiation. However, where the photoconductivity of the underlying film is irreversible, i.e., where the photoconductivity once generated by light irradiation continues to be maintained even if the light irradiation is stopped, it is not absolutely necessary to perform the charged beam exposure while irradiating the underlying film with light. Specifically, it is possible to apply light irradiation to impart photoconductivity to the underlying film after the light exposure step, followed by performing the charged beam exposure.

The underlying film prepared by the method (S7) described in Example 1 was used in Example 2.

Reversibility in photoconductivity of the underlying film was examined first. Specifically, electrons were accumulated on the underlying film by using the apparatus shown in FIG. 6, with the result that a potential difference was generated between the electrodes 201 and 204. Then, the underlying film was irradiated with an ultraviolet light having a wavelength of 436 nm at a dose of 200 mJ/cm$^2$. As a result, photoconductivity was generated in the underlying film so as to decrease the potential difference to zero. Further, it was attempted to accumulate additional electrons on the underlying film. However, the potential difference was not generated, supporting that the photoconductivity was not reversible. In other words, the photoconductivity of the underlying film once generated by light irradiation was found to be maintained. A similar experiment was conducted by using a positive charge in place of electrons, finding that the photoconductivity was not reversible.

In the next step, an underlying film was formed by the method of (S7) in Example 1 on the SiO$_2$ film, followed by forming a resist film by a method similar to that employed in Example 1. The resist film thus formed was exposed selectively to a KrF excimer laser light to form a pattern, followed by irradiating the underlying film with an ultraviolet light having a wavelength of 436 nm at a dose of 100 mJ/cm$^2$ as in Example 1 so as to impart conductivity to the underlying film. The upper surface of the resist film is exposed to an atmosphere (i.e., insulating atmosphere) at a light exposure. Then, an electron beam exposure was applied to the resist film as in Example 1, followed by applying successively a post-exposure baking and developing treatment.

The profile of the resultant resist pattern was observed, finding that the patterns formed by the light exposure and the electron beam exposure were satisfactory as shown in FIGS. 1F and 2B, respectively. Further, the focus allowance in the light exposure step was determined as Example 1 and was found to be 0.7 μm, supporting a sufficiently wide margin.

In Example 2, the post-exposure baking was performed after completion of the light exposure and electron beam exposure. However, a similar effect was obtained in the case where the post-exposure baking was performed after completion of each of the light exposure and the electron beam exposure.

EXAMPLE 3

This Example relates to the first modification of the first embodiment of the present invention.

First of all, a work film made of a Sio$_2$ was formed in a thickness of 500 nm by an LPCVD method on a silicon wafer.

Subsequently, the SiO$_2$ film was coated with a solution prepared by dissolving 10 g of polysulfone in 90 g of cyclohexanone, followed by heating the coating at 200° C. for 90 seconds by using a hot plate, and thus forming a anti-reflective film. The thickness of the anti-reflective film was 100 nm.

Then, a resist film was formed on the anti-reflective film as in the Example 1.

The resist film was coated with a solution by dissolving 9 g of polyvinylalcohol having a weight average molecular weight of 4,000, and 1 g of polyvinyl calbazole as a photoconductive agent in 90 g of pure water by spin coating, followed by heating the coating at 120° C. for 90 seconds by using a hot plate, and thus forming a upper film. The thickness of the upper film was 40 nm. It has been confirmed that the upper film has a photoconductivity, as in the Example 1.

In the next step, the resist film was exposed to light in a pattern by using a reduced optical type stepper including a KrF excimer laser as a light source as in Example 1.

Then, an electron beam exposure was applied to the resist film while irradiating the upper film with an ultraviolet rays having a wavelength of 436 nm at a dose of 200 mJ/cm² as in Example 1 so as to impart conductivity to the upper film, followed by applying a post-exposure baking and developing treatment, and thus forming a resist pattern.

The focus allowance at the light exposure was examined and was 0.7 μm, supporting a sufficient large process allowance as in Example 1 because the films below and above the resist film was an insulator. The amount of positional deviation caused by the charge accumulation in the step of the electron beam exposure was measured as in Example 1, with the result that it was 1 nm or less and smaller than the allowable level of 10 nm. It is considered reasonable to understand that, since a conductivity was imparted to the upper film, electrons were not accumulated on the resist so as to diminish the positional deviation.

EXAMPLE 4

This Example relates to the second modification of the first embodiment of the present invention.

First of all, a work film made of a $SiO_2$ was formed in a thickness of 500 nm by an LPCVD method on a silicon wafer.

Subsequently, an underlying film was formed on the work film by the method of (S1) in Example 1. Then, a resist film was formed on the underlying film as in FIG. 1.

An upper film was formed on the resist film as in Example 3. It was confirmed that the underlying film and the upper film had a photoconductivity.

In the next step, the resist film was exposed to light in a pattern by using a reduced optical type stepper including a KrF excimer laser as a light source as in Example 1.

Then, an electron beam exposure was applied to the resist film while irradiating the upper film and the underlying film with an ultraviolet rays having a wavelength of 430 nm at a dose of 200 mJ/cm² as in Example 1 so as to impart conductivity to the upper film, followed by applying a post-exposure baking and developing treatment, and thus forming a resist pattern.

The focus allowance at the light exposure was examined and was 0.7 μm, supporting a sufficient large process allowance as in Example 1 because the films below and above the resist film was an insulator. The amount of positional deviation caused by the charge accumulation in the step of the electron beam exposure was measured as in Example 1, with the result that it was 1 nm or less and smaller than the allowable level of 10 nm. It is considered reasonable to understand that, since a conductivity was imparted to the upper film, electrons were not accumulated on the resist so as to diminish the positional deviation.

EXAMPLE 5

This Example is directed to the second embodiment of the present invention.

In the first step, a $SiO_2$ film was formed on a silicon wafer, as in Example 1. Then, an underlying film containing an organosilicon compound having a silicon-to-silicon backbone chain was formed on the $SiO_2$ film by the methods (T1) to (T12) given below in a thickness of 100 nm:

(T1): The $SiO_2$ film was coated by a spin coating method with a solution prepared by dissolving 10 g of the organosilicon compound (n/m=¼) represented by the chemical formula [1-84] and having a weight average molecular weight of 12,000 in 90 g of anisole, followed by heating the coating at 160° C. for 90 seconds by using a hot plate.

(T2): The $SiO_2$ film was coated by a spin coating method with a solution prepared by dissolving 10 g of the organosilicon compound (n/m=¼) represented by the chemical formula [1-95] and having a weight average molecular weight of 12,000 in 90 g of anisole, followed by heating the coating at 160° C. for 90 seconds by using a hot plate.

(T3): The $SiO_2$ film was coated by a spin coating method with a solution prepared by dissolving 9.9 g of the organosilicon compound (n/m=¼) represented by the chemical formula [1-93] and having a weight average molecular weight of 12,000 and 0.1 g of fralen (C60) used as a charge generator in 90 g of anisole, followed by heating the coating at 160° C. for 90 seconds by using a hot plate.

(T4): The $SiO_2$ film was coated by a spin coating method with a solution prepared by dissolving 9.9 g of the organosilicon compound (n/m=¼) represented by the chemical formula [1-98] and having a weight average molecular weight of 18,000 and 0.1 g of fralen (C60) used as a charge generator in 90 g of anisole, followed by heating the coating at 160° C. for 90 seconds by using a hot plate.

(T5): The $SiO_2$ film was coated by a spin coating method with a solution prepared by dissolving 9.9 g of the organosilicon compound (n/m=¼) represented by the chemical formula [1-56] and having a weight average molecular weight of 13,000 and 0.1 g of fralen (C60) used as a charge generator in 90 g of anisole, followed by heating the coating at 160° C. for 90 seconds by using a hot plate.

(T6): The $SiO_2$ film was coated by a spin coating method with a solution prepared by dissolving 8.8 g of the organosilicon compound represented by the chemical formula [1-1] and having a weight average molecular weight of 3,000, 1 g of the crosslinking agent represented by chemical formula [3-60], and 0.2 g of azobisisobutyronitrile used as a radical generator in 90 g of anisole, followed by heating the coating at 160° C. for 10 minutes under a nitrogen atmosphere having an oxygen concentration of 50 ppm or less.

(T7): The underlying film was prepared as in the method (S7) employed in Example 1.

(T8): The underlying film was prepared as in the method (S8) employed in Example 1.

(T9): The underlying film was prepared as in the method (S9) employed in Example 1.

(T10): The underlying film was prepared as in the method (S10) employed in Example 1.

(T11): The underlying film was prepared as in the method (S11) employed in Example 1.

(T12): The underlying film was prepared as in the method (S12) employed in Example 1.

The sheet resistance of the underlying film prepared by any of the methods (T1) to (T12) was measured, with the results as shown in Table 4.

TABLE 4

| Underlying film | Complex refractive index | Sheet resistance [Ω/□] | Focus allowance [μm] | Amount of positional deviation |
|---|---|---|---|---|
| (T1) | n = 2.01, k = 0.30 | $5 \times 10^{17}$ | 0.6 | 6 |
| (T2) | n = 2.03, k = 0.31 | $5 \times 10^{17}$ | 0.7 | 8 |
| (T3) | n = 2.05, k = 0.29 | $6 \times 10^{17}$ | 0.7 | 8 |
| (T4) | n = 2.01, k = 0.29 | $7 \times 10^{18}$ | 0.7 | 8 |
| (T5) | n = 2.01, k = 0.29 | $3 \times 10^{17}$ | 0.6 | 9 |

TABLE 4-continued

| Underlying film | Complex refractive index | Sheet resistance [Ω/□] | Focus allowance [μm] | Amount of positional deviation |
|---|---|---|---|---|
| (T6) | n = 2.06, k = 0.38 | 6 × 10$^{17}$ | 0.8 | 9 |
| (T7) | Same as (S7) | Same as (S7) | 0.6 | 9 |
| (T8) | Same as (S8) | Same as (S8) | 0.8 | 8 |
| (T9) | Same as (S9) | Same as (S9) | 0.7 | 8 |
| (T10) | Same as (S10) | Same as (S10) | 0.7 | 8 |
| (T11) | Same as (S11) | Same as (S11) | 0.6 | 9 |
| (T12) | Same as (S12) | Same as (S12) | 0.7 | 9 |

As apparent from Table 4, any of the underlying films exhibited a sheet resistance higher than 1×10$^{17}$ Ω/□, supporting that these underlying films were insulators. Further, the complex refractive index of the underlying film at the light wavelength of 248 nm in the light exposure step was measured by using a spectral eripsometer, with the results as shown in Table 4. As apparent from Table 4, any of the underlying film was found to have a complex refractive index adapted for suppressing the reflection of the light for the light exposure and, thus, found to act as an antireflection film in the light exposure step.

In the next step, a resist film was formed on the underlying film as in Example 1.

Further, the resist film was exposed to light and to an electron beam in a test pattern which was equal to that in Example 1. In the first step, the resist film was selectively exposed to light in a pattern by using a reduced optical type stepper including a KrF excimer laser as a light source at a light exposure dose of 25 mJ/cm$^2$ so as to form a latent image having a pattern of contact holes arranged at a pitch of 300 μm and each having a diameter of 0.20 μm. The upper surface of the resist film is exposed to an atmosphere (i.e., insulating atmosphere) at a light exposure.

Then, a latent image having a pattern of space turns arranged at a pitch of 300 μm and each having a width of 0.1 μm was formed by using a variable forming type electron beam image-depicting apparatus under an accelerating energy of 50 keV and a current density of 5A/cm$^2$.

Then, a post-exposure baking was applied to the wafer at 110° C. for 90 seconds by using a hot plate, followed by performing a developing treatment by using a tetramethyl ammonium hydroxide solution of 0.21N so as to form a resist pattern.

A cross section of the contact hole pattern formed by the light exposure was observed with SEM. It was found that obtained was a contact hole pattern of a good profile free from footing and having a vertical side wall, as shown in FIG. 1F. Further, the focus allowance at a fixed light exposure dose of 25 mJ/cm$^2$ was examined, with the results as shown in Table 4.

As apparent from Table 4, the focus allowance was at least 0.6 μm in any of the cases, supporting a sufficiently large process allowance. It is considered reasonable to understand that a good profile was obtained with a large process allowance because the underlying film was an insulator in the step of the light exposure, as already described in conjunction with Example 1. Incidentally, Example 5 was equal to Example 1 in that footing was not observed in the groove pattern formed by the electron beam exposure.

The amount of positional deviation caused by the charge accumulation in the step of the electron beam exposure was measured as in Example 1, with the results as shown in Table 4. As apparent from Table 4, the amount of positional deviation was smaller than the allowable level of 10 nm. If the electrical resistance of the underlying film during the electron beam irradiation was equal to that before the irradiation, supporting that the underlying film was an insulator, a positional deviation larger than 10 μm must have taken place in view of the experimental data in Example 1 in which the underlying film was formed of an insulating material. In Example 5, however, the amount of positional deviation was smaller than the allowable level of 10 nm. It is considered reasonable to understand that the electrical resistance of the organosilicon compound within the underlying film is lowered at the charged beam exposure and, thus, to suppress the positional deviation.

As described above, in the case of using an underlying film containing an organosilicon compound having a silicon-to-silicon bond, the positional deviation caused by charge accumulation can be prevented without employing light irradiation in the step of the electron beam exposure, making it possible to obtain a resist pattern of a good profile with a large process allowance in the step of the light exposure.

EXAMPLE 6

This Example is directed to the third embodiment of the present invention.

In the first step, a SiO$_2$ film 12 was formed on a silicon wafer 11 as in Example 1, followed by forming an antireflection film 13 consisting of an insulating material on the SiO$_2$ film 12 in order to prevent the reflection of the light used for the light exposure from the SiO$_2$ film 12, as shown in FIG. 3A. The insulating film formed by the method (I3) in Example 1 was used as the antireflection film 13, which was 40 nm thick.

Then, a resist film 14 was formed on the antireflection film 13 as in Example 1, as shown in FIG. 3B, followed by applying light exposure to the resist film 14 as in Example 1 so as to form a latent image 15, as shown in FIG. 3C. Further, the wafer 11 was heated at 110° C. for 90 seconds by using a hot plate so as to perform a post-exposure baking.

Further, an upper film 16 consisting of a conductive material was formed in a thickness of 40 nm on the resist film 14, as shown in FIG. 3D. The upper film 16 was formed by each of methods (U1) to (U6) given below:

(U1): The resist film 14 was coated by a spin coating method with a solution prepared by dissolving 10 g of the conductive material (M=CH$_3$) represented by chemical formula [12-1] in 90 g of pure water, followed by heating the coating at 100° C. for 5 minutes by using a hot plate.

(U2): The resist film 14 was coated by a spin coating method with a solution prepared by dissolving 10 g of the conductive material represented by chemical formula [12-2] in 90 g of pure water, followed by heating the coating at 100° C. for 5 minutes by using a hot plate.

(U3): The resist film 14 was coated by a spin coating method with a solution prepared by dissolving 10 g of the conductive material represented by chemical formula [12-7] in 90 g of pure water, followed by heating the coating at 100° C. for 5 minutes by using a hot plate.

(U4): The resist film 14 was coated by a spin coating method with a solution prepared by dissolving 3 g of amylose and 7 g of the conductive material (M=CH$_3$) represented by chemical formula [12-8] in 90 g of pure water, followed by heating the coating at 100° C. for 5 minutes by using a hot plate.

(U5): The resist film 14 was coated by a spin coating method with a solution prepared by dissolving 5 g of amylose and 5 g of a photoconductive material TCNQ in 90 g of pure water, followed by heating the coating at 100° C. for 5 minutes by using a hot plate. Further, the coating was irradiated with an i-ray (wavelength of 365 nm) emitted from a mercury lamp at a dose of 1 J/cm$^2$ so as to make the coating electrically conductive.

(U6): The resist film 14 was coated by a spin coating method with a solution prepared by dissolving 5 g of amylose and 5 g of a photoconductive sulfonimide in 90 g of pure water, followed by heating the coating at 100° C. for 5 minutes by using a hot plate. Further, the coating was irradiated with KrF excimer laser light (wavelength of 248 nm) at a dose of 1 J/cm$^2$ so as to make the coating electrically conductive.

The sheet resistance of the upper film formed by each of the methods (U1) to (U6) was measured, with the results as shown in Table 5:

TABLE 5

| Underlying film | Sheet resistance [Ω/□] | Focus allowance [μm] | Focus allowance without baking after light exposure [μm] |
| --- | --- | --- | --- |
| (U1) | 5 × 10$^{-2}$ | 0.6 | 0.6 |
| (U2) | 5 × 10$^{-2}$ | 0.7 | 0.6 |
| (U3) | 6 × 10$^{-3}$ | 0.7 | 0.6 |
| (U4) | 7 × 10$^{-3}$ | 0.7 | 0.6 |
| (U5) | 3 × 10$^{-3}$ | 0.6 | 0.6 |
| (U6) | 6 × 10$^{-3}$ | 0.8 | 0.7 |

Then, a latent image 17 was formed by an electron beam exposure as in Example 3, as shown in FIG. 3E. Further, the wafer 11 was heated at 110° C. for 90 seconds by using a hot plate so as to perform a post-exposure baking, followed by performing a developing treatment by using a tetramethyl ammonium hydroxide solution of 0.21N so as to form a resist pattern, as shown in FIG. 3F. The upper film 17 was dissolved in the developing solution so as to be removed during the developing treatment.

A cross section of the contact hole pattern formed by the light exposure was observed with SEM. It was found that obtained was a contact hole pattern of a good profile free from footing and having a vertical side wall, as shown in FIG. 1F. Further, the focus allowance was examined as in Example 1, with the results as shown in Table 5.

As apparent from Table 5, the focus allowance was at least 0.6 μm in any of the cases, supporting a sufficiently large process allowance. It is considered reasonable to understand that a good profile was obtained with a large process allowance because the underlying film was an insulating film in the step of the light exposure, as already described in conjunction with Example 1.

The amount of positional deviation caused by the charge accumulation in the step of the electron beam exposure was measured as in Example 1, with the result that the amount of positional deviation was smaller than the measurable limit of 1 nm. It is considered reasonable to understand that, since the conductive upper film was formed after the light exposure step, the charge accumulation was prevented so as to markedly suppress the positional deviation caused by charge accumulation.

The post-exposure baking (PEB) step interposed between the light exposure step and the electron beam exposure step can be omitted in this embodiment. A resist pattern was formed as above except that the post-exposure baking was omitted, and the focus allowance was measured, with the results as shown in Table 5. In this case, the post-exposure baking was performed only after the electron beam exposure.

As apparent from Table 5, the focus allowance was found to be on an allowable level of 0.6 μm, which was lower than the focus allowance in the case where the baking was performed intermediate between the light exposure step and the electron beam exposure step. It is considered reasonable to understand that the acid generated by the light exposure was diffused into the upper film in the step of the post-exposure baking which was carried out after the electron beam exposure step, with the result that a clear latent image was unlikely to be formed so as to suppress the focus allowance.

The acid generated within the resist film by the electron beam exposure is also diffused into the upper film. However, the focus allowance in the electron beam exposure is scores of micrometers, which is scores of times as much as the focus allowance in the light exposure. Therefore, a sufficient focus allowance can be obtained even if the latent image is deteriorated by the acid diffusion and, thus, the acid diffusion need not be worried about. It follows that, in the third embodiment of the present invention, it is desirable to carry out the light exposure, the post-exposure baking, forming a conductive upper film, the charged beam exposure, and the post-exposure baking in the order mentioned, though it is acceptable to carry out the post-exposure baking after completion of the light exposure and the electron beam exposure.

As described above, in the hybrid exposure utilizing in combination the light exposure and the electron beam exposure, the process allowance in the light exposure step can be widened by interposing the coating step of the conductive upper film between the light exposure step and the electron beam exposure step, making it possible to prevent the positional deviation caused by the charge up in the charged beam exposure step.

EXAMPLE 7

This Example is directed to the fourth embodiment of the present invention, and the direct aligning method between the light exposure pattern and the charged beam exposure pattern within the same layer will be described with reference to FIGS. 12A to 12E.

In the first step, a TEOS oxide film 301, which is a work film, was formed by an LPCVD method in a thickness of 700 nm on a silicon wafer (not shown), followed by forming on the TEOS oxide film 301 an underlying film 302 by each of the methods (S1) to (S18) employed in Example 1 and the methods (T1) to (T12) employed in Example 5. The underlying film 302 was formed in a thickness of 100 nm. Further, a resist film 303 was formed as in Example 1 in a thickness of 150 nm on the underlying film 302.

Then, the resist film was exposed to light and to an electron beam, i.e., hybrid exposure using light and electron beam, in a test pattern which permits monitoring the aligning accuracy between the light exposure pattern and the electron beam exposure pattern within the same layer and also permits monitoring the positional deviation of the electron beam exposure pattern caused by charge up.

In the next step, the resist film was selectively exposed to light in a pattern by using a reduced optical type stepper including a KrF excimer laser as a light source at an exposure amount of 20 mJ/cm² so as to form a latent image 304 having a line-and-space pattern. Then, the resist film 303 was irradiated with an electron beam 305 under an accelerating energy of 1.8 keV by using an electron beam exposure apparatus so as to detect the position information of the latent image 304. Then, the pattern of the electron beam exposure was corrected appropriately based on the position information of the latent image 304, followed by irradiating the resist film 303 with an electron beam under an accelerating energy of 50 keV at a dose of 10 μC/cm² so as to form a latent image 306 of a contact hole pattern along the center of the space of the latent image 304 of the line-and-space pattern, as shown in FIG. 12D.

Incidentally, the electron beam exposure was applied to the region 305 of the resist film positioned on the underlying film formed by any of methods (S1) to (S18) described previously while irradiating the underlying film with light to impart photoconductivity to the underlying film. The irradiation method, wavelength and dose of the light for this light irradiation were equal to those in Example 1. The electron beam exposure was applied to the underlying film formed by the method (T1) to (T12) without light exposure.

Finally, a post-exposure baking was performed at 120° C. for 90 seconds by using a hot plate, followed by a developing treatment for 60 seconds using a TMAH developing solution of 0.21N so as to form a resist pattern 307 as shown in FIG. 12E, in which the centers of the contact holes 306 each having a diameter of 0.15 μm and arranged at a pitch of 0.25 μm are positioned on a center line 308 of the line-and-space pattern of 0.25 μm.

It should be noted that the line pattern of 0.25 μm was 5 μm long, and 100 line patterns were included in a shot. Concerning the resist pattern formed on each of the underlying films, an average value of the positional deviation amount 403 was obtained within a chip positioned in a central portion of the wafer, said positional deviation amount 403 being defined as a distance between a point 401 on which the center of the contact hole was to be positioned in design and a center point 402 of the actually formed contact hole. The average values of the positional deviation are shown in Tables 6 and 7 in respect of each of the underlying films.

As apparent from Tables 6 and 7, the positional deviation amount in each of the underlying films was found to be substantially smaller than an allowable level of 30 nm, supporting that the light exposure pattern and the electron beam exposure pattern were aligned with each other at a high accuracy. Where the underlying film contains an organosilicon compound having a silicon-to-silicon backbone chain as in the present invention, it is not absolutely necessary to perform the electron beam exposure while irradiating the underlying film with light to impart photoconductivity to the underlying film. However, the aligning accuracy in the case of using the underlying films formed by the methods of (S7) to (S12) is higher than that in the case of using the underlying films formed by the methods of (T7) to (T12), supporting that it is desirable to perform the electron beam exposure while irradiating the underlying film with light.

TABLE 6

| Underlying | Positional deviation [nm] | |
| film | Example 7 | Example 8 |
| --- | --- | --- |
| (S1) | 20 | 19 |
| (S2) | 22 | 18 |
| (S3) | 18 | 19 |
| (S4) | 22 | 20 |
| (S5) | 19 | 20 |
| (S6) | 22 | 23 |
| (S7) | 18 | 20 |
| (S8) | 15 | 21 |
| (S9) | 17 | 22 |
| (S10) | 18 | 23 |
| (S11) | 19 | 21 |
| (S12) | 17 | 18 |
| (S13) | 16 | 17 |
| (S14) | 18 | 16 |
| (S15) | 17 | 16 |
| (S16) | 18 | 18 |
| (S17) | 18 | 17 |
| (S18) | 17 | 18 |

TABLE 7

| Underlying film | Positional deviation [nm] |
| --- | --- |
| (T1) | 29 |
| (T2) | 28 |
| (T3) | 27 |
| (T4) | 29 |
| (T5) | 30 |
| (T6) | 29 |
| (T7) | 29 |
| (T8) | 28 |
| (T9) | 29 |
| (T10) | 30 |
| (T11) | 29 |
| (T12) | 28 |

As apparent from the experimental data, where a latent image is formed within a resist film by light exposure, the acid generated from the acid generator is unlikely to be diffused into the underlying film, which is an insulating film, making it possible to obtain a clear latent image and to form a light exposure pattern and an electron beam exposure pattern within the same layer at a high accuracy by the direct alignment. Also, in the step of the charged beam exposure, the underlying film is irradiated with light to make the underlying film photoconductive, making it possible to form a pattern free from positional deviation caused by charge up. As a result, a pattern formation can be performed with a high superposing accuracy.

Comparative Example 1

This Comparative Example is equal to Example 7, except that an insulating underlying film was used in this Comparative Example.

In the first step, a TEOS oxide film was formed as a work film in a thickness of 700 nm by an LPCVD method on a silicon wafer, followed by coating the TEOS oxide film by a spin coating method with a solution prepared by dissolving log of polyimide in 90 g of cyclohexane. Then, the coating was baked at 220° C. for 60 seconds to form an underlying film having a thickness of 120 nm.

The complex refractive index of the underlying film measured by a spectral eripsometer at a wavelength of 248 nm was found to be: n=1.75, k=0.22, and was also found to absorb light having a wavelength of 248 nm so as to act as an antireflection film in the light exposure step. Also, the photoconductivity was measured as in Example 1, with the result that the underlying film, even if irradiated with light, did not exhibit photoconductivity with any of the negative and positive charges kept deposited on the underlying film.

Then, a resist film was formed on the underlying film as in Example 7, except that the underlying film was not irradiated with light, though the underlying film was irradiated with light in Example 7 to impart photoconductivity to the underlying film. Further, the amount of positional deviation between the center of the line pattern and the center of the contact hole pattern was measured, with the result that the average value of the positional deviation was found to be 82 nm, which far exceeded the allowable limit of 30 nm. This clearly supports that the superposing accuracy was not satisfactory. It is considered reasonable to understand that, since the underlying film consists of an insulator, electrons are accumulated in the resist film in the step of the electron beam exposure to present a charge up state, with the result that the running path of the incident electron beam is bent so as to impair the superposing accuracy.

Comparative Example 2

This Comparative Example is equal to Example 7, except that a conductive underlying film was used in this Comparative Example.

In the first step, a TEOS oxide film was formed by an LPCVD method as a work film in a thickness of 700 nm on a silicon wafer, followed by forming a carbon film as an underlying film on the TEOS oxide film by a sputtering method. The complex refractive index of the underlying film measured by a spectral eripsometer at a wavelength of 248 nm was found to be: n=1.52, k=0.69, and was also found to absorb light having a wavelength of 248 nm so as to act as an antireflection film in the light exposure step. Also, the photoconductivity was measured as in Example 1, with the result that, since the underlying film consisting of a carbon film exhibits conductivity, any of the negative and positive charges was not deposited on the underlying film regardless of irradiation or non-irradiation of light.

Figure 14:
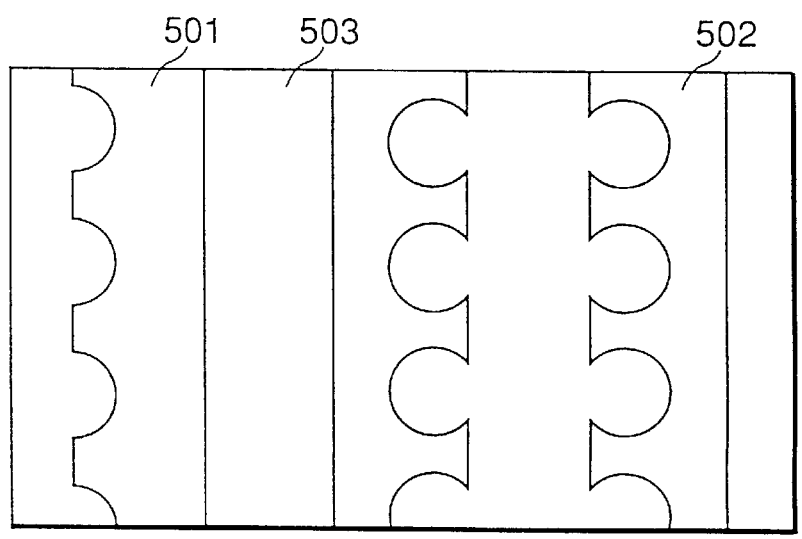
FIG. 14 shows the state that a. resist pattern is not aligned satisfactorily.

Then, a resist pattern was formed by selectively exposing a resist film to light in a pattern, as in Example 7, except that the underlying film was not irradiated with light, though the underlying film was irradiated with light in Example 7 to impart photoconductivity to the underlying film. The resist pattern was observed from above with an electron microscope, with the result as shown in FIG. 14. As seen from the drawing, the aligning was not satisfactory. Specifically, the contact hole pattern 502 was found to come out of the line pattern 501, or the contact holes were found to overlap with each other. It is considered reasonable to understand that, since the underlying film 503 was a conductor, a clear latent image was not formed by the light exposure, leading to a poor S/N ratio in terms of the position information of the latent image. As a result, the position of the electron beam exposure was not determined accurately, leading to the unsatisfactory alignment.

EXAMPLE 8

This Example is directed to a modification of the fourth embodiment of the present invention, and the direct aligning method between the substrate pattern and the charged beam exposure pattern will be described with reference to FIGS. 15A to 15D.

In the first step, a line-and-space pattern 601 of 0.25 μm consisting of a TEOS oxide film was formed in a thickness of 100 nm on a silicon wafer (not shown). Then, an underlying film was formed by each of the methods (S1) to (S18) employed in Example 1. As a result, the free space between adjacent oxide films 601 was filled with the material of the underlying film to form an underlying film 602 having a flat surface. The distance between the upper surface of the oxide film 601 and the upper surface of the underlying film 602 was 100 nm.

Figure 15A:
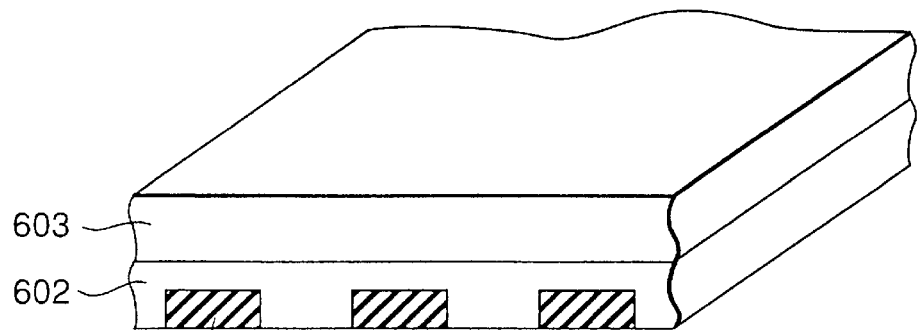
FIGS. 15A to 15D are oblique views collectively showing a pattern forming method according to a modification of the fourth embodiment of the present invention.

In the next step, an electron beam exposure was performed to form a test pattern which permits monitoring the aligning accuracy between the substrate pattern, i.e., the oxide film pattern 601, and the electron beam exposure pattern. To be more specific, the underlying film 602 was coated by a spin coating method with a resist solution as in Example 1, followed by a pre-baking treatment to heat the coating at 120° C. for 90 seconds by using a hot plate so as to form a resist film 603 having a thickness of 150 nm, as shown in FIG. 15A.

Figure 15B:
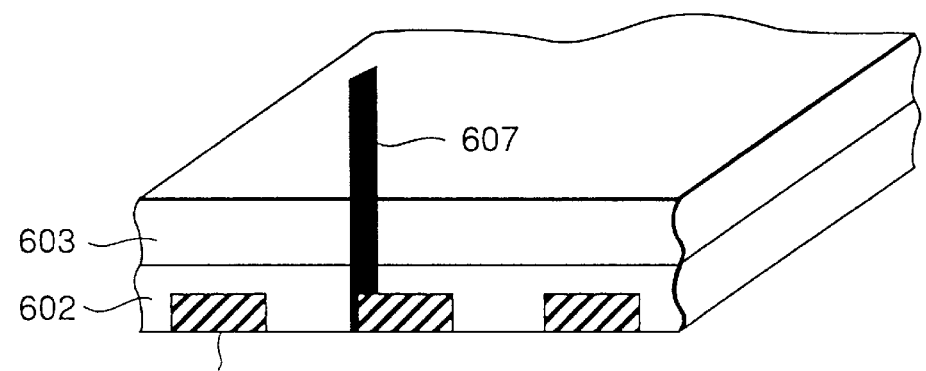
Figure 15C:
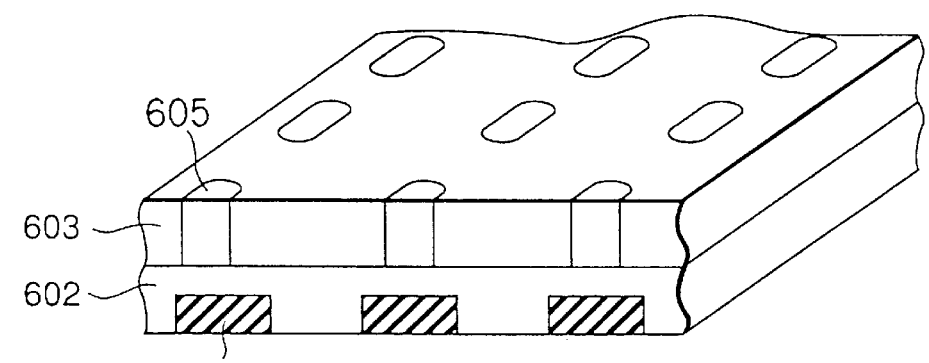

Then, the resist film was irradiated with an electron beam 607 under an accelerating energy of 1.8 keV by using an electron beam exposing apparatus so as to detect the position information of the oxide film pattern 601, as shown in FIG. 15B. Further, the pattern position of the electron beam exposure was corrected on the basis of the detected position information, followed by irradiating the resist film with an electron beam under an accelerating energy of 50 keV and at a dose of 10 μC/cm² so as to form a latent image 605 of a pattern of contact holes each having a diameter of 0.15 μm and arranged 0.25 μm apart from each other, as shown in FIG. 15C.

Figure 15D:
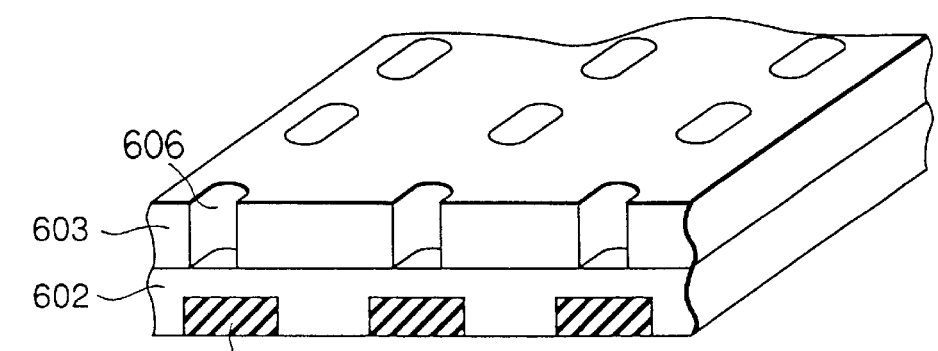

Further, a post-exposure baking was performed at 120° C. for 90 seconds by using a hot plate, followed by a developing treatment for 60 seconds with a TMAH developing solution of 0.21N so as to form a pattern 606 of contact holes each having a diameter of 0.15 μm, as shown in FIG. 15D. Incidentally, the resist film formed on each of the underlying films formed by the methods (S1) to (S18) was irradiated with light during the electron beam irradiation. The light irradiating method, the wavelength of the light used and the light irradiating amount were equal to those in Example 1. Also, the oxide film pattern was 5 μm long, and 100 oxide film patterns were formed in a single chip.

An average value of the positional deviation amount 703 was obtained within a chip positioned in a central portion of the wafer, said positional deviation amount 703 being defined as a distance between a point 701 on which the center of the contact hole was to be positioned in design and a center point 702 of the actually formed contact hole. The results are shown in Table 6. As apparent from Table 6, the positional deviation amount in each of the underlying films was found to be substantially smaller than an allowable level of 30 nm, supporting that the light exposure pattern and the electron beam exposure pattern were aligned with each other at a high accuracy.

During detection of the position information of the pattern formed within the substrate below the resist film, the electrons irradiated for the position information, the electrons reflected from the substrate pattern or the secondary electrons are not diffused within the underlying film because the underlying film is an insulator. As a result, the position information can be detected accurately, making it possible to form a resist pattern with a high superposing accuracy. Also, during the electron beam exposure, the underlying film can be made conductive by irradiating the underlying film with light, making it possible to form a pattern free from positional deviation caused by charge up. As a result, a pattern can be formed with a high superposing accuracy.

Comparative Example 3

This Comparative Example is equal to Example 8, except that an insulating underlying film was used in this Comparative Example.

In the first step, a line-and-space pattern of 0.25 $\mu$m consisting of a TEOS oxide film was formed in a thickness of 100 nm on a silicon wafer (not shown). Then, an underlying film was formed by coating the line-and-space pattern by a spin coating method with a solution prepared by dissolving 10 g of polyimide in 90 g of cyclohexane, followed by heating the coating at 220° C. for 90 seconds by using a hot plate. As a result, the free space between adjacent oxide films of the pattern was filled with the material of the underlying film to form an underlying film having a flat surface. The distance between the upper surface of the patterned oxide film and the upper surface of the underlying film was 100 nm.

Then, a pattern of contact holes each having a diameter of 0.15 $\mu$m was formed as in Example 8. The amount of positional deviation was measured as in Example 8, with the result that the average value of the positional deviation was 76 nm, which exceeds an allowable limit of 30 nm, indicating that the superposing accuracy was not satisfactory. It is considered reasonable to understand that, since the underlying film consisted of an insulator, electrons were accumulated in the resist film in the step of the electron beam exposure so as to present a charge up state and, thus, to deflect the running path of the incident electron beam. As a result, the superposing accuracy is considered to have been made unsatisfactory.

Comparative Example 4

This Comparative Example is equal to Example 8, except that a conductive underlying film was used in this Comparative Example.

In the first step, a line-and-space pattern of 0.25 $\mu$m consisting of a TEOS oxide film was formed in a thickness of 100 nm on a silicon wafer. Then, an underlying film was formed by coating the line-and-space pattern by a spin coating method with a solution prepared by dissolving 1 g of carbon powder and 9 g of polyimide in 90 g of cyclohexane, followed by heating the coating at 220° C. for 90 seconds by using a hot plate. As a result, the free space between adjacent oxide films of the pattern was filled with the material of the underlying film to form an underlying film having a flat surface. The distance between the upper surface of the patterned oxide film and the upper surface of the underlying film was 100 nm.

The photoconductivity was examined as in Example 8. It has been found that, since the carbon powder contained in the underlying film is electrically conductive, any of the negative and positive charges was not deposited on the underlying film whether the underlying film was irradiated or not irradiated with light.

In the next step, it was attempted to form a pattern of contact holes each having a diameter of 0.15 $\mu$m as in Example 8. However, a position information of the oxide film pattern was not detected, resulting in failure to form the pattern. It is considered reasonable to understand that, since the underlying film consisted of a conductive film, the electrons including those reflected from the substrate pattern and secondary electrons are diffused within the underlying film, resulting in failure to detect the position information of the substrate pattern.

EXAMPLE 9

This Example relates to the fourth embodiment of the present invention.

A work film, resist film, and an upper film were formed in this order as in Example 3. The resist film was exposed to light and to an electron beam to form a test pattern as in Example 7. In the step of the electron beam exposure, a light exposure were applied to the upper film to impart photoconductivity thereto as in Example 3.

Then, a post-exposure baking and developing treatment were carried out, and thus forming a resist pattern in Example 7.

The average value of the positional deviation was examined as in Example 7, and found to be 20 nm which was smaller than an allowable level of 30 nm, supporting that the light exposure and the electron beam exposure pattern were aligned with each other at a high accuracy.

Thus, where a latent image is formed within a resist film by light exposure, the conductive material generated from the acid generator is unlikely to be diffused into the underlying film and the upper film, which is an insulating film, making it possible to obtain a clear latent image and to form a light exposure pattern and an electron beam exposure pattern within the same layer at a high accuracy by the direct alignment. Also, in the step of the charged beam exposure, the upper film is irradiated with light to make the underlying film photoconductive, making it possible to form a pattern free from positional deviation caused by charge up. As a result, a pattern formation can be performed with a high superposing accuracy.

EXAMPLE 10

This Example relates to the fourth embodiment of the present invention.

A work film, resist film, and an upper film were formed in this order as in Example 4. The resist film was exposed to light and to an electron beam to form a test pattern as in Example 8. In the step of the electron beam exposure, a light exposure were applied to the upper film to impart photoconductivity thereto as in Example 4.

Then, a post-exposure baking and developing treatment were carried out, and thus forming a resist pattern as in Example 8.

The average value of the positional deviation was examined as in Example 8, and found to be 20 nm which was smaller than an allowable level of 30 nm, supporting that the light exposure and the electron beam exposure pattern were aligned with each other at a high accuracy.

Thus, where a latent image is formed within a resist film by light exposure, the conductive material generated from the acid generator is unlikely to be diffused into the underlying film and the upper film, which is an insulating film, making it possible to obtain a clear latent image and to form a light exposure pattern and an electron beam exposure pattern within the same layer at a high accuracy by the direct alignment. Also, in the step of the charged beam exposure, the upper film is irradiated with light to make the underlying film photoconductive, making it possible to form a pattern free from positional deviation caused by charge up. As a result, a pattern formation can be performed with a high superposing accuracy.

EXAMPLE 11

In this Example, a position information of a latent image of a light exposure pattern was detected by a direct aligning method between a light exposure pattern and an electron beam exposure pattern within the same layer, followed by irradiating the underlying film with light to impart photoconductivity to the underlying film and subsequently performing the charged beam exposure.

In the first step, a TEOS oxide film was formed on a silicon wafer, as in Example 7, followed by forming an underlying film by the method (S7) described in Example 1. The underlying film was irradiated with light emitted from a halogen lamp and having a wavelength of 380 nm at a dose of 100 mJ/cm$^2$ by the method described in Example 1 so as to examine the photoconductivity of the underlying film. It has been found that the underlying film, which was an insulating film before the light irradiation, was allowed to exhibit photoconductivity after the light irradiation in respect of any of the positive and negative charges. The same experiment was applied again to the underlying film once irradiated with light. It has been found that any of the positive and negative charges was not deposited on the underlying film, supporting that the photoconductivity was maintained. In other words, irreversibility of photoconductivity was recognized in the underlying film formed by the method (S7).

In the next step, the underlying film was coated by a spin coating method with a resist solution equal to that used in Example 1, followed by pre-baking the coating at 120° C. for 90 seconds by using a hot plate so as to form a resist film having a thickness of 150 nm. Then, the resist film was exposed to light in a pattern at a dose of 20 mJ/cm$^2$ by using a reduced optical stepper including a KrF excimer laser light as a light source so as to form a latent image of a line-and-space pattern of 0.25 $\mu$m within the resist film.

Then, a light exposure step was carried out by using a test pattern employed in Example 7. The resist film was irradiated with an electron beam under an accelerating energy of 1.8 keV by using an electron beam exposing apparatus so as to detect the position information of the latent image of the line-and-space pattern. Further, the resist film was irradiated from above with light having a wavelength of 380 nm, which was taken by a spectroscope from the light emitted from a halogen lamp, at a dose of 100 mJ/cm$^2$ so as to impart photoconductivity to the underlying film. Still further, the pattern position of the electron beam exposure was corrected appropriately on the basis of the position information of the latent image, and the resist film was irradiated with an electron beam under an accelerating energy of 50 keV and at a dose of 10 $\mu$C/cm$^2$ so as to form a latent image of contact holes each having a diameter of 0.15 $\mu$m and arranged 0.25 $\mu$m apart from each other such that the center of the latent image of the contact hole pattern is positioned on the center line of the line portion, in which a latent image was not formed, of the line-and-space pattern.

Finally, a post-exposure baking was performed at 120° C. for 60 seconds by using a hot plate, followed by a developing treatment for 60 seconds with a TMAH developing solution of 0.21N so as to form a resist pattern, in which the center of the pattern of contact holes each having a diameter of 0.15 $\mu$m and arranged 0.25 $\mu$m apart from each other was positioned on the center line of the line-and-space pattern of 0.25 $\mu$m.

The positional deviation was measured as in Example 7. It has been found that the average value of the positional deviation was 18 nm, which was within an allowable level of 30 nm, supporting that the charged beam pattern was aligned at a high accuracy with the light exposure pattern.

As described above, where a latent image is formed within a resist film by light exposure, the acid generated from the acid generator is unlikely to be diffused into the underlying film because the underlying film is an insulator. As a result, a clear latent image can be obtained, making it possible to form a light exposure pattern and a charged beam exposure pattern within the same layer at a high accuracy by a direct alignment. Also, in the case of a charged beam exposure, the underlying film can be made conductive by irradiating the underlying film with light, making it possible to form a pattern free from positional deviation caused by charge up.

As a result, it is possible to carry out a pattern formation with a high superposing accuracy. It should be noted that, in the case of using a material whose photoconductivity is irreversible, it is possible to make the underlying film insulating in the step of the light exposure and conductive in the step of forming a charged beam pattern, even if the underlying film is not irradiated with light during the charged beam exposure.

EXAMPLE 12

This Example is directed to a direct alignment between a substrate pattern and a charged beam exposure pattern within the same layer, and covers the case where the underlying film is irradiated with light to impart photoconductivity to the underlying film after detection of the position information of a substrate pattern, followed by performing a charged beam exposure.

In the first step, a line-and-space pattern of 0.25 $\mu$m consisting of a TEOS oxide film was formed in a thickness of 100 nm on a silicon wafer. Then, an underlying film was formed by forming an underlying film on the line-and-space pattern by the method of (S7) described in Example 1. As a result, the free space between adjacent oxide films of the pattern was filled with the material of the underlying film to form an underlying film having a flat surface. The distance between the upper surface of the patterned oxide film and the upper surface of the underlying film was 100 nm.

In the next step, the underlying film was coated in a thickness of 600 nm by a spin coating method with a resist solution prepared as in Example 1, followed by pre-baking the resist coating at 120° C. for 90 seconds by using a hot plate. Then, the resist film was irradiated with an electron beam under an accelerating energy of 8 keV by using an electron beam exposure apparatus so as to detect the position information of the oxide film pattern. Further, the wafer surface was irradiated from above the resist film with light having a wavelength of 380 nm, which was taken by a spectroscope from the light emitted from a halogen lamp, at a dose of 200 mJ/cm$^2$ so as to impart photoconductivity to the underlying film.

In the next step, the pattern position of the electron beam exposure was corrected, in the same manner as Example 8, on the basis of the position information of the oxide film, and the resist film was irradiated with an electron beam under an accelerating energy of 50 keV at a dose of 10 $\mu$C/cm$^2$ so as to form a latent image of a pattern of contact holes each having a diameter of 0.15 $\mu$m and arranged 0.25 $\mu$m apart from each other such that the center of the contact hole pattern is positioned on the center line of the oxide film pattern. Then, a post-exposure baking was performed at 120° C. for 90 seconds by using a hot plate, followed by a developing treatment for 60 seconds with a TMAH developing solution of 0.21N so as to form a pattern of contact holes each having a diameter of 0.15 $\mu$m.

The positional deviation between the oxide film pattern and the contact hole pattern was measured as in Example 8.

The average deviation was found to be 23 nm, which is smaller than the allowable limit of 30 nm, supporting that the charged beam pattern was aligned with the oxide film pattern with a high accuracy.

It should be noted that, in the step of detecting the position information of a pattern formed within the substrate below the resist film, the electrons emitted for detecting the position information, the electrons reflected from the substrate pattern, or the secondary electrons are not diffused into the underlying film because the underlying film is an insulator in this step. As a result, the position information can be detected accurately, making it possible to form a resist pattern with a high superposing accuracy. Also, the underlying film is irradiated with light during the electron beam exposure so as to impart conductivity to the underlying film, making it possible to form a pattern free from a positional deviation caused by charge up in the step of the electron beam exposure.

As a result, a pattern formation can be perform ed with a high superposing accuracy. In the case of using a material whose photoconductivity is irreversible as in Example 7 and 8, it is possible to make the underlying film insulating in the step of the light exposure and conductive in the step of forming a charged beam pattern, even if the underlying film is not irradiated with light during the charged beam exposure.

As described above in detail, the present invention provides a pattern forming method employing a hybrid exposure in which a light exposure and a charged beam exposure are utilized in combination. In the present invention, the film positioned immediately above and below the resist film acts as an insulating film in the step of the light exposure and the film positioned immediately above or below the resist film acts as a conductive film in the step of the charged beam exposure. As a result, it is possible to obtain a resist pattern free from a positional deviation caused by a charge accumulation in the step of the charged beam exposure. Also, the resist pattern can be obtained with a large process allowance in the step of the light exposure. In addition, it is possible to improve the accuracy of alignment between the light exposure pattern and the charged beam pattern within the same layer.

Additional advantages and modifications will readily occur to those skilled in the art. Therefore, the invention in its broader aspects is not limited to the specific, details and representative embodiments shown and described herein. Accordingly, various modifications may be made without departing from the spirit or scope of the general inventive concept as defined by the appended claims and their equivalents.

We claim:

1. A pattern forming method, comprising the steps of:
   providing a resist film, applying a light exposure to the resist film, with a material directly above the resist film and another film directly below the resist film being made insulative;
   applying a charged beam exposure to the resist film, with the film directly above the resist film or the other film directly below the resist film being made conductive; and
   subjecting the resist film to developing treatment to form a resist pattern.

2. The pattern forming method according to claim 1, wherein said resist film is formed on an underlying film formed on a work film, and further comprising the step of irradiating the underlying film with light to impart photoconductivity to the underlying film.

3. The pattern forming method according to claim 1, wherein the step of irradiating the underlying film with light to impart photoconductivity to the underlying film and the step of applying the charged beam exposure to the resist film are carried out simultaneously.

4. The pattern forming method according to claim 2, wherein the light for imparting photoconductivity to the underlying film does not contain a component having a wavelength which sensitizes the resist.

5. The pattern forming method according to claim 2, wherein the irradiation amount of the light for imparting photoconductivity to the underlying film is not larger than the amount for sensitizing the resist.

6. The pattern forming method according to claim 2, wherein the underlying film contains a crosslinking agent.

7. The pattern forming method according to claim 2, wherein the underlying film contains a compound acting as a dopant relative to the photoconductive material.

8. The pattern forming method according to claim 2, wherein the position of a latent image formed by said charged beam exposure is corrected on the basis of a position information of a latent image formed within said resist film by said light exposure.

9. The pattern forming method according to claim 8, wherein the position information of the latent image is detected by light or a charged beam.

10. The pattern forming method according to claim 1, wherein said resist film is formed on an underlying film containing an organosilicon compound having a silicon-to-silicon backbone chain, formed on a work film.

11. The pattern forming method according to claim 10, wherein said underlying film contains a crosslinking agent.

12. The pattern forming method according to claim 10, wherein the underlying film contains a compound acting as a dopant relative to the organosilicon compound.

13. The pattern forming method according to claim 10, wherein the position of the latent image formed by the charged beam exposure is corrected on the basis of the position information of the latent image formed within the resist film by the light exposure.

14. The pattern forming method according to claim 10, wherein the position information of the latent image is detected by light or a charged beam.

15. The pattern forming method according to claim 1, wherein said resist film is formed on an insulating film, and further comprising the step of forming an upper film made of a conductive material.

16. A pattern forming method, comprising the steps of:
   forming an underlying film consisting of a photoconductive material on a work film;
   forming a resist film on said underlying film;
   detecting a position information of a substrate pattern formed below the underlying film by using a charged beam;
   irradiating the underlying film with light to impart photoconductivity to the underlying film; and
   correcting the position of the latent image formed within the resist film by a charged beam exposure on the basis of said position information.

17. The pattern forming method according to claim 16, wherein the step of irradiating the underlying film with light to impart photoconductivity to the underlying film and the step of applying the charged beam exposure to the resist film are carried out simultaneously.

18. The pattern forming method according to claim 16, wherein the irradiation amount of the charged beam for detecting the position information is smaller than the irradiation amount sensitizing the resist film.

19. The pattern forming method according to claim 1, wherein said resist film is formed on an insulating film, and further comprising the step of forming an upper film made of a photoconductive material.

20. The pattern forming method according to claim 1, wherein said resist film is formed on an underlying film made of a photoconductive material, and further comprising the step of forming an upper film made of a photoconductive material.

* * * * *